US 8,487,935 B2

(12) United States Patent
Aoki

(10) Patent No.: US 8,487,935 B2
(45) Date of Patent: Jul. 16, 2013

(54) MEASURING APPARATUS AND MEASURING METHOD

(75) Inventor: Kazunori Aoki, Atusgi (JP)

(73) Assignee: Anritsu Corporation, Atsugi-shi (JP)

( * ) Notice: Subject to any disclaimer, the term of this patent is extended or adjusted under 35 U.S.C. 154(b) by 635 days.

(21) Appl. No.: 12/751,453

(22) Filed: Mar. 31, 2010

(65) Prior Publication Data

US 2010/0245389 A1 Sep. 30, 2010

(30) Foreign Application Priority Data

Mar. 31, 2009 (JP) ................................ 2009-085235
Jul. 28, 2009 (JP) ................................ 2009-175874

(51) Int. Cl.
*G06T 11/20* (2006.01)
*G06T 15/10* (2011.01)
*G06T 11/60* (2006.01)
*G01R 1/02* (2006.01)

(52) U.S. Cl.
CPC ............... *G06T 11/206* (2013.01); *G06T 11/20* (2013.01); *G06T 11/203* (2013.01); *G06T 11/60* (2013.01); *G01R 1/025* (2013.01)
USPC ........ 345/440.1; 345/440; 345/441; 345/442; 345/619; 345/660; 345/661; 345/208; 345/428; 345/629

(58) Field of Classification Search
CPC ....... G06T 11/206; G06T 11/20; G06T 11/203; G06T 11/60; G01R 1/025
USPC .............. 345/440.1, 440, 441, 442, 619, 660, 345/661
See application file for complete search history.

(56) References Cited

U.S. PATENT DOCUMENTS

| | | | | |
|---|---|---|---|---|
| 5,579,463 | A * | 11/1996 | Takano et al. ................. | 345/440 |
| 6,687,628 | B2 * | 2/2004 | Jaffe ............................... | 702/67 |
| 7,123,953 | B2 * | 10/2006 | Starobin et al. ............... | 600/516 |
| 8,223,151 | B2 * | 7/2012 | Rule et al. ..................... | 345/440 |
| 2003/0130586 | A1 * | 7/2003 | Starobin et al. ............... | 600/515 |
| 2004/0051721 | A1 * | 3/2004 | Ramseth ........................ | 345/689 |
| 2005/0187851 | A1 * | 8/2005 | Sant ............................... | 705/36 |
| 2007/0247998 | A1 * | 10/2007 | Maruyama et al. ...... | 369/124.07 |

FOREIGN PATENT DOCUMENTS

| | | | |
|---|---|---|---|
| JP | 05-142262 | | 6/1993 |
| JP | 1993-142262 | * | 6/1993 |
| JP | 2880711 | | 4/1999 |
| JP | 2002-014128 | * | 1/2002 |
| JP | 2002-296310 | | 10/2002 |
| JP | 2008-191928 | * | 8/2008 |
| JP | 2009-043191 | | 2/2009 |

* cited by examiner

*Primary Examiner* — Javid A Amini
(74) *Attorney, Agent, or Firm* — Greer, Burns & Crain, Ltd.

(57) ABSTRACT

There is provided a technique for smoothly performing position (movement) adjustment of a waveform marker by making switching between rough adjustment and fine adjustment in a series of marker operations possible with a single means and continuously. A display control section displays a measured waveform on the two-dimensional coordinates, which have a first axis and a second axis perpendicular to the first axis, on the display section. A waveform marker is movable by a marker operation corresponding to a direction parallel to the first axis. The display control section has a detecting section, which detects the marker operation corresponding to a direction parallel to the second axis, and changes either setting of the waveform marker or the display range of the measured waveform according to the detection result of the detecting section.

22 Claims, 35 Drawing Sheets

(A)

(B)

(A)

(B)

(A)

(B)

(A)

(B)

MEASURING APPARATUS AND MEASURING METHOD

BACKGROUND OF THE INVENTION

1. Field of the Invention

The present invention relates to a measuring apparatus which measures, for example, an object to be measured or a signal to be measured and displays the measured data. In particular, the invention relates to a measuring apparatus capable of easily setting a waveform marker at a target point by displaying a measured waveform on the basis of measured data and designating the target point on the measured waveform with the waveform marker when calculating the characteristic value of the measured waveform of the specific point, for example.

2. Description of the Related Art

When an operator moves a waveform marker (which is also called a marker, a cursor, and the like) to match the position of a target point on a display screen by manually operating an operating section, for example, a mouse or the like while observing the display screen, there are some difficulties, such as passing the target point, in performing fine adjustment. As a technique for solving such a problem, there is a technique disclosed in JP-A-5-142262.

In the technique disclosed in JP-A-5-142262, the moving speed of a waveform marker can be set by a key input section. The movement amount of the waveform marker is calculated from the set moving speed and the number of display data on the display screen and the position of the waveform marker on the display screen is moved by the calculated movement amount, thereby performing adjustment.

According to the technique disclosed in JP-A-5-142262, it is possible to easily set a cursor at the target point since the moving speed of the waveform marker can be arbitrarily set.

In addition, in a technique disclosed in Japanese Patent Publication No. 2880711, a zone marker having a predetermined width is generated, a peak position of a waveform within a zone of the predetermined width is searched, and a peak marker is automatically attached and displayed at the peak position of the waveform. This was convenient in searching a characteristic portion, such as the peak position.

In the technique disclosed in JP-A-5-142262, however, the moving speed of the waveform marker should be changed and set by the key input section. Generally, when moving a waveform marker to a target point on a screen, an operator moves the waveform marker by operating a mouse or the like by hand while observing the screen with his or her eyes. If the operator desires fine adjustment while moving the waveform marker, the operator should change the moving speed by a key operation, which is different from an operation of moving a waveform marker using a mouse or the like, in the technique disclosed in JP-A-5-142262. For this reason, there was a possibility that positioning of the waveform marker could not be performed smoothly. Especially when the moving speed was changed to a plurality of steps, there was a disadvantage in that smooth adjustment became further difficult.

In the technique disclosed in Japanese Patent Publication No. 2880711, when a plurality of peak points was present in a zone, there was a possibility that the marker would be displayed at another peak point instead of a desired peak point.

SUMMARY OF THE INVENTION

It is an object of the invention to provide a technique for smoothly performing position (movement) adjustment of a waveform marker by making switching between rough adjustment and fine adjustment in a series of marker operations possible with a single means and continuously.

In addition, it is another object of the invention to provide a technique for separating a plurality of peak points from each other, for easy measurement, by making it possible to easily change the relative size of a display range where the measured data is displayed and a predetermined width of a zone marker, which is a range to be searched, when searching a peak point.

In order to achieve the above-described objects, the invention adopts a configuration in which a marker position in the marker operation direction for moving a waveform marker is matched to the size of marker movement variation. As an example of the configuration, when a marker operation is performed in an upper part of a display screen on which a measured waveform is displayed, it is possible to perform rough adjustment by moving the waveform marker at approximately the same speed (same distance) as the operation amount of the marker operation so as to follow the operation amount. When a marker operation is performed in a lower part of the display screen, it is possible to perform fine adjustment by moving the waveform marker at the low speed (small distance) compared with the operation amount of the marker operation so as to follow the operation amount. That is, the movement variation of the waveform marker to the marker operation can be changed, for example, by changing the position of the marker operation up and down along the index displayed within the display screen. Accordingly, the waveform marker can be moved by performing a marker operation in a direction (in this case, horizontal direction) in which the operator wants to move the waveform marker within the display screen. As a result, it is possible to perform rough adjustment and fine adjustment continuously only with a marker operation within the display screen on which a measured waveform is displayed, that is, with a single operation.

Moreover, in order to achieve the above-described objects, the invention adopts a configuration in which a marker position in the marker operation direction for moving a waveform marker is matched to the size of marker movement variation. As an example of the configuration, when a marker operation is performed in a horizontal direction from the initial position (reference position), it is possible to perform rough adjustment by moving a waveform marker at approximately the same speed (same distance) as the operation amount of the marker operation so as to follow the operation amount (for example, in the rate of 1:1). When a marker operation of lowering a waveform marker downward from the initial position by a certain relative distance is performed and then a marker operation is performed in the horizontal direction from the lowered position, it is possible to perform fine adjustment by moving the waveform marker at the low speed (small distance) corresponding to the relative distance, compared with the operation amount of the marker operation in the horizontal direction, so as to follow the operation amount (example: in the ratio of 1:0.5).

Here, the "marker operation" in the invention is an operation for moving the waveform marker by an operator and includes a direct operation (for example, an operation using a finger (indicator) on a touch panel) or an indirect operation (for example, an operation using a pen (indicator) on a touch panel or an operation using a mouse or the like on a display screen when an indicator marker (indicator) is displayed on the display screen instead of a finger). In the invention, an "index which specifies the movement variation of the waveform marker corresponding to the operation amount by using a plurality of steps" is set. In this case, the index may be displayed so that an operator can visually recognize it on a display screen of a display section and can indicate a specific step. Alternatively, although the index itself is not displayed directly, a plurality of divided steps which forms the index may be displayed on the display screen so that when a specific one of the regions is indicated, the waveform marker can be visually recognized as a movement variation corresponding to the specific region (step).

In order to achieve the above object, according to a first aspect of the invention, a measuring apparatus includes: a user I/F section having an operating section and a display section; a measuring section that measures an object to be measured or a signal to be measured; and a display control section that displays a measured waveform, which is based on measured data acquired by the measuring section, on the display section and also displays a waveform marker, which is movable by a marker operation from the user I/F section, so as to overlap the measured waveform. The display control section displays the measured waveform on two-dimensional coordinates, which have a first axis and a second axis perpendicular to the first axis, on the display section. The waveform marker is movable by the marker operation corresponding to a direction parallel to the first axis. The display control section has a detecting section, which detects the marker operation corresponding to a direction parallel to the second axis, and changes either setting of the waveform marker or a display range of the measured waveform according to the detection result of the detecting section.

According to a second aspect of the invention, in the measuring apparatus according to the first aspect of the invention, the display control section sets, in a waveform display region where the measured waveform of the display section is displayed, an index which specifies a movement variation in a distance or a speed of the waveform marker corresponding to an operation amount in the marker operation as a plurality of steps in order of size, detects that a certain specific step of the index has been designated by a marker operation of the user I/F section, detects the operation amount when the marker operation for moving the displayed waveform marker has been performed after the designation, and moves the waveform marker by the movement variation specified by the index of the specific step.

According to a third aspect of the invention, in the measuring apparatus according to the second aspect of the invention, the marker operation is performed by moving an indicator on a screen of the display section. The display control section includes: an index storage section that stores specified information which specifies the movement variation in the distance or the speed of the waveform marker by dividing the movement variation into the plurality of steps in order of size; an index display control section that sets the index on the display section so that each of the plurality of steps can be designated and detects that the certain specific step of the index has been designated by the indicator in the marker operation; an instructed amount detecting section that detects, as the operation amount, a movement amount of the indicator in the marker operation after detection of the specific step; and a marker generating section that generates the waveform marker, receives the operation amount output from the instructed amount detecting section, and moves the waveform marker by the movement variation based on the specified information, which corresponds to the specific step detected by the index display control section, by referring to the specified information of the index storage section.

According to a fourth aspect of the invention, in the measuring apparatus according to the third aspect of the invention, the index display control section sets an index, which is a bar-shaped index parallel to the second axis and which is divided in the longitudinal direction such that the movement variation is divided into a plurality of regions corresponding to the plurality of steps, and detects the specific step by determining in which region of the plurality of regions the indicator in the marker operation exists.

According to a fifth aspect of the invention, in the measuring apparatus according to the fourth aspect of the invention, the index display control section moves the index together on the display section by moving the indicator in the direction parallel to the first axis in a state where the indicator is placed in a specific region of the index and moves the indicator to the other specific region along the direction parallel to the second axis. The instructed amount detecting section detects that change to the other specific region has been performed in response to movement of the indicator to the other region.

According to a sixth aspect of the invention, in the measuring apparatus according to the third aspect of the invention, the index display control section sets the index over approximately the entire range, in which the measured waveform on the screen of the display section is displayed, and sets the index such that the range is divided into the plurality of steps in the direction parallel to the second axis, and detects that the specific step has been selected when the specific step is designated by moving the indicator in the direction parallel to the second axis by the marker operation. After the specific step is detected, the instructed amount detecting section detects the instructed movement amount from movement of the indicator when the indicator has moved to the specific region.

According to a seventh aspect of the invention, in the measuring apparatus according to the first aspect of the invention, the waveform marker is a zone marker having a predetermined width in the direction parallel to the first axis. The marker operation is performed by placing an indicator in a waveform display region, in which the measured waveform of the display section is displayed, and moving the indicator. The display control section includes: a zone marker generating section that moves and displays the position of the zone marker; a peak marker generating section that displays a peak marker at the maximum position of a waveform within a zone of a predetermined width of the zone marker; an instructed position detecting section that detects the position of the indicator, which is located on the zone marker, in the direction parallel to the second axis; and a width determining section that makes the zone marker generating section change the predetermined width of the zone marker according to the detected position of the indicator in the direction parallel to the second axis. The peak marker generating section displays the peak marker at the maximum position of a waveform within a zone of a changed predetermined width of the zone marker.

According to an eighth aspect of the invention, in the measuring apparatus according to the first aspect of the invention, the waveform marker is a zone marker having a predetermined width in the direction parallel to the first axis. The marker operation is performed by placing an indicator in a waveform display region, in which the measured waveform of the display section is displayed, and moving the indicator. The display control section includes: a zone marker generating section that moves and displays the position of the zone marker; a peak marker generating section that displays a peak marker at the maximum position of a waveform within a zone of a predetermined width of the zone marker; an instructed position detecting section that detects the position of the indicator, which is located on the zone marker, in the direction parallel to the second axis; and a width determining section that changes the predetermined display range according to the detected position of the indicator in the direction parallel to the second axis. The peak marker generating section displays the peak marker at the maximum position of a waveform within a zone of a predetermined width of the zone marker displayed in the changed predetermined display range.

According to a ninth aspect of the invention, in the measuring apparatus according to the eighth aspect of the invention, the instructed position detecting section further detects a center position of the predetermined width of the zone marker. The display control section changes the predetermined display range to the changed display range instructed by the width determining section with the center position of the zone marker, which has been detected by the instructed position detecting section, as a center and displays the changed display range.

According to a tenth aspect of the invention, in the measuring apparatus according to the first aspect of the invention, the display control section detects a relative distance from an initial position when the marker operation in the direction parallel to the second axis has started in a waveform display region, in which the measured waveform of the display section is displayed, to an operation position when the marker operation has been actually performed in the direction parallel to the second axis and then detects an operation amount in the direction parallel to the first axis when the marker operation of moving the displayed waveform marker in the direction parallel to the first axis has been performed, and moves the waveform marker on the basis of a movement variation corresponding to the relative distance and the operation amount.

According to an eleventh aspect of the invention, in the measuring apparatus according to the tenth aspect of the invention, the marker operation is performed by moving an indicator on a screen of the display section. The display control section includes: a specified information storage section that stores specified information, which specifies the movement variation in a distance or a speed of the waveform marker in the predetermined direction corresponding to the relative distance, beforehand; a relative distance detecting section that detects a relative distance when the indicator has moved in the direction parallel to the second axis by the marker operation and that acquires specified information corresponding to the relative distance by referring to the specified information stored in the specified information storage section; an instructed amount detecting section that detects, as the operation amount, a movement amount of the indicator in the direction parallel to the first axis by the marker operation after the relative distance is detected; and a marker generating section that generates the waveform marker and that moves the waveform marker by a movement amount obtained by specifying the operation amount in the direction parallel to the first axis, which has been detected by the instructed amount detecting section, with the specified information corresponding to the relative distance acquired by the relative distance detecting section.

According to a twelfth aspect of the invention, in the measuring apparatus according to the first aspect of the invention, the waveform marker is a zone marker having a predetermined width in the direction parallel to the first axis. The marker operation is performed by placing an indicator in a waveform display region, in which the measured waveform of the display section is displayed, and moving the indicator. The display control section includes: a zone marker generating section that moves and displays the position of the zone marker; a peak marker generating section that displays a peak marker at the maximum position of a waveform within a zone of a predetermined width of the zone marker; and a zone control section that detects a relative distance from the position of the indicator in the direction parallel to the second axis at the start of the marker operation to the position of the indicator which has moved in the direction parallel to the second axis by the marker operation and that changes a predetermined width of the zone marker according to the detected relative distance and detects a width direction movement amount when the indicator has moved in the direction parallel to the first axis. The zone marker generating section moves and displays the zone marker with the predetermined width, which has been changed by the zone control section, at a position corresponding to the detected width direction movement amount of the indicator. The peak marker generating section displays the peak marker at the maximum position of a waveform within a zone of the predetermined changed width at the position to which the zone marker has moved.

According to a thirteenth aspect of the invention, in the measuring apparatus according to the first aspect of the invention, the waveform marker is a zone marker having a predetermined width in the direction parallel to the first axis. The marker operation is performed by placing an indicator in a waveform display region, in which the measured waveform of the display section is displayed, and moving the indicator. The display control section includes: a zone marker generating section that moves and displays the position of the zone marker; a peak marker generating section that displays a peak marker at the maximum position of a waveform within a zone of a predetermined width of the zone marker; and a span control section that detects a relative distance from the position of the indicator in the direction parallel to the second axis at the start of the marker operation to the position of the indicator which has moved in the direction parallel to the second axis by the marker operation and that makes the display control section change and display the predetermined display range according to the detected relative distance and detects a width direction movement amount when the indicator has moved in the width direction. The zone marker generating section moves and displays the zone marker at a position, which corresponds to the detected width direction movement amount of the indicator, on a measured waveform in the predetermined display range changed by the span control section. The peak marker generating section displays the peak marker in the changed predetermined display range and at the maximum position of a waveform within a zone of the predetermined width of the zone marker which has been moved and displayed.

According to a fourteenth aspect of the invention, in the measuring apparatus according to the thirteenth aspect of the invention, the span control section further detects a center position of the predetermined width of the zone marker. The display control section changes the predetermined display range to a display range, which corresponds to the detected relative distance, with the center position of the zone marker detected by the span control section as a center and displays the changed display range.

According to a fifteenth aspect of the invention, in the measuring apparatus according to the first aspect of the invention, the display section has a screen formed by a touch panel, and the marker operation in the user I/F section is a moving operation in which an operator moves a direct or indirect indicator on the touch panel.

According to a sixteenth aspect of the invention, in the measuring apparatus according to the first aspect of the invention, the display control section generates an indicator marker, which is movable by an operation in the operating section, and displays the indicator marker on the display section. The marker operation in the user I/F section is the operation in the operating section, and the indicator is the indicator marker.

According to a seventeenth aspect of the invention, a measuring method includes: measuring an object to be measured or a signal to be measured; displaying a measured waveform, which is based on measured data acquired in the measuring, on two-dimensional coordinates which have a first axis and a second axis perpendicular to the first axis; displaying a waveform marker, which is movable by a marker operation corresponding to a direction parallel to the first axis, so as to overlap the measured waveform; detecting the marker operation corresponding to a direction parallel to the second axis; and changing either setting of the waveform marker or a display range of the measured waveform according to the detection result.

According to an eighteenth aspect of the invention, the measuring method according to the seventeenth aspect of the invention further includes setting, in a waveform display region where the measured waveform is displayed, an index which specifies a movement variation in a distance or a speed of the waveform marker, which corresponds to an operation amount in the marker operation in the direction parallel to the first axis, as a plurality of steps in order of the size of the movement variation in the direction parallel to the second axis. In the detecting, it is detected that a certain specific step of the index has been designated by the marker operation. In the changing, the set movement variation of the waveform marker is changed to a movement variation specified by the index of the designated specific step.

According to a nineteenth aspect of the invention, in the measuring method according to the seventeenth aspect of the invention, the waveform marker is a zone marker having a predetermined width in the direction parallel to the first axis. Displaying a peak marker at the maximum position of a waveform within a zone of the predetermined width of the zone marker and setting, in a waveform display region where the measured waveform is displayed, an index which specifies the predetermined width of the zone marker, which corresponds to an operation amount in the marker operation in the direction parallel to the first axis, as a plurality of steps in order of the size of the predetermined width in the direction parallel to the second axis are further included. In the detecting, it is detected that a certain specific step of the index has been designated by the marker operation. In the changing, the set predetermined width of the zone marker is changed to a predetermined width specified by the index of the designated specific step. In the displaying of the peak marker, the peak marker is displayed at the maximum position of a waveform within the zone of the changed predetermined width.

According to a twentieth aspect of the invention, in the measuring method according to the seventeenth aspect of the invention, the waveform marker is a zone marker having a predetermined width in the direction parallel to the first axis. Displaying a peak marker at the maximum position of a waveform within a zone of the predetermined width of the zone marker and setting, in a waveform display region where the measured waveform is displayed, an index which specifies a display range of the measured waveform, which corresponds to an operation amount in the marker operation in the direction parallel to the first axis, as a plurality of steps in order of the size of the predetermined width in the direction parallel to the second axis are further included. In the detecting, it is detected that a certain specific step of the index has been designated by the marker operation. In the changing, the display range of the measured waveform is changed to a display range specified by the index of the designated specific step. In the displaying of the peak marker, the peak marker is displayed at the maximum position of a waveform within the zone of the predetermined width of the zone marker on a measured waveform displayed in the changed display range.

According to a twenty-first aspect of the invention, in the measuring method according to the twentieth aspect of the invention, in the changing, the display range of the measured waveform is changed to the specified display range with the center position of the predetermined width of the zone marker as a center.

According to a twenty-second aspect of the invention, the measuring method according to the seventeenth aspect of the invention further includes determining the movement variation on the basis of a relative distance from an initial position when the marker operation has started in a waveform display region, in which the measured waveform is displayed, to an operation position when the marker operation has been actually performed in the direction parallel to the second axis and specified information which specifies the movement variation in a distance or a speed of the waveform marker, which corresponds to an operation amount in the marker operation in the direction parallel to the first axis, beforehand so as to match the relative distance. In the detecting, the relative distance is detected. In the determining, the movement variation is determined on the basis of the detected relative distance. In the changing, the set movement variation of the waveform marker is changed to the determined movement variation.

According to a twenty-third aspect of the invention, in the measuring method according to the seventeenth aspect of the invention, the waveform marker is a zone marker having a predetermined width in the direction parallel to the first axis. Displaying a peak marker at the maximum position of a waveform within a zone of the predetermined width of the zone marker and determining a predetermined width of the zone marker on the basis of a relative distance from an initial position when the marker operation has started in a waveform display region, in which the measured waveform is displayed, to an operation position when the marker operation has been actually performed in the direction parallel to the second axis and specified information which specifies the predetermined width of the zone marker, which corresponds to an operation amount in the marker operation in the direction parallel to the first axis, beforehand so as to match the relative distance are further included. In the detecting, the relative distance is detected. In the determining, the predetermined width of the zone marker is determined on the basis of the detected relative distance. In the changing, the set predetermined width of the zone marker is changed to the determined predetermined width. In the displaying of the peak marker, the peak marker is displayed at the maximum position of a waveform within the zone of the changed predetermined width.

According to a twenty-fourth aspect of the invention, in the measuring method according to the seventeenth aspect of the invention, the waveform marker is a zone marker having a predetermined width in the direction parallel to the first axis. Displaying a peak marker at the maximum position of a waveform within a zone of the predetermined width of the zone marker and determining a predetermined width of the zone marker on the basis of a relative distance from an initial position when the marker operation has started in a waveform display region, in which the measured waveform is displayed, to an operation position when the marker operation has been actually performed in the direction parallel to the second axis and specified information which specifies a display range of the measured waveform, which corresponds to an operation amount in the marker operation in the direction parallel to the first axis, beforehand so as to match the relative distance are further included. In the detecting, the relative distance is detected. In the determining, the display range of the measured waveform is determined on the basis of the detected relative distance. In the changing, the display range of the measured waveform is changed to the determined display range. In the displaying of the peak marker, the peak marker is displayed at the maximum position of a waveform within the zone of the predetermined width of the zone marker on a measured waveform displayed in the changed display range.

According to a twenty-fifth aspect of the invention, in the measuring method according to the twenty-fourth aspect of the invention, in the changing, the display range of the measured waveform is changed to the determined display range with the center position of the predetermined width of the zone marker as a center.

By the configurations according to the first to seventh, tenth and eleventh, fifteenth to eighteenth, and twenty-second aspects of the invention, an operator can perform switching between rough adjustment and fine adjustment while continuously operating an indicator on a display screen of the display section. As a result, it is possible to smoothly adjust the position of a waveform marker.

By the configurations according to the eighth and ninth, twelfth to fourteenth, nineteenth to twenty-first, and twenty-third to twenty-fifth aspects of the invention, an operator can adjust the relative and effective resolution of a zone marker by changing the relative size of the predetermined width of the zone marker and the display range of measured data during an operation of moving the indicator continuously. As a result, a plurality of peak points can be easily recognized by the zone marker by separating them from each other. Moreover, since the relative and effective resolution of the zone marker can be smoothly adjusted while performing an operation of moving the indicator continuously, the operation becomes easy.

DESCRIPTION OF THE PREFERRED EMBODIMENTS

Figure 1:
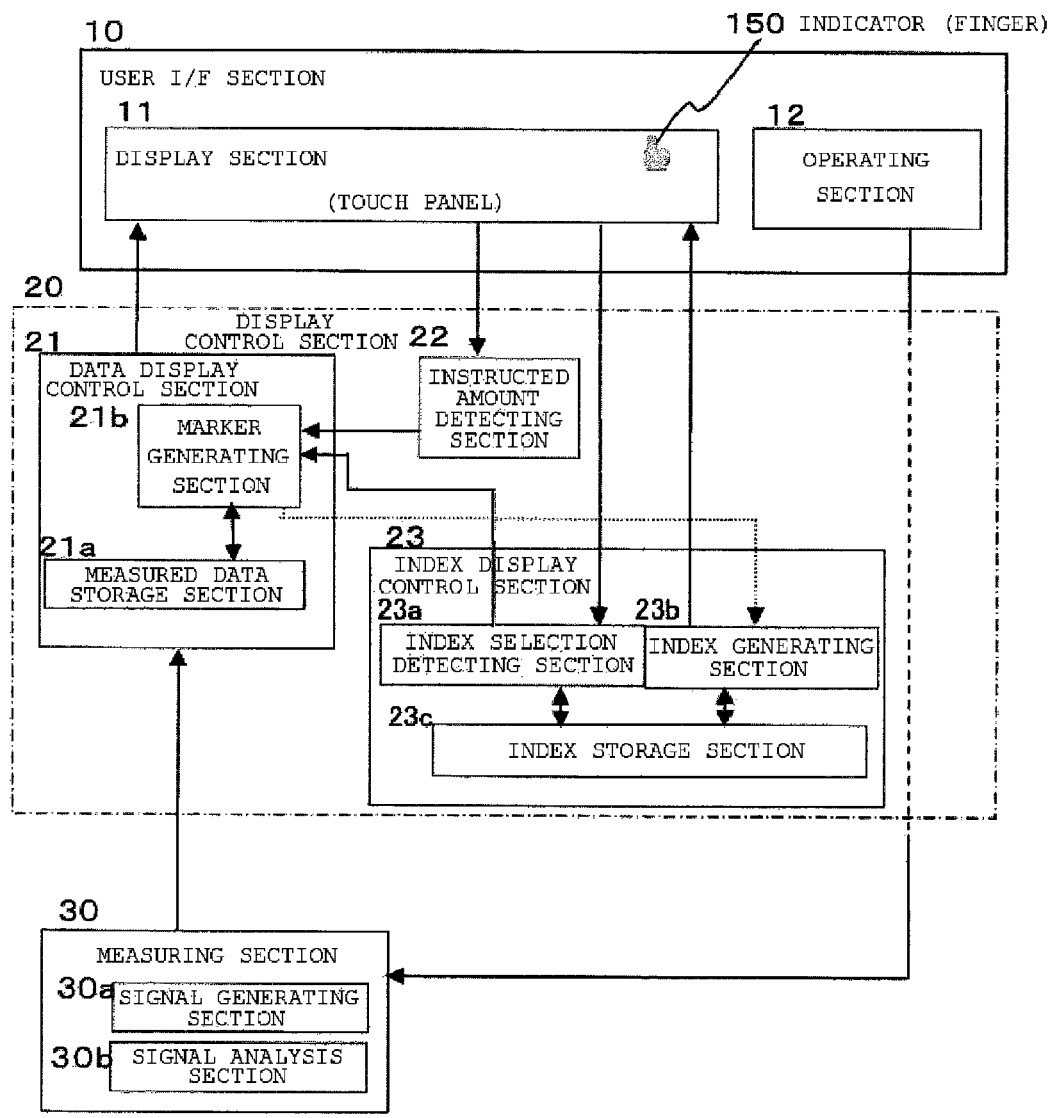
FIG. 1 is a view showing the function and configuration of a first embodiment.

Embodiments of the invention related to the configuration where the marker position and the size of marker movement variation are matched to each other will be described as follows. The explanation will be divided into a first embodiment in which a touch panel having a sensor function on a screen of a display section of a measuring apparatus is used and a second embodiment in which a display device with no sensor function on a screen is used. Moreover, regarding the invention for easily setting a peak marker by separating a plurality of peaks from each other, examples where the zone width is changed will be described in third and fourth embodiments, and examples where a display range, which is a range where the measured data (measured waveform measured by a measuring section 30) is displayed, is changed will be described in fifth and sixth embodiments.

In addition, embodiments of the invention related to the configuration where the relative distance of a marker operation and the size of marker movement variation are matched to each other will be described as follows. The explanation will be divided into a seventh embodiment in which a touch panel having a sensor function on a screen of a display section of a measuring apparatus is used and an eighth embodiment in which a display device with no sensor function on a screen is used. Moreover, regarding the invention for easily setting a peak marker in a zone by separating the peak marker from a plurality of peaks, examples where the zone width is changed will be described in ninth and tenth embodiments, and examples where a display range, which is a range where the measured data (measured waveform measured by the measuring section 230) is displayed, is changed will be described in eleventh and twelfth embodiments.

First Embodiment

The first embodiment will be described with reference to FIG. 1. Here, the measuring section 30 checks a tested apparatus, such as a mobile communication apparatus, by transmitting a signal from a signal generating section 30*a*, which is specified in an actual wireless system, to the tested apparatus and receiving and analyzing the signal from the tested apparatus by a signal analysis section 30*b*. In this case, the received signal may be analyzed in a time domain or the frequency spectrum of the signal may be analyzed in a frequency domain. When performing such analyses, the received signal or a signal obtained by converting the received signal is transmitted to a display control section 20 as a measured waveform 100 in a time domain, which is displayed in a display section 11 as time domain coordinates having the horizontal axis as a time and the vertical axis as a level (that is, the amplitude of a measured waveform) at the time, or as a measured waveform 100 of the spectrum, which is displayed in the display section 11 as frequency domain coordinates having the horizontal axis as a frequency and the vertical axis as a level (that is, the amplitude of a measured waveform) at the frequency, and the display control section 20 displays the measured waveform 100 on the display section 11. Moreover, the measuring apparatus to which the invention can be applied is not limited to an apparatus having the measuring section 30 which checks the mobile communication apparatus, but applications to apparatuses which display the data obtained by measurement (including photographing and the like) as an image, insert a waveform marker in the image, and acquire the image characteristic at the position of the waveform marker may also be made. For example, the invention may also be applied to measurement fields, such as shape measurement, flow rate measurement, and medical measurement (the same for the first to sixth embodiments). In the following explanation, the measured waveform will be described as data expanded at the coordinates in which the horizontal axis is expressed as a time, a frequency, or the like serving as a reference of analysis and the vertical axis is expressed as the amplitude of a measured waveform at the time or the frequency.

A data display control section 21 in the display control section 20 stores the amplitude (equivalent to the position on the vertical axis) of the measured waveform 100 from the measuring section 30 in a measured data storage section 21*a* using as an address the horizontal axis information (for example, time or frequency in the horizontal axis) when measured. In addition, the measured waveform 100 stored in the measured data storage section 21*a* is displayed on a screen on the display section 11 together with the coordinates of horizontal axis-vertical axis.

Figure 2:
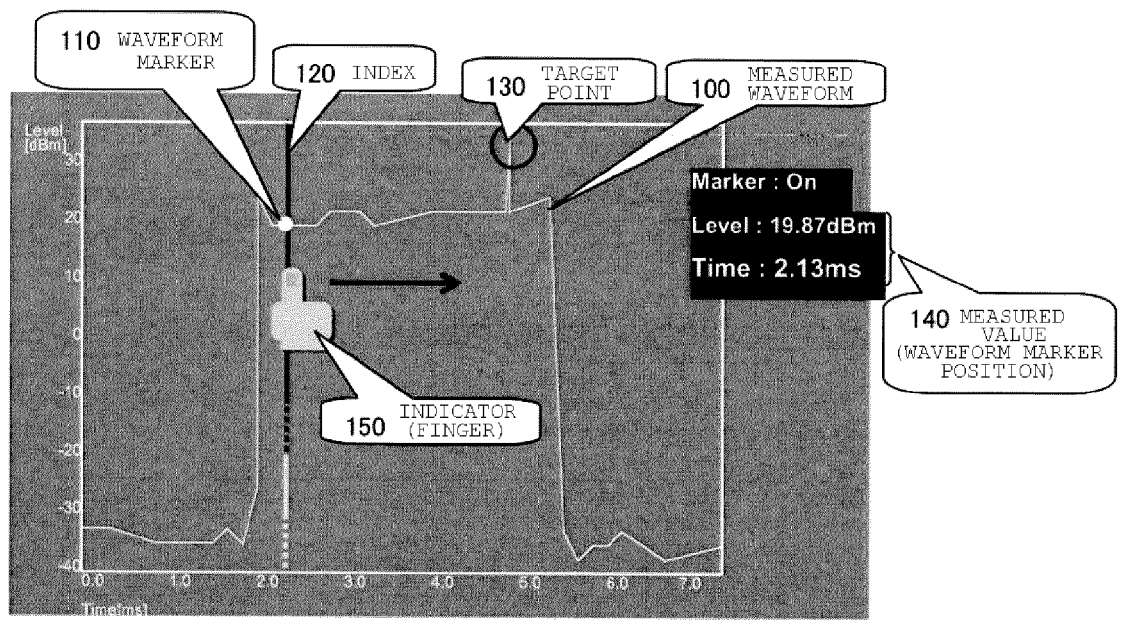
FIGS. 2A and 2B are views for explaining the movement and operation of a waveform marker in the first embodiment, which are one display example.
Figure 2:
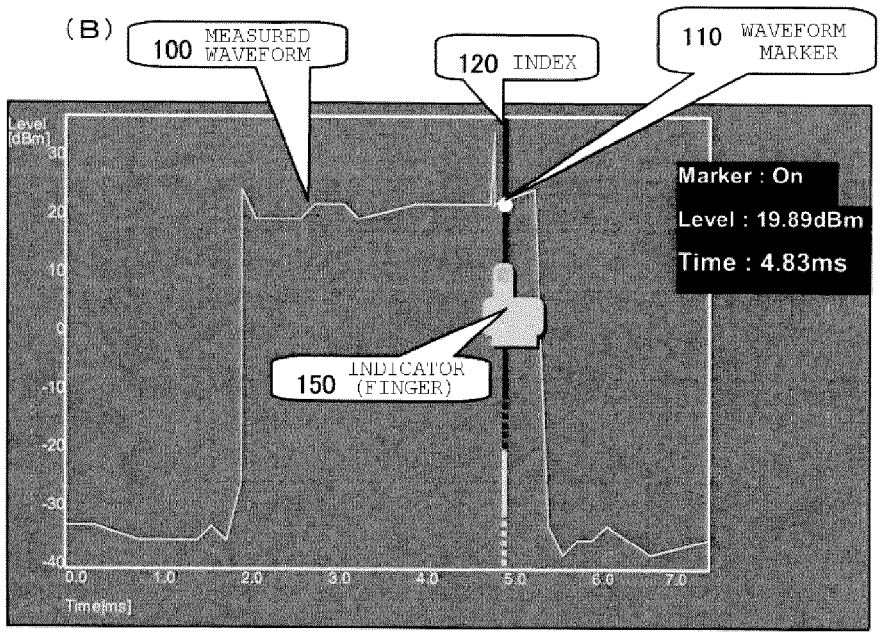
Figure 3:
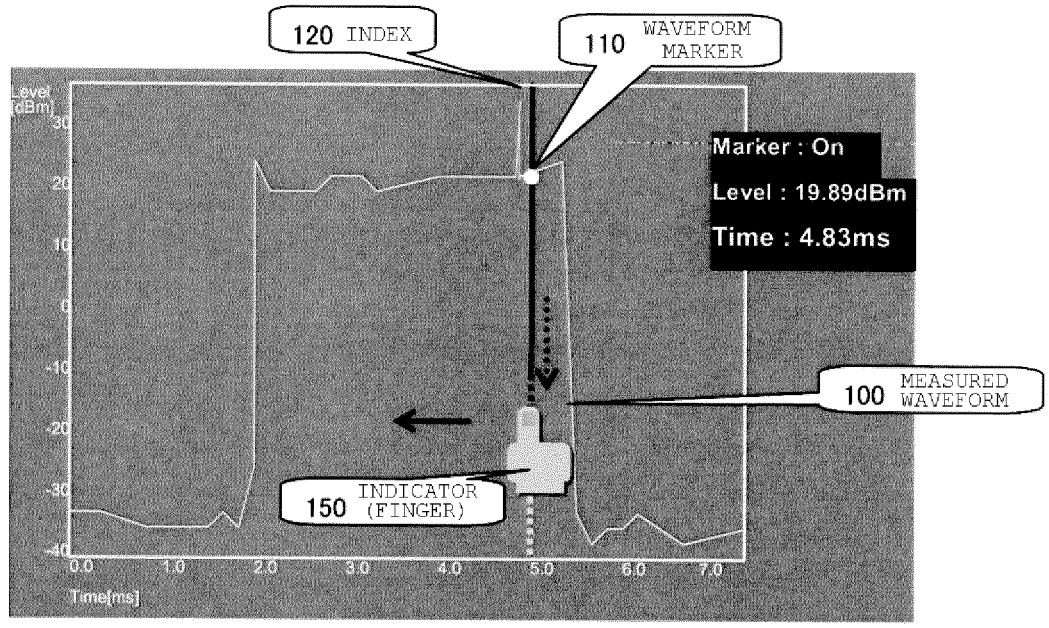
FIGS. 3A and 3B show the same display example as in FIGS. 2A and 2B, and are views for explaining the movement and operation of a waveform marker in the first embodiment.
Figure 3:
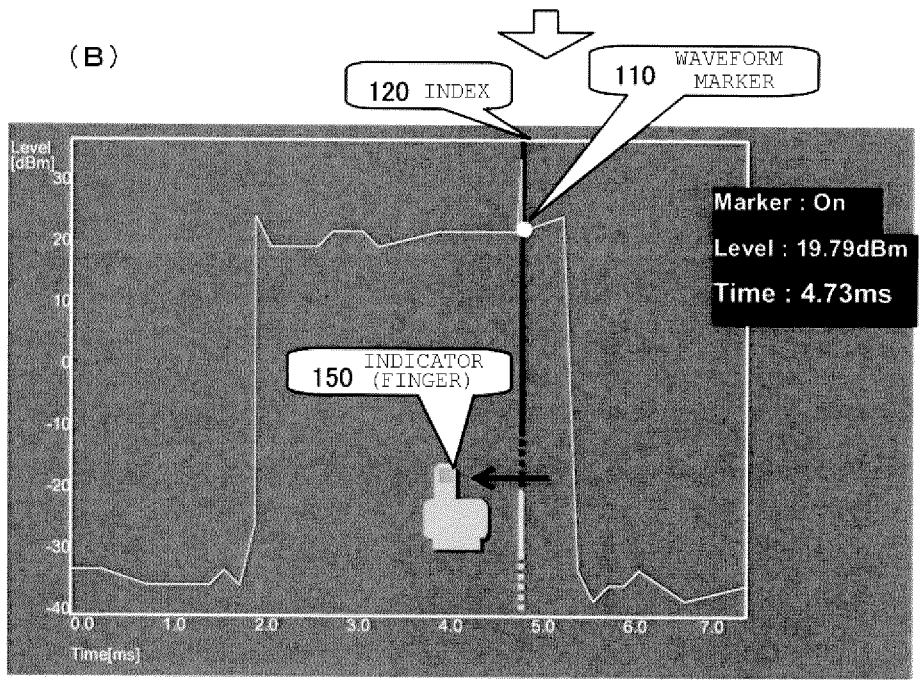
Figure 4:
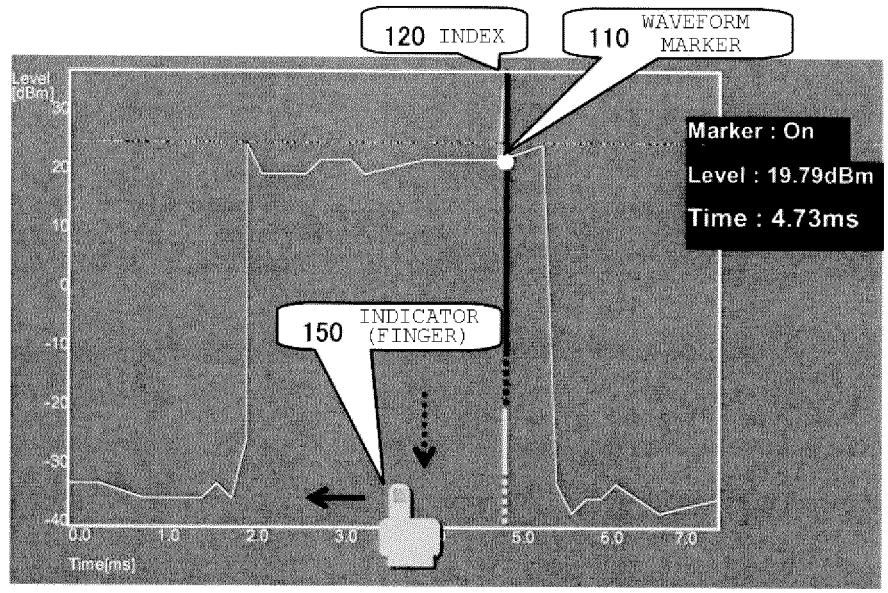
FIGS. 4A and 4B show the same display example as in FIGS. 2A and 2B, and are views for explaining the movement and operation of a waveform marker in the first embodiment.
Figure 4:
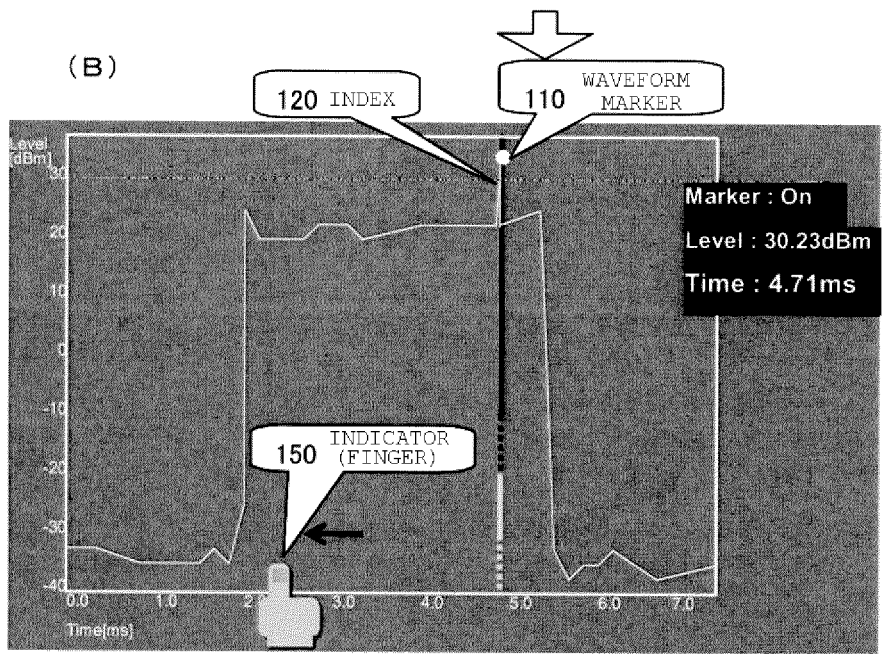

A marker generating section 21*b* generates a waveform marker 110 in a form shown in FIG. 2A, and determines the horizontal axis position X1 on the basis of the information acquired from an instructed amount detecting section 22 and an index display control section 23 which will be described later. In addition, the marker generating section 21*b* reads the amplitude Y1 of a waveform, which is located in the address corresponding to the determined horizontal axis position, from the measured data storage section 21*a*, and displays the waveform marker 110 on a measured waveform at the coordinates of horizontal axis-vertical axis displayed on the display section 11. FIG. 2A shows the display example. In addition, in the initial state where there is no information from the instructed amount detecting section 22, the marker generating section 21*b* gives a specific initial position on the horizontal axis.

The instructed amount detecting section 22 detects the operation amount when an indicator 150 is operated on the screen (display region where the waveform data is displayed, that is, a region where the coordinates expressed by horizontal axis-vertical axis are displayed; the same meaning hereinbelow) of the display section 11, as shown in FIG. 2A. For example, when an operator touches a touch panel of the screen with a finger and moves the touch position, the instructed amount detecting section 22 detects the movement amount (operation amount; hereinafter, when simply called a "movement amount", it means a movement distance) of the finger (indicator) and the movement direction. Or when the operator touches the touch panel with a pen or the like and moves the touch position, the instructed amount detecting section 22 detects the movement distance and the movement direction of the pen or the like. This detection is performed in a fast processing cycle compared with the movement time of the indicator 150. In addition, in the first embodiment, a finger, a pen, and the like will be described as the indicator 150.

An index storage section 23c of the index display control section 23 specifies the size of the movement variation of a waveform marker (hereinafter, referred to as a "waveform marker movement amount"), which actually moves the waveform marker 110, with respect to the size of the movement amount of the indicator 150 by dividing the size of the waveform marker movement amount into a plurality of steps and stores the specified information. For example, waveform marker movement amount=k×(indicator movement amount)/N (where k is a proportionality constant and N is a natural number), and the natural number N is divided into a plurality of steps. The index storage section 23c stores the value of N in the "movement amount ratio H(N)=(waveform marker movement amount)/(indicator movement amount)=k/N" as the specified information.

An index generating section 23b performs management so that one of the plurality of steps can be specified on the screen of the display section 11. As an example, the index generating section 23b generates an index 120, which divides a region in the longitudinal direction with colors (or patterns) corresponding to the plurality of steps, at a bar-shaped marker having a length in the vertical direction as shown in FIG. 2A and displays the index 120 on the display section 11. In the case shown in FIG. 2A, the position of the index 120 in the horizontal axis is the horizontal axis position determined by the marker generating section 21b, that is, the same position as the waveform marker 110. In FIG. 2A, the index 120 is divided into four regions (N=N1, N2, N3, and N4). A region located at the highest step of the index is a region where the movement amount ratio H(N)=(waveform marker movement amount)/(indicator movement amount) is close to 1. The movement amount ratio H(N) decreases as the region of the index lowers and becomes the minimum in a region of the lowest step.

An index selection detecting section 23a detects which region of the index 120, that is, which step of the index 120 has been designated by the indicator 150 when the measured waveform 100, the waveform marker 110, and the index 120 are displayed on the screen of the display section 11. Since the index selection detecting section 23a has information regarding at which position and how the index is divided into regions (steps) and displayed by the index generating section 23b, the index selection detecting section 23a can determine a specific step Ng selected by the indicator 150 from the position of the indicator 150 on the touch panel of the screen. Then, the index selection detecting section 23a reads the movement amount ratio H(Ng) corresponding to the selected specific step Ng referring to the index storage section 23c and transmits it to the marker generating section 21b.

The marker generating section 21b will be described again. The marker generating section 21b stores the current horizontal axis position of the waveform marker 110. In addition, the marker generating section 21b receives the movement amount and the movement direction of the indicator 150 from the instructed amount detecting section 22 when the indicator 150 selects and moves the specific step Ng of the index 120, and calculates the waveform marker movement amount on the basis of the movement amount ratio H(Ng) corresponding to the specific step Ng detected and determined by the index selection detecting section 23a. That is, the horizontal axis position of a waveform marker is determined as the waveform marker movement amount=H(Ng)×(movement amount of the indicator 150). Then, the waveform marker is displayed at the horizontal axis position, to which the current waveform marker position has moved in the movement direction of the indicator 150 by the calculated waveform marker movement amount, and at the vertical axis position expressed as the waveform amplitude of the horizontal axis position stored in the measured data storage section 21a.

The above-described series of operations "movement of the indicator 150→detection of the movement amount of the indicator 150 using the instructed amount detecting section 22→detection of the index 120 and determination of a specific step using the index selection detecting section 23a→determination of the position of the waveform marker 110 and display of the waveform marker 110 using the marker generating section 21b" are performed in the fast processing cycle during the movement of the indicator 150, such that the position of the waveform marker 110 is updated in a sequential manner. Accordingly, in the movement of the indicator 150 and the movement of the waveform marker 110, the movement amounts (distances) are different but there is no time difference therebetween.

Therefore, from different point of view, since the movement amount (distance) of the indicator 150 is large and the movement amount (distance) of the waveform marker is small during the same time, it can be said that the plurality of steps of the index 120 divides the moving speed of the waveform marker 110 into a plurality of steps and the marker generating section 21b determines the moving speed of the waveform marker 110. That is, if each movement amount (distance) is expressed as a speed (Vm, Vs), the waveform marker movement amount=Vm·t and the indicator movement amount=Vs·t. Accordingly, the movement amount ratio H(N) is expressed as H(N)=(waveform marker movement amount)/(indicator movement amount)=Vm·t/Vs·t=Vm/Vs=k/N. For this reason, the "movement amount" in the appended claims is an expression including both the speed concept and the distance concept. In each embodiment, however, the movement amount as a distance will be described.

A series of operations and the actual movement of the waveform marker 110 in the first embodiment will be described with reference to FIGS. 2A to 4B and 8.

In step S1, the measured waveform 100 measured by the measuring section 30 and the index 120 generated by the index generating section 23b are generated in a state where a switch for setting of the waveform marker 110 is set to ON (Marker on) and they are displayed at initial positions, which are set beforehand, of the display section 11 with a touch panel structure. As shown in FIG. 2A, the index 120 has a bar shape and is divided into four steps in the longitudinal direction, that is, divided into regions in a stepwise manner according to colors (patterns). On the other hand, the index storage section 23c stores the movement amount ratio H(N) of four steps beforehand, as H1, H2, H3, and H4 (H1>H2>H3>H4) corresponding to steps N1, N2, N3, and N4 (N1<N2<N3<N4), so as to correspond to regions divided for the steps.

In step S2, the marker generating section 21b displays the waveform marker 110 at the same position as the initial position of the index 120.

The data display control section 21 reads the value (for example, a time or a frequency) of the measured waveform 100 in the horizontal axis and the value (for example, the waveform amplitude at the time or the waveform amplitude at the frequency) of the measured waveform 100 in the vertical axis, which correspond to the position of the waveform marker 110, using the marker generating section 21b and displays the values. Refer to the measured value 140 in FIG. 2A. Hereinafter, whenever the position of the waveform marker 110 is updated, the measured value 140 is also updated.

In step S3, the operator moves the indicator (finger) 150 in a direction of a target point 130 in a state where the indicator 150 overlaps the highest step of the bar-shaped index 120.

In step S4, the index selection detecting section 23a detects that the position of the indicator 150 is a region (N1) of the highest step and transmits the movement amount ratio H1, which corresponds to the region of the highest step, from the index storage section 23c to the marker generating section 21b.

In step S5, the instructed amount detecting section 22 detects the movement amount and the movement direction of the indicator 150 and notifies them to the marker generating section 21b.

In step S6, the marker generating section 21b determines the movement amount of "(movement amount ratio H1)×(movement amount of the indicator)". Then, the amplitude Y1 of the measured waveform 100 at the position X1 when shifting the current position of the waveform marker 110 by the distance of "(movement amount ratio H1)×(movement amount of the indicator)" in the movement direction of the indicator 150 is read from the measured data storage section 21a.

In step S7; the marker generating section 21b displays the waveform marker 110 at the coordinate position (X1, Y1) (previous display position is updated). In addition, the index generating section 23b moves the index 120 to the position of the waveform marker 110 and displays it.

The operations in steps S2 and S4 to S7 are performed in a predetermined fast processing cycle during the movement of the indicator 150 by step S3. Accordingly, the movement of the indicator 150 and the movement of the waveform marker 110 can be visualized so as to correspond to each other immediately.

For example, when the waveform marker 110 is displayed at the position having passed the target point as shown in FIG. 2B as a result of having moved the indicator 150 in FIG. 2A, the operator lowers the indicator 150 to be positioned at the second (N2) step from the top of the index 120 as shown in FIG. 3A and moves the indicator 150 to the target point. As a result, the waveform marker 110 and the index 120 make movements of "(movement amount ratio H2)×(movement amount of the indicator)" as shown in FIG. 3B. In this case, the adjustment becomes easier than in the case of the movement amount ratio H1. In addition, when the operator wants to perform fine adjustment, the operator can match the indicator 150 to the target point 130 as shown in FIG. 4B by moving the indicator 150 in a state where the indicator 150 is positioned at the lowest step (N4) as shown in FIG. 4A.

[Specific Mode when Specifying Each Step of the Index 120 by the Indicator 150]

This includes the following modes (1) and (2).

(1) Mode 1: When the indicator 150 is previously placed on a specific step (specific region) of the index 120, until the indicator 150 designates another specific step (another specific region) next, the movement amount ratio H corresponding to the specific step of the position previously placed is set even if the indicator 150 moves in a state of being distant from the index 120. Then, when the indicator 150 is placed on another specific step (another specific region), it is updated to the movement amount ratio H corresponding to another specific step. In practice, such operations can be realized by a method using detection of the index selection detecting section 23a.

In the case of moving the indicator 150 in step S3 described above, assuming that the movement amount ratio H1 is 1, the waveform marker 110 and the index 120 move seemingly so as to follow the movement of the indicator 150 almost simultaneously (delay equivalent to the loop operation in steps S2 and S4 to S7 occurs). Accordingly, the waveform marker 110, the index 120, and the indicator 150 seem to move with almost the same position. However, when the movement amount ratio H1 is smaller than 1, the movement amount of the indicator 150 is larger than the movement amounts of the waveform marker 110 and the index 120. In this case, the indicator 150 moves in a state of being distant from the waveform marker 110 and the index 120 (see FIG. 3B). Accordingly, in the mode 1, even if the indicator 150 becomes distant from the index 120, it can be made to move with the movement amount ratio H determined previously.

Figure 5:
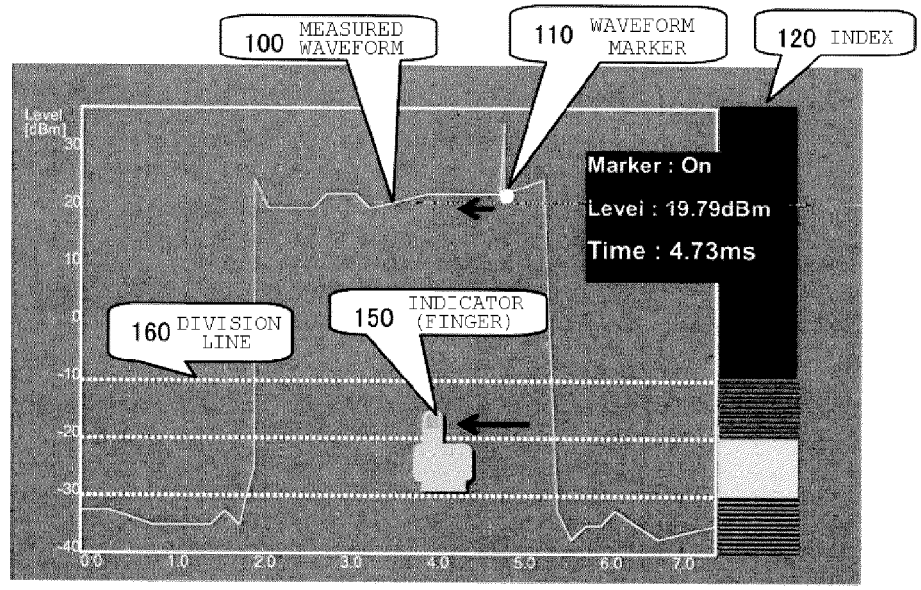
FIG. 5 is a view for explaining the movement and operation of a waveform marker in the first embodiment, which is another display example.

(2) Mode 2: A screen region where the measured waveform 100 is displayed is divided into four regions which express four steps, for example, into which the bar-shaped index 120 is divided and into parallel regions, and the bar-shaped index 120 is used as an indication of each region. A typical display example is shown in FIG. 5. The index 120 in this case is disposed as an indication, and an effective index is regions divided by division lines 160 (horizontal dotted lines) on the screen. In addition, FIG. 6 shows a mode in which regions between the division lines 160 shown in FIG. 5 can be distinguished by colors or patterns.

Figure 6:
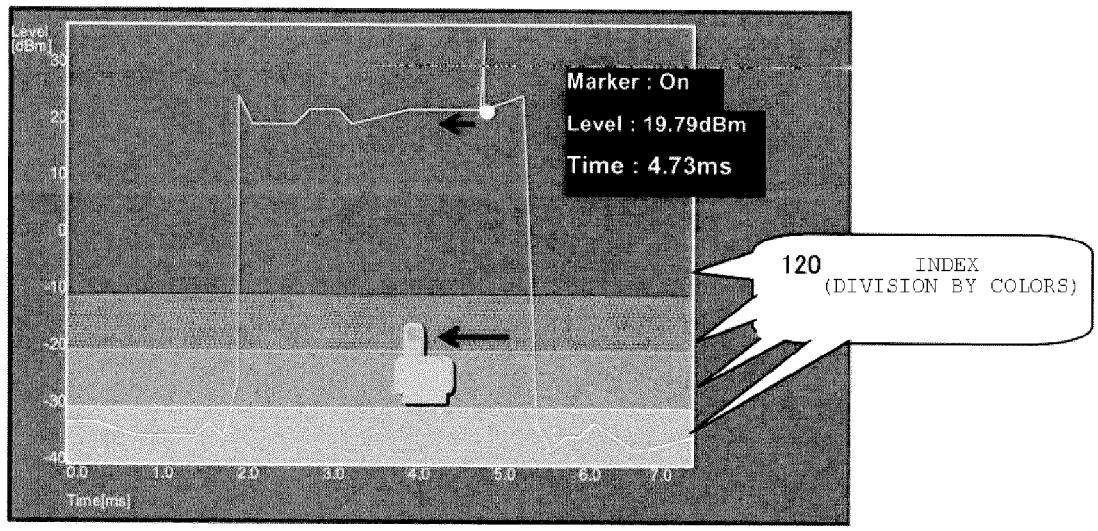
FIG. 6 is a view for explaining the movement and operation of a waveform marker in the first embodiment, which is another display example.

In addition, although the index 120 is displayed so as to be visually recognizable in FIGS. 5 and 6, the index 120 does not necessarily need to be visually recognized. This is because when the operator moves the indicator 150 in the previous region and then lowers and changes the region as shown in FIG. 4A and moves the waveform marker 110 in a direction that the operator wants as shown in FIG. 4B, the operator can recognize immediately that the movement amount of the waveform marker 110 is smaller than that when the indicator 150 was moved in the previous region. At least, it is preferable that the operator can recognize that the movement amount ratio H is large in the highest step of the screen and the movement amount ratio H is small in the lowest step, for example.

In practice, the mode 2 can also be realized by the configuration where the index selection detecting section 23a manages a region of a screen for every size of the movement amount ratio H and detects in which region the indicator 150 is present.

[Mode of the Index 120]

(3) Direction of the Index 120

Figure 7:
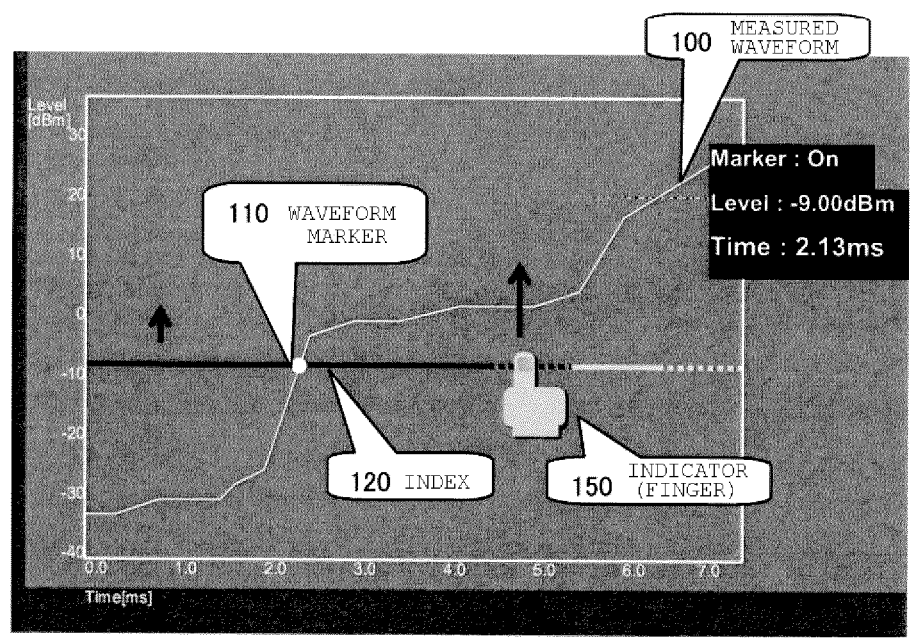
FIG. 7 is a view for explaining the movement and operation of a waveform marker in the first embodiment, which is another display example.

The modes (1) and (2) described above may also be said to be a mode of the index 120. In both the cases described above, the index 120 was set in parallel to the vertical axis of the coordinates of the screen of the display section 11 and division into each step (each region) of the index 120 was performed in the vertical axis direction. However, as shown in FIG. 7, it is also possible to adopt a configuration where the index 120 is set in parallel to the horizontal axis of the coordinates of the screen and division into each step (each region) of the index 120 was performed in the horizontal axis direction. This may be applied to both (1) and (2).

(4) Relationship Between the Index 120 and the Waveform Marker 110

In the above explanations using FIGS. 2A to 3B and 8, the index 120 and the waveform marker 110 were formed such that the positions thereof matched each other. However, as shown in FIG. 5 or 6, the index 120 may be fixed so as to be separated from the waveform marker 110.

Second Embodiment

Figure 9:
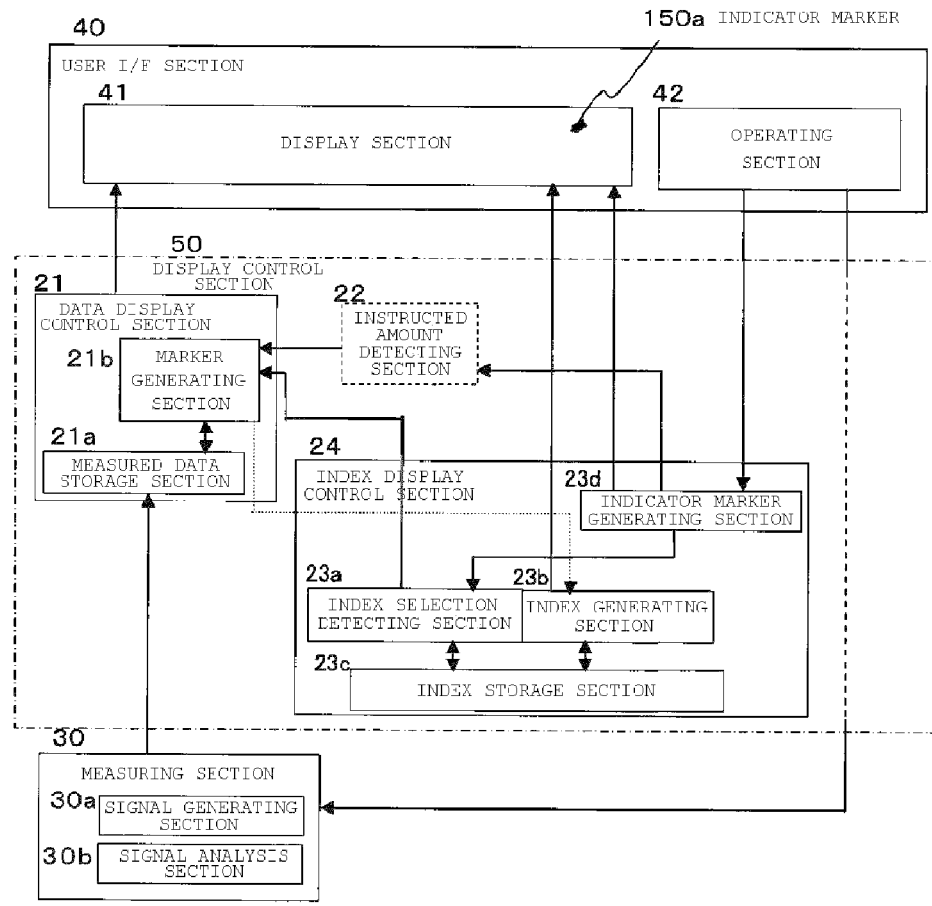
FIG. 9 is a view showing the function and configuration of a second embodiment.

While a touch panel is used in the first embodiment shown in FIG. 1, the second embodiment shown in FIG. 9 is the case where a normal display device having no sensor function on a screen is used. In the case of a touch panel, the touch panel itself can sense an operation using an operator's finger or a pen and details of the operation can be visually recognized. In the second embodiment, however, an indicator marker 150a which can be visually recognized on the screen is displayed instead of the operator's finger or the pen and the indicator marker 150a can be moved by an operation from an operating section 42, so that the same function and effects as in the first embodiment can be acquired.

Hereinafter, an explanation focused on a different point from the first embodiment will be given with reference to FIG. 9. In FIG. 9, the configuration of the same reference numeral as in FIG. 1 has the same function.

A user I/F section 40 and a display control section 50 shown in FIG. 9 are partially different from the user I/F section 10 and the display control section 20 shown in FIG. 1.

In the embodiment shown in FIG. 9, a display section 41 of the user I/F section 40 displays the indicator marker 150a instead of the indicator 150 of the display section 11 shown in FIG. 1. A mouse or the like in the operating section 42 operated by the operator moves the indicator marker 150a. An indicator marker generating section 23d of an index display control section 24 generates the indicator marker 150a, receives the movement of a mouse or the like in the operating section 42 as an operation amount coded by an encoder, and moves the indicator marker 150a according to the operation amount.

The instructed amount detecting section 22 shown in FIG. 9 detects the operation amount of the mouse or the like of the operating section 42 by receiving it from the indicator marker generating section 23d. When the amount by which the indicator marker generating section 23d moves the indicator marker 150a on the screen becomes the movement amount of the indicator marker 150a as it is, the instructed amount detecting section 22 is not necessarily needed (this is the reason why the instructed amount detecting section 22 shown in FIG. 9 is surrounded by a dotted frame). In addition, the index selection detecting section 23a of the display control section 50 shown in FIG. 9 can determine the movement amount ratio H(Ng) by receiving the positional information on the indicator marker 150a, which has been moved by the operation amount of a moving operation using a mouse or the like by the indicator marker generating section 23d, and specifying a specific step Ng designated by the indicator marker 150a from the positional information on the indicator marker 150a and the positional information on the index 120 generated by the index generating section 23b.

Other configurations are the same as those in the first embodiment. Since the configurations and operations are the same if the indicator 150 in the explanation of the first embodiment is replaced with the indicator marker 150a, the other explanations will be omitted. In addition, the above-described modes (1) to (5) may also be applied similarly.

Figure 10:
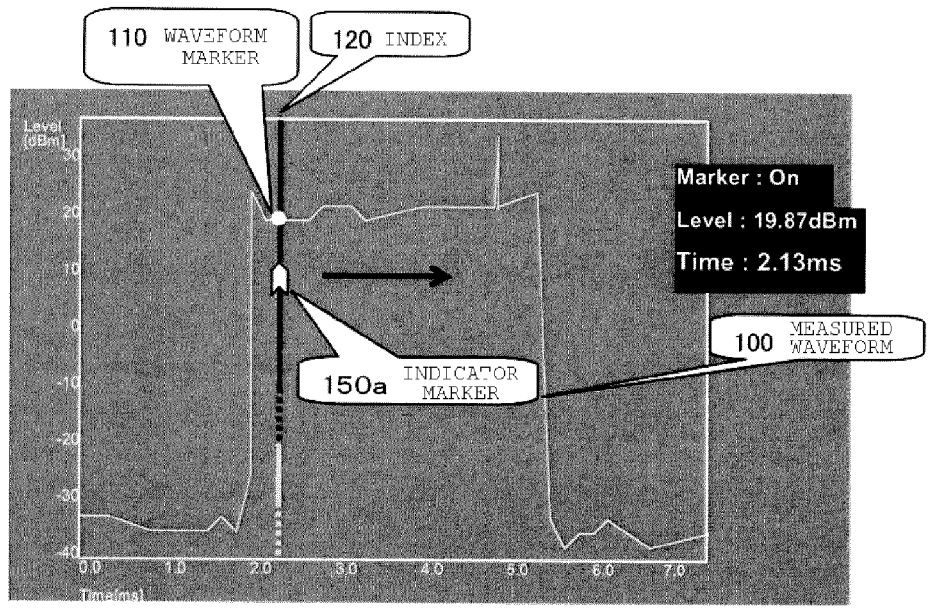
FIG. 10 is a view showing a first display pattern for operating a waveform marker in the second embodiment.

Corresponding to FIG. 2A which is a display example of the first embodiment, a display example of the second embodiment is shown in FIG. 10. In FIG. 10, only the indicator 150 is replaced with the indicator marker 150a.

Figure 8:
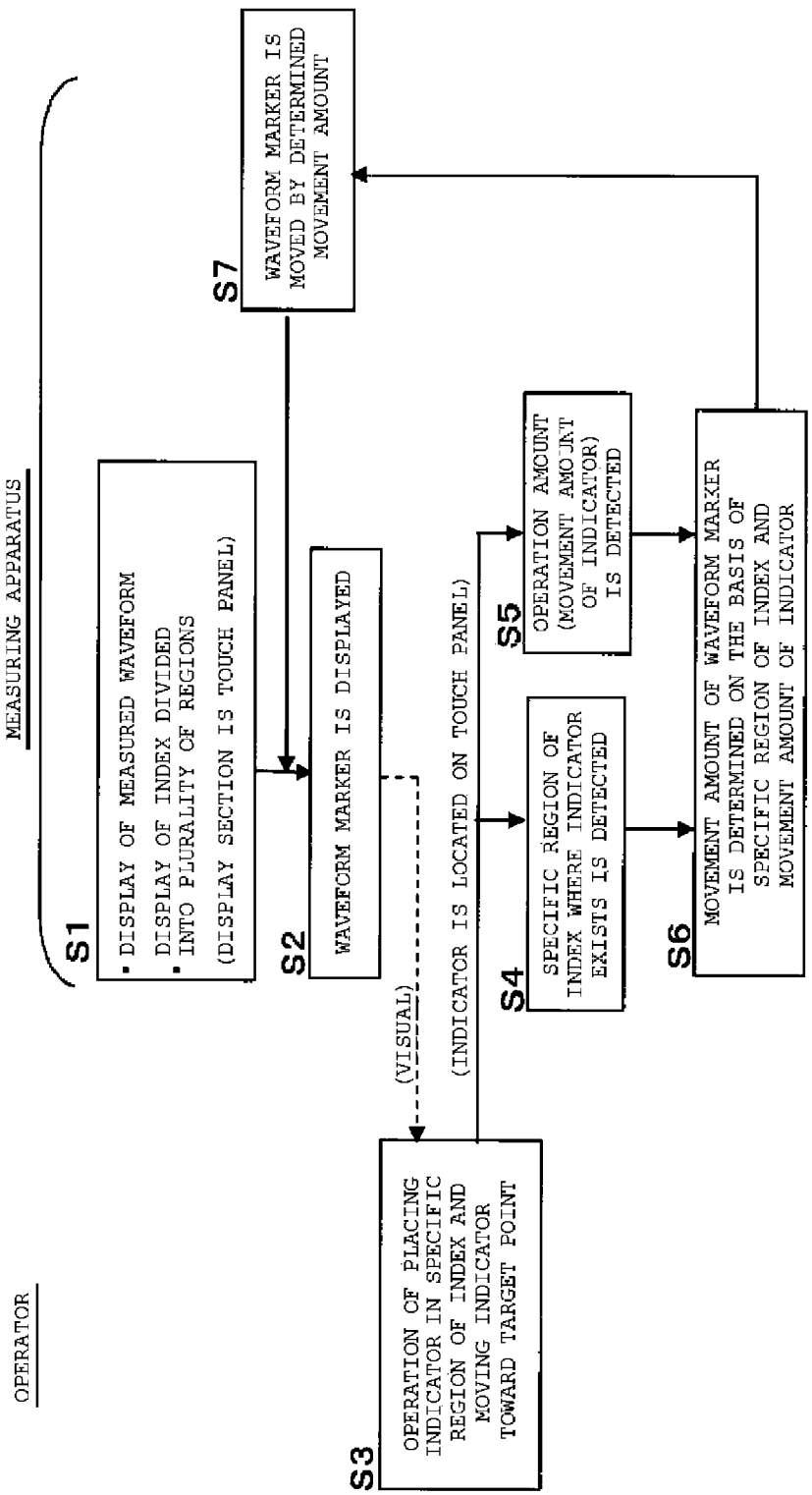
FIG. 8 is a view showing the operation flow in the first embodiment.
Figure 11:
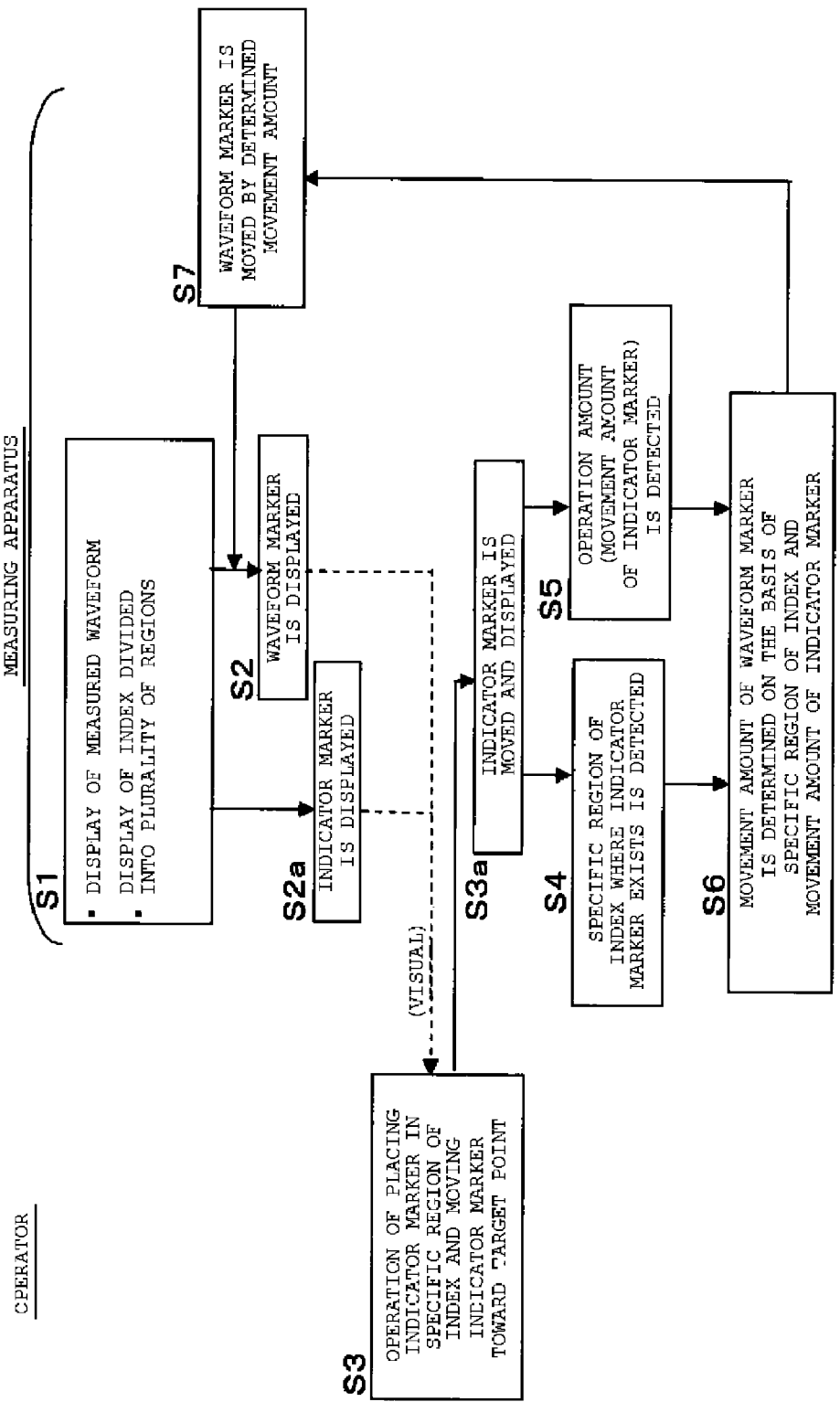
FIG. 11 is a view showing the operation flow in the second embodiment.

In addition, the flow showing a series of operations in the second embodiment is shown in FIG. 11. FIG. 11 is different from FIG. 8 in that the "indicator" in FIG. 8 is written as an "indicator marker", the indicator marker 150a is displayed in step S2a, and the indicator marker 150a is moved according to the operation in step S3 in step S3a. Since operations in other steps shown in FIG. 11 are the same as those in FIG. 8, the explanation will be omitted.

Third Embodiment

In the third embodiment, the measuring apparatus has a function of a zone marker 170 with a variable width and a function of a peak marker 110a, which is displayed at a peak point of the measured waveform 100 within the zone marker 170, instead of the index 120 and the waveform marker 110 in the first embodiment.

Figure 12:
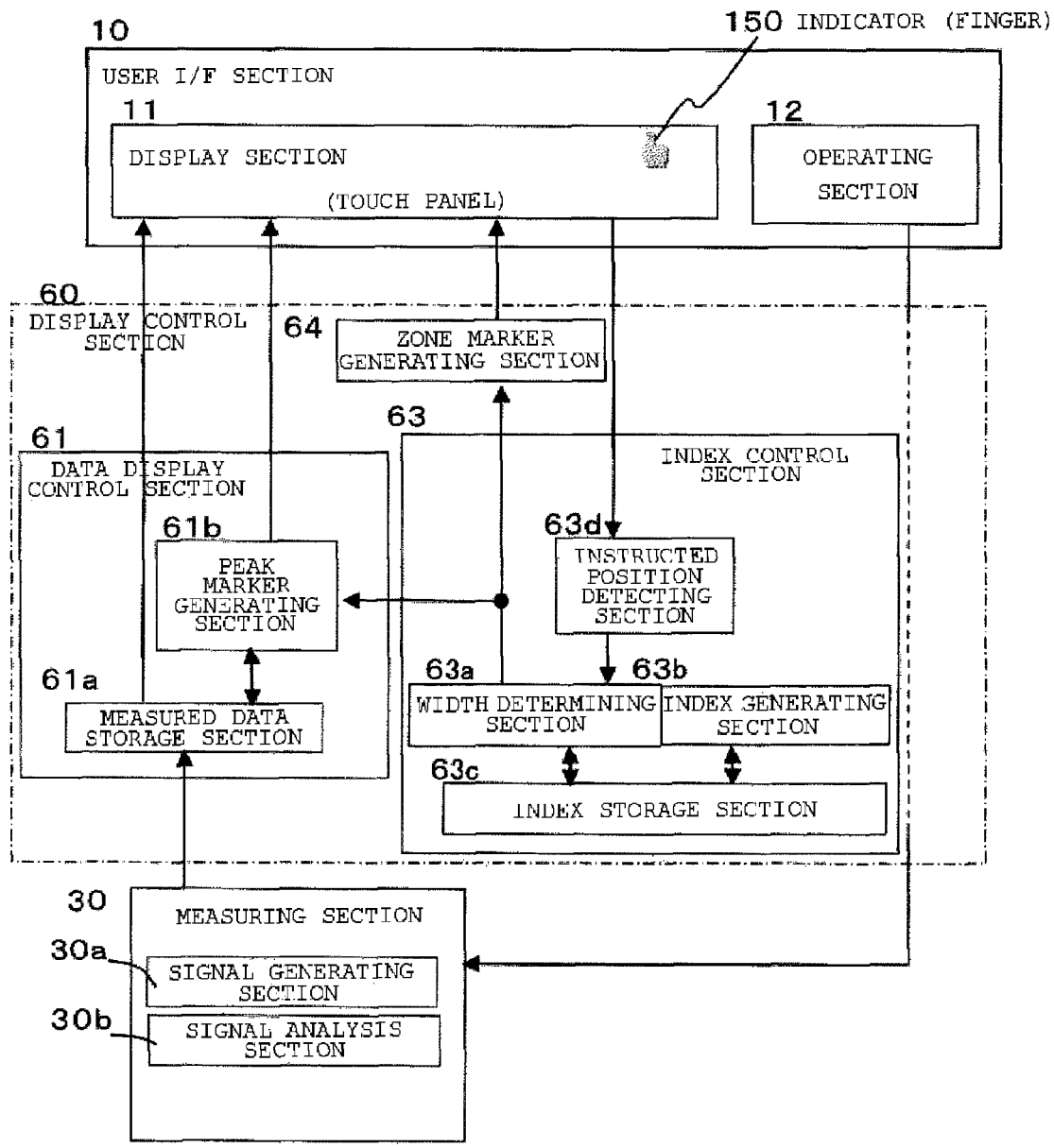
FIG. 12 is a view showing the functional configuration of a third embodiment.

The third embodiment will be described with reference to FIG. 12. In FIG. 12, main components to which the same reference numerals as in FIGS. 1 and 9 are given have the same functions.

A data display control section 61 in the display control section 60 stores the amplitude (equivalent to the position on the vertical axis) of the measured waveform 100 from the measuring section 30 in a measured data storage section 61a using as an address the time information in a measured time range (equivalent to the position on the horizontal axis) when measured. In addition, the measured waveform 100 stored in the measured data storage section 61a is displayed on a screen on the display section 11 together with the coordinates of horizontal axis-vertical axis (see FIG. 14). In addition, the following explanation will be given assuming that the display section 11 is formed by a touch panel. Moreover, the following explanation will be given on the assumption that a finger is used as an indicator in a marker operation (moving operation of a zone marker which will be described later) like the first embodiment.

Figure 14:
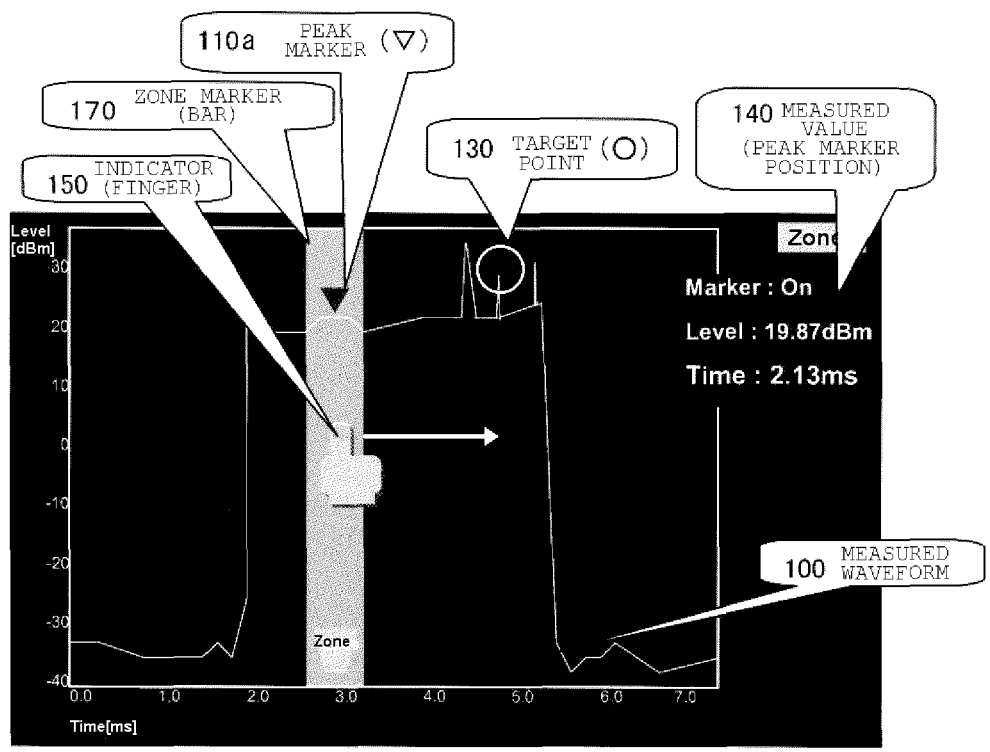
FIG. 14 is a view for explaining the movement and operation of a waveform marker in the third embodiment.

A zone marker generating section 64 generates the zone marker 170, which has a default position and a default width when the apparatus is switched on and then has a position (hereinafter, referred to as a "zone position") and a width (hereinafter, referred to as a "zone width") according to the instruction from a width determining section 63a which will be described later, and displays the zone marker 170 on the display section 11. In this case, the zone width is changed with the designated zone position (center position of the zone) as the center. FIG. 14 shows an example of the bar-shaped zone marker 170 which has a predetermined zone width.

A peak marker generating section 61b receives the information of the zone position and the zone width from the width determining section 63a (or from the zone marker generating section 64), calculates the time position and the time width corresponding to the zone position and the zone width, reads the measured data of the measured waveform 100 at the time position and the time width from the measured data storage section 61a, and calculates the peak value of the measured waveform 100 within the zone width. Then, the peak marker generating section 61b generates and displays the peak marker 110a at the peak position of the measured waveform 100 (see ∇ mark in FIG. 14). In addition, the data display control section 61 displays the measurement time range by assigning it in a physical full-scale range (for example, 512 dots) of the display screen of the display section 11. On the other hand, since the zone position and the zone width are physical position and range of the display screen of the display section 11, the peak marker generating section 61b receives the zone position and the zone width and converts them into the position and width of a time referring to the measurement time range stored in the measured data storage section 61a.

An instructed position detecting section 63d of an index control section 63 detects the position in the movement direction (horizontal position; hereinafter, referred to as a "zone position") and the position in the vertical direction (hereinafter, referred to as a "vertical position") when the indicator 150 is operated on the zone marker 170, on the screen (display region where the waveform data is displayed, that is, a region where the coordinates expressed by horizontal axis-vertical axis are displayed; the same meaning hereinbelow) of the display section 11 of the touch panel as shown in FIG. 14. For example, the instructed position detecting section 63d detects the horizontal and vertical positions of the operator's finger (indicator) when the operator touches the touch panel of the screen with his or her finger and moves the touch position (position of the indicator 150). This detection is performed in a fast processing cycle compared with the movement time of the indicator 150. In addition, in the third embodiment, a finger, a pen, and the like will be described as the indicator 150.

Before forwarding or measurement, the zone width corresponding to the vertical position of the indicator 150 is stored beforehand in an index storage section 63c. For example, it is divided into five steps from the high vertical position to the low vertical position, and values along which the zone width decreases as the position of the indicator 150 lowers are stored (the steps are not limited to five steps but may be continuous. Or it may be displayed in a stepwise manner so as to be distinguishable. In addition, the extending or narrowing direction of the zone width may be opposite those described above). This is stored beforehand in the index storage section 63c by an index generating section 63b in response to the instruction from an operating section 12.

The width determining section 63a receives the vertical position detected by the instructed position detecting section 63d, searches the zone width corresponding to the vertical position from the index storage section 63c, and transmits the searched zone width and the zone position detected by the instructed position detecting section 63d to the zone marker generating section 64 and the peak marker generating section 61b.

In this way, the zone marker generating section 64 disposes the zone marker 170 with a zone width, which has been instructed from the width determining section 63a as described above, at the instructed zone position on the display section 11. On the other hand, the peak marker generating section 61b reads the waveform data within the time width, which is equivalent to the instructed zone width, from the measured data storage section 61a with the time position determined at the zone position instructed from the width determining section 63a as the center, calculates the waveform position indicating the maximum value from the read measured data, and attaches the peak marker 110a to the position and displays it.

In addition, until the zone marker 170 and the peak marker 110a are displayed at the changed positions after an instruction of change using the indicator 150, the process is performed at high speed. Accordingly, the operator can see the result without a feeling of discomfort (smoothly) after changing the zone width and the zone position of the zone marker.

Next, a series of operations including usage will be described while referring to the display examples shown in FIGS. 14 to 17 (partially overlapping those described above).

In FIG. 14, the horizontal axis indicates a measurement time and the vertical axis indicates the amplitude of the measured waveform 100. Here, an operation of setting from the position of the zone marker 170 in FIG. 14 up to the target point 130 (0 mark) to be measured is performed will be described. FIG. 14 shows a state where the zone marker generating section 64 displays the zone marker 170 having a predetermined zone width at a predetermined zone position as a default, and the peak marker generating section 61b searches the peak position of the data of the measured waveform 100 within the zone position and the zone width and displays the peak marker 110a at the position.

Figure 15:
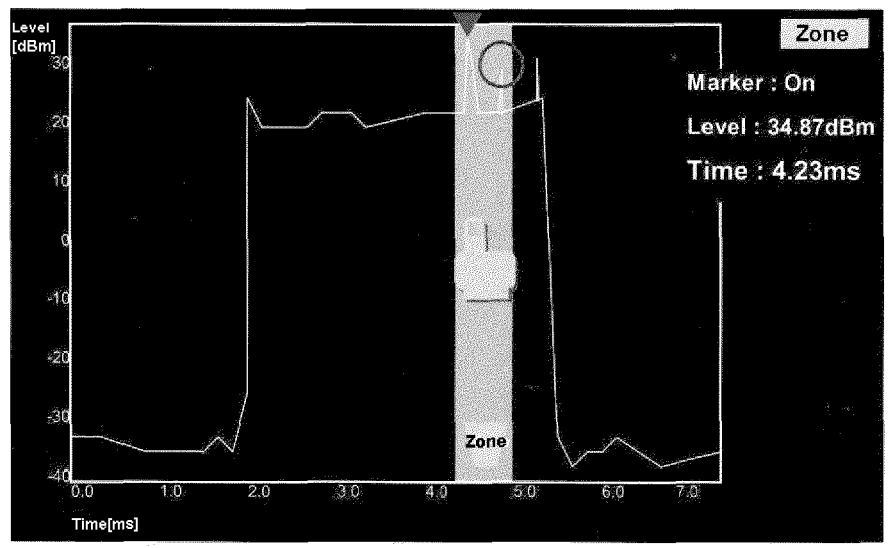
FIG. 15 is a view for explaining the movement and operation of a waveform marker in the third embodiment.
Figure 16:
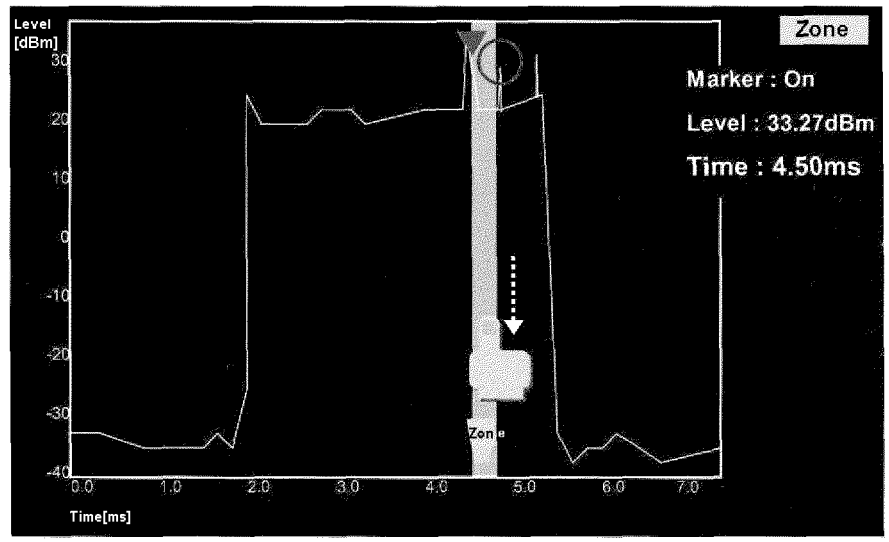
FIG. 16 is a view for explaining the movement and operation of a waveform marker in the third embodiment.
Figure 17:
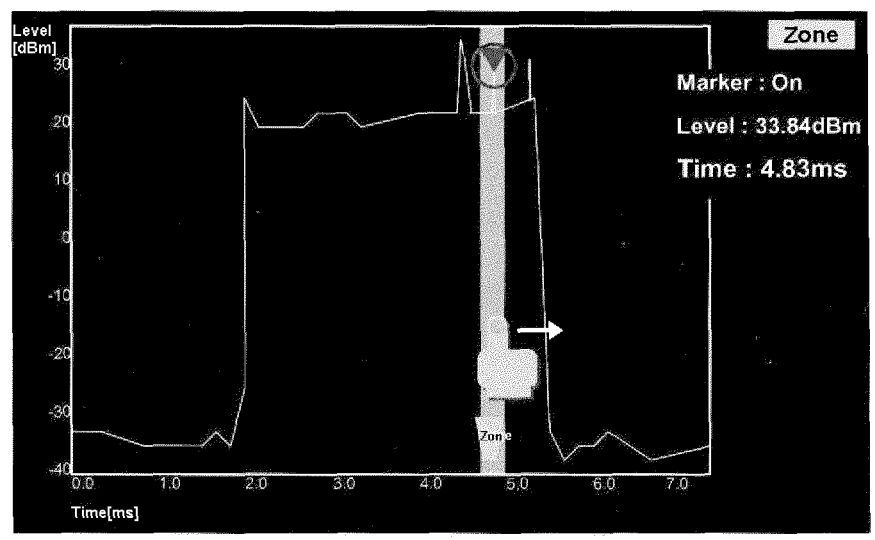
FIG. 17 is a view for explaining the movement and operation of a waveform marker in the third embodiment.

Referring to FIG. 14, an operator places the indicator 150 (finger) on an upper part of the zone marker 170 and moves it toward the target point 130. The instructed position detecting section 63d detects the movement zone (zone position) of the indicator and also detects the vertical position of the indicator 150. The width determining section 63a receives the vertical position detected by the instructed position detecting section 63d, searches the zone width corresponding to the vertical position from the index storage section 63c, and gives instructions of the searched zone width and the zone position detected by the instructed position detecting section 63d to the zone marker generating section 64 and the peak marker generating section 61b. Since only the position of the indicator 150 was moved to the right with no change in the vertical position, the zone marker generating section 64 does not change the zone width and moves only the zone position to the right by the movement amount of the indicator 150. The peak marker generating section 61b displays the peak marker 110a at the waveform position of the maximum value of the measured waveform 100 within the zone width at the moved zone position. FIG. 15 shows the example. In FIG. 15, there are two peak positions including the target point 130 within the zone width, and the peak marker 110a is displayed at the maximum position outside the target which is higher than the target point 130. Then, the operator lowers the indicator 150 to the low position on the zone marker 170. Then, the instructed position detecting section 63d reads the zone width (reduced zone width; increases the instruction resolution effectively), which corresponds to the changed position of the indicator 150, from the index storage section 63c and gives an instruction to the zone marker generating section 64 and the peak marker generating section 61b. In response to the instruction of the instructed position detecting section 63d, the zone marker generating section 64 reduces and displays the zone width without changing the center position of the zone marker 170. The peak marker generating section 61b displays the peak marker 110a at the position of the maximum value of the measured waveform within the reduced zone width (see the FIG. 16). In addition, the operator moves the indicator 150 until the target point 130 enters into the reduced zone marker 170 while keeping the indicator 150 at the low position. In this way, the instructed position detecting section 63d detects the zone position by the indicator 150 and gives an instruction to the zone marker generating section 64 and the peak marker generating section 61b. The zone marker generating section 64 displays the zone marker 170 including the target point 130 without changing the zone width, and the peak marker generating section 61b displays the peak marker 110a at the position of the maximum value of the measured waveform 100 within the zone width at the moved zone position (in this case, displays the peak marker 110a at the target point 130) (see FIG. 17).

By the above-described configuration, it is possible to move the zone marker 170 while changing the width of the zone marker 170 smoothly. As a result, it is possible to see the target point by the zone marker 170 by smoothly separating peak points near the target point 130 from each other.

Fourth Embodiment

Figure 13:
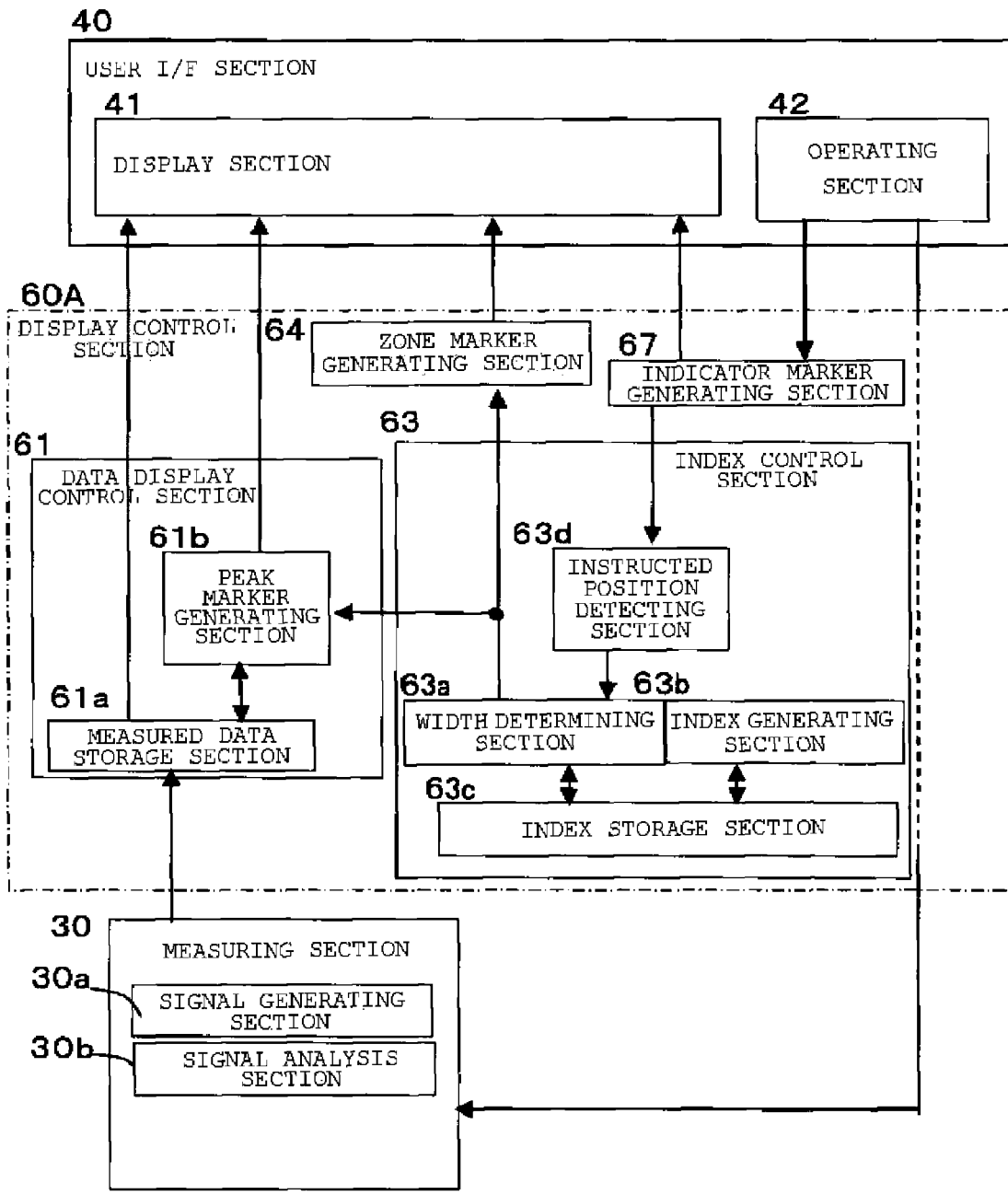
FIG. 13 is a view showing the functional configuration of a fourth embodiment.

The fourth embodiment will be described with reference to FIG. 13. In FIG. 13, main components to which the same reference numerals as in FIGS. 1, 9, and 12 are given have the same functions.

In the fourth embodiment, the display section 41 of the user I/F section 40 shown in FIG. 13 in the third embodiment is changed to a normal display section with no touch panel. For this reason, although a finger was described as the indicator 150 in the third embodiment, the indicator marker 150a as a marker which can be operated from the operating section 42 is used instead of the finger. That is, an indicator marker generating section 67 shown in FIG. 13 receives the information indicating the operator's operation amount and direction using an encoder (for example, a mouse) or the like of the operating section 42, generates the indicator marker 150a in the movement direction and position corresponding to the information and displays the indicator marker 150a on the display section 41, and notifies the instructed position detecting section 63d of the movement direction and position of the indicator marker 150a. Since other operations are the same as those in the third embodiment, the explanation will be omitted.

Fifth Embodiment

Figure 18:
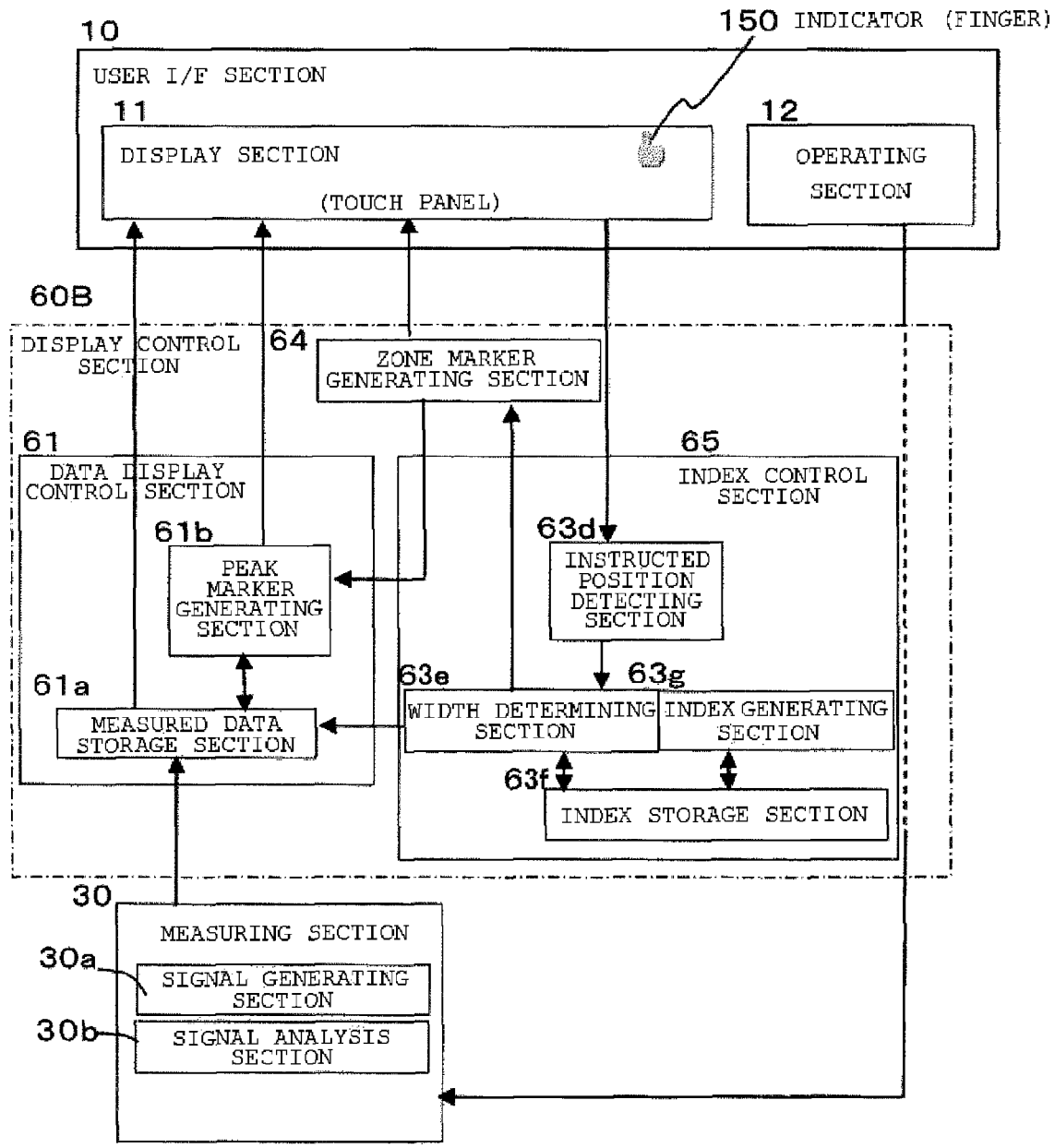
FIG. 18 is a view showing the functional configuration of a fifth embodiment.

The fifth embodiment will be described with reference to FIG. 18. In FIG. 18, main components to which the same reference numerals as in FIGS. 1, 9, 12, and 13 are given have the same functions In the third embodiment, the instruction resolution with respect to the measured waveform 100 is changed by changing the width of the zone marker 170 according to the vertical position of the indicator 150. On the other hand, in the fifth embodiment, the instruction resolution of the zone marker 170 with respect to the measured waveform 100 is changed by changing a display range (may also be said to be a "display time range") when displaying the measured waveform 100 while maintaining the width of the zone marker 170 as a fixed width, such that the target point 130 can be easily caught by the peak marker 110a. Accordingly, although the objects controlled to improve the instruction resolution are different in the third and fifth embodiments, the ideas of the third and fifth embodiments are substantially the same.

In this case, the measuring section 30 acquires the data number regarding the fineness of time of the horizontal axis and stores it in the measured data storage section 61a as measured data of the measured waveform 100 so that it is possible to meet expansion/reduction of the display time width of the horizontal axis when displaying the measured waveform 100, which will be described later. For example, suppose that a time width ΔT at the time of minimum reduction is displayed when a physical display point number on the horizontal axis is set to N, the data number equal to or larger than "N×Max" is acquired with a fineness which is finer than "(ΔT/N)÷Max" in order to make it possible to enlarge the time width maximum Max times.

Moreover, an example in which the display section 11 is formed by a touch panel is the fifth embodiment, and an example in which the display section 11 is formed by a normal display section is a sixth embodiment which will be described later.

Referring to FIG. 18, an explanation focused on the difference with FIG. 12 will be given hereinafter. Before forwarding or measurement, the display range (which becomes a display time width equivalent to the horizontal axis), which corresponds to the vertical position of the indicator 150 (finger) and which is read for display from the measured data storage section 61a, is stored beforehand in an index storage section 63f of an index control section 65 in FIG. 18. For example, it is divided into five steps from the high vertical position to the low vertical position, and the value which narrows the display time width as the position of the indicator 150 becomes lower is stored. This is stored beforehand in the index storage section 63f by an index generating section 63g in response to the instruction from the operating section 12. The display time width stored in the index storage section 63f may be an absolute value or may be the magnification m (<Max).

A width determining section 63e receives the vertical position detected by the instructed position detecting section 63d, searches the display time width corresponding to the vertical position from the index storage section 63f, and transmits the searched display time width and the zone position detected by the instructed position detecting section 63d to the zone marker generating section 64 and the measured data storage section 61a.

The zone marker generating section 64 generates a vertically long bar-shaped zone marker 170 with a predetermined width (may be changed by the operating section 12) and displays it at the zone position (center position of the zone marker) instructed from the width determining section 63e. On the other hand, the zone marker generating section 64 transmits the information of the predetermined width to the peak marker generating section 61b.

With the time position corresponding to the zone position detected by the instructed position detecting section 63d as the center, the data display control section 61 displays on the display section 11 the coordinates, in which the display time width received from the width determining section 63e is set as a time range of the horizontal axis and the vertical axis is set as the amplitude of the measured waveform 100, and the measured waveform 100 stored in the measured data storage section 61a. The newest zone marker 170 generated by the zone marker generating section 64 is displayed on the measured waveform 100 which is displayed on the display section 11. When the data display control section 61 performs minimum reduction display under the conditions in which the display point number on the horizontal axis is N, the time width at the time of minimum reduction display is ΔT, and the maximum enlarged width is Max times as described above, for example, the data display control section 61 acquires the measured waveform data from the measured data storage section 61a every time interval (address gap) of Max and displays it by sequentially assigning it to the display point N. In this case, when there is an instruction to change the display time width received from the width determining section 63e m times, the data display control section 61 acquires the measured waveform data from the measured data storage section 61a every time interval (address gap) of Max/m and displays it by sequentially assigning it to the display point N. In addition, the data display control section 61 displays it by assigning it with a display point, which corresponds to the time position corresponding to the zone position, as a center.

The peak marker generating section 61b reads from the measured data storage section 61a the data corresponding to the time range of the width of the zone marker 170, which has been instructed from the zone marker generating section 64, with the time position corresponding to the zone position detected by the instructed position detecting section 63d as the center (center position of the zone marker 170), searches the waveform position indicating the maximum value, and displays the peak marker 110a at the searched waveform position on the display section 11.

Since the processing time until the vertical position and the horizontal position (zone position) of the indicator 150 are detected after moving the indicator 150 (finger) and the newest zone marker 170 and the peak marker 110a are displayed is short, the operator can observe it without a feeling of discomfort.

Figure 21:
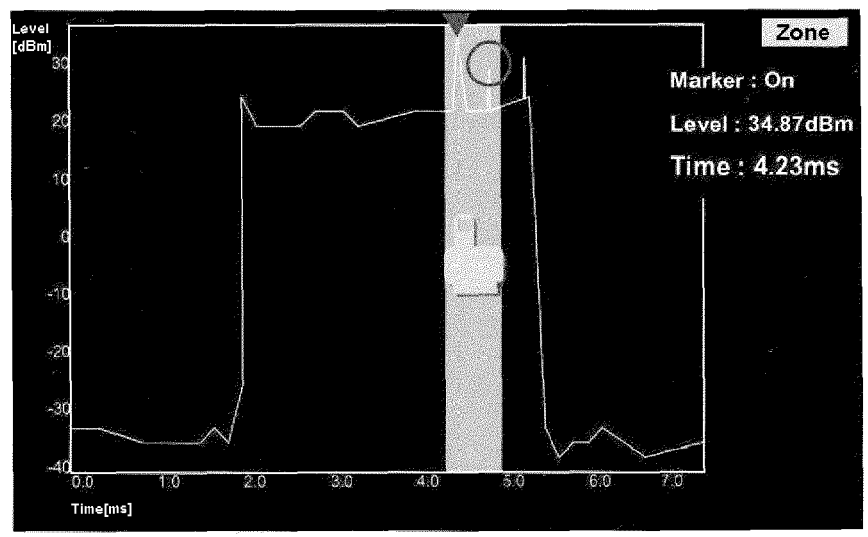
FIG. 21 is a view for explaining the movement and operation of a waveform marker in the fifth embodiment.
Figure 22:
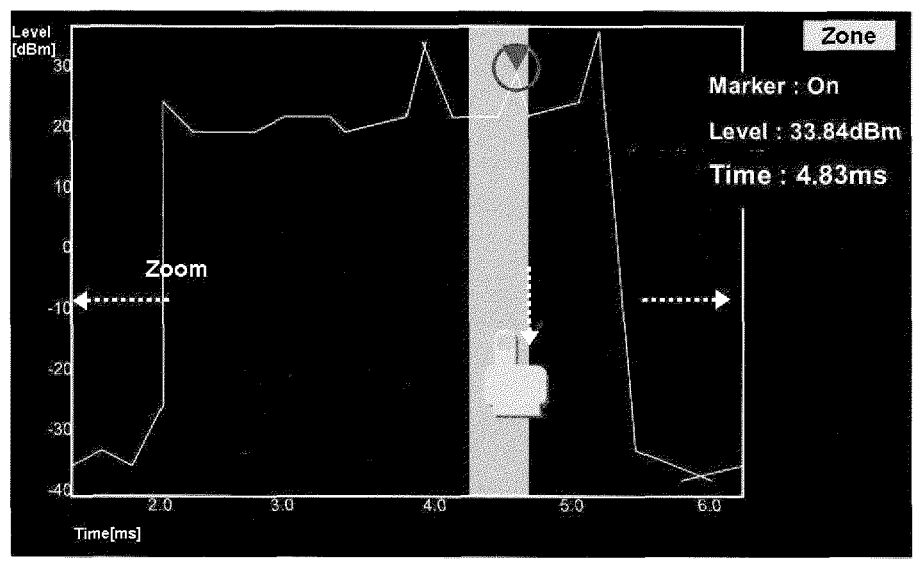
FIG. 22 is a view for explaining the movement and operation of a waveform marker in the fifth embodiment.

Next, an operation method and a series of operations will be described with reference to FIGS. 20 to 22.

Figure 20:
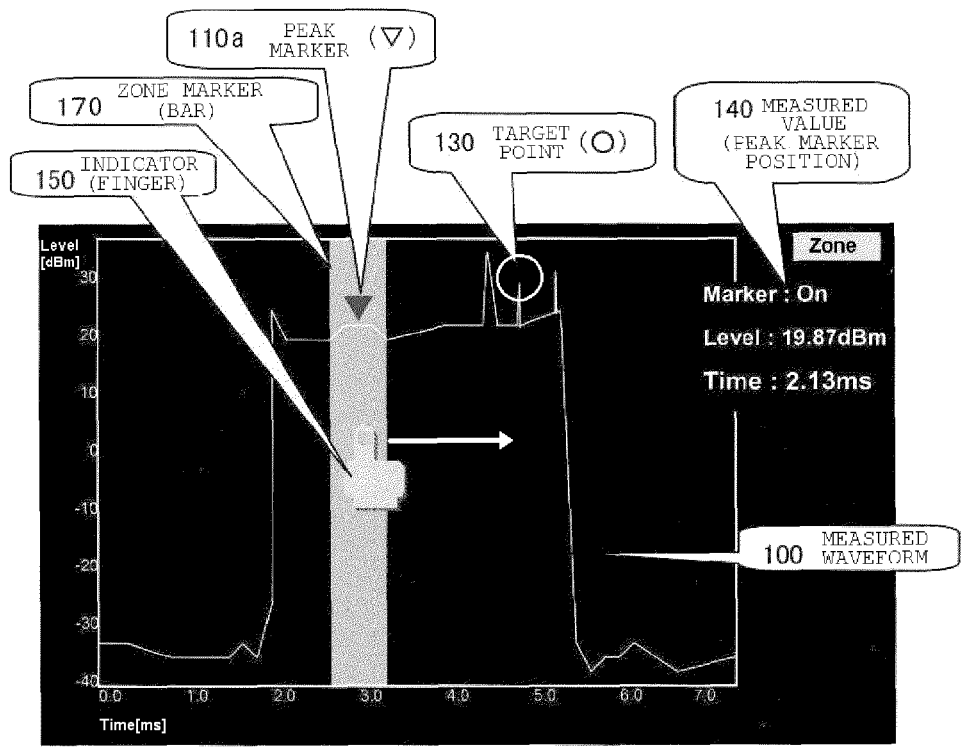
FIG. 20 is a view for explaining the movement and operation of a waveform marker in the fifth embodiment.

In FIG. 20, the horizontal axis indicates a measurement time and the vertical axis indicates the amplitude of the measured waveform 100. Here, an operation until it is set from the position of the zone marker 170 in FIG. 20 to the target point 130 (0 mark) to be measured will be described. FIG. 20 shows a state where the zone marker generating section 64 displays the zone marker 170 having a predetermined zone width at a predetermined zone position as a default, and the peak marker generating section 61b searches the peak position of the data of the measured waveform 100 within the zone position and the zone width and displays the peak marker 110a at the position.

Referring to FIG. 20, an operator places the indicator 150 (finger) on an upper part of the zone marker 170 and moves it toward the target point 130. The instructed position detecting section 63d detects the movement zone (zone position) of the indicator 150 and also detects the vertical position of the indicator 150. The width determining section 63e receives the vertical position detected by the instructed position detecting section 63d, searches the display time width corresponding to the vertical position from the index storage section 63f, and gives instructions of the searched display time width and the zone position detected by the instructed position detecting section 63d to the zone marker generating section 64 and the measured data storage section 61a (data display control section 61). Since only the position of the indicator 150 was moved to the right with no change in the vertical position, the zone marker generating section 64 moves only the zone position to the right by the movement amount of the indicator 150. The peak marker generating section 61b displays the peak marker 110a at the position of the maximum value of the measured waveform 100 within the zone width at the moved zone position. FIG. 21 shows the example. In FIG. 21, there are two peak positions including the target point 130 within the zone width, and the peak marker 110a is displayed at the maximum position outside the target. Then, the operator lowers the indicator 150 to the low position on the zone marker 170. Then, the instructed position detecting section 63d detects the vertical position and the width determining section 63e reads the display time width, which corresponds to the changed vertical position of the indicator 150, from the index storage section 63f and transmits it to the zone marker generating section 64 and the measured data storage section 61a (data display control section 61) to instruct display with the shortened display time width. The data display control section 61 displays the measured waveform 100 on the display section 11 together with the coordinates in which the shortened display time width is assigned over the full-scale range of the horizontal axis. Accordingly, the displayed measured waveform 100 is displayed in a state of being more enlarged than before since the display time width changes to become short. FIG. 22 shows the example. In FIG. 22, the target point 130 is included within the zone width at this point of time. Since the width of the zone marker 170 is still constant, the instruction resolution of the zone marker 170 with respect to the measured waveform 100 is effectively improved. The peak marker generating section 61b displays the peak marker 110a at the position of the maximum value of the measured waveform within the zone width of the zone marker 170, which is the data of the measured waveform 100 within the shortened display time. In FIG. 22, the peak marker 110a is displayed at the target point 130, and the measured value at the peak waveform position is displayed as a numeric value on the right side of the screen.

By the above-described configuration, it is possible to move the measured waveform 100 while changing the display range of the measured waveform 100 smoothly. As a result, since the instruction resolution of the zone marker 170 is relatively improved, it is possible to see the target point 130 by the zone marker 170 and the peak marker 110a by smoothly separating peak points near the target point 130 from each other.

Sixth Embodiment

Figure 19:
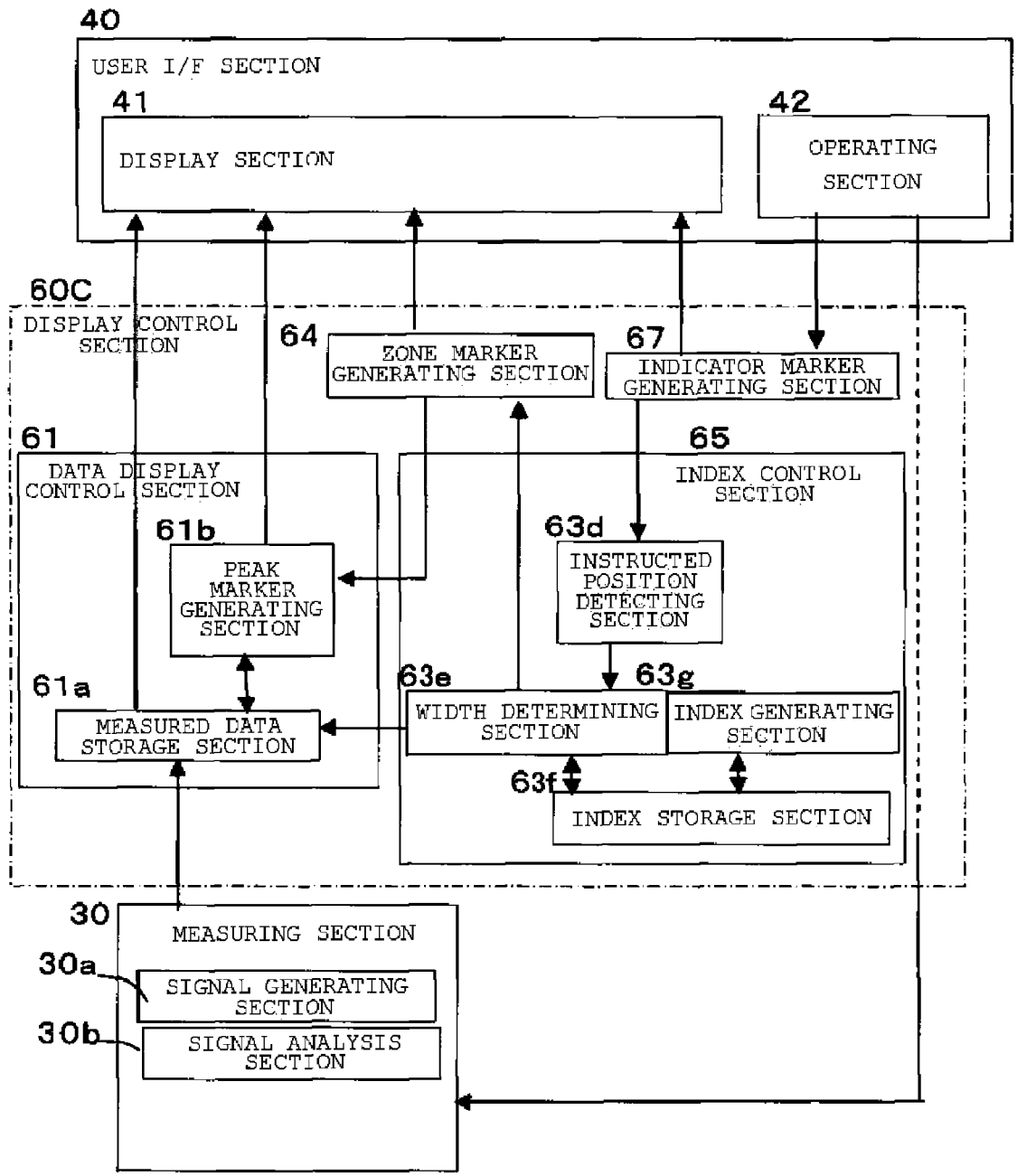
FIG. 19 is a view showing the functional configuration of a sixth embodiment.

The sixth embodiment will be described with reference to FIG. 19. In FIG. 19, main components to which the same reference numerals as in FIGS. 1, 9, 12, 13, and 18 are given have the same functions.

In the sixth embodiment, the display section 41 of the user I/F section 40 shown in FIG. 19 in the fifth embodiment is changed to a normal display section with no touch panel. For this reason, although a finger was described as the indicator 150 in the fifth embodiment, the indicator marker 150a as a marker which can be operated from the operating section 42 is used instead of the finger. That is, the indicator marker generating section 67 shown in FIG. 19 receives the information indicating the operator's operation amount and direction using an encoder or the like from the operating section 42, generates the indicator marker 150a in the movement direction and position corresponding to the information and displays the indicator marker 150a on the display section 41, and notifies the instructed position detecting section 63d of the movement direction and position of the indicator marker 150a. Since other operations are the same as those in the fifth embodiment, the explanation will be omitted.

Seventh Embodiment

The seventh embodiment will be described with reference to FIG. 23. A measuring section 230 checks a tested apparatus, such as a mobile communication apparatus, by transmitting to the tested apparatus a signal from a signal generating section 230a, which is specified in an actual wireless system, and receiving and analyzing the signal from the tested apparatus in a signal analysis section 230b. In this case, the received signal may be analyzed in a time domain or the frequency spectrum of the signal may be analyzed in a frequency domain. When performing such analyses, the received signal or a signal obtained by converting the received signal is transmitted to a display control section 220 as a measured waveform 100 in a time domain, which is displayed in a display section 211 as time domain coordinates having the horizontal axis as a time and the vertical axis as a level (that is, the amplitude of a measured waveform) at the time, or as a measured waveform 100 of the spectrum, which is displayed in the display section 211 as frequency domain coordinates having the horizontal axis as a frequency and the vertical axis as a level (that is, the amplitude of a measured waveform) at the frequency, and the display control section 220 displays the measured waveform 100 on the display section 211. Moreover, the measuring apparatus to which the invention can be applied is not limited to an apparatus having the measuring section 230 which checks the mobile communication apparatus, but applications to apparatuses which display the data obtained by measurement (including photographing and the like) as an image, insert the waveform marker 110 in the image, and acquire the image characteristic at the position of the waveform marker 110 may also be made.

For example, the invention may also be applied to measurement fields, such as shape measurement, flow rate measurement, and medical measurement (the same for the seventh to twelfth embodiments). In the following explanation, the measured waveform will be described as data expanded at the coordinates in which the horizontal axis is expressed as a time, a frequency, or the like serving as a reference of analysis and the vertical axis is expressed as the amplitude of a measured waveform at the time or the frequency.

A data display control section 221 in the display control section 220 stores the amplitude (equivalent to the position on the vertical axis) of the measured waveform 100 from the measuring section 230 in a measured data storage section 221a using as an address the horizontal axis information (for example, time or frequency in the horizontal axis) when measured. In addition, the measured waveform 100 stored in the measured data storage section 221a is displayed on a screen on the display section 211 together with the coordinates of horizontal axis-vertical axis.

Figure 24:
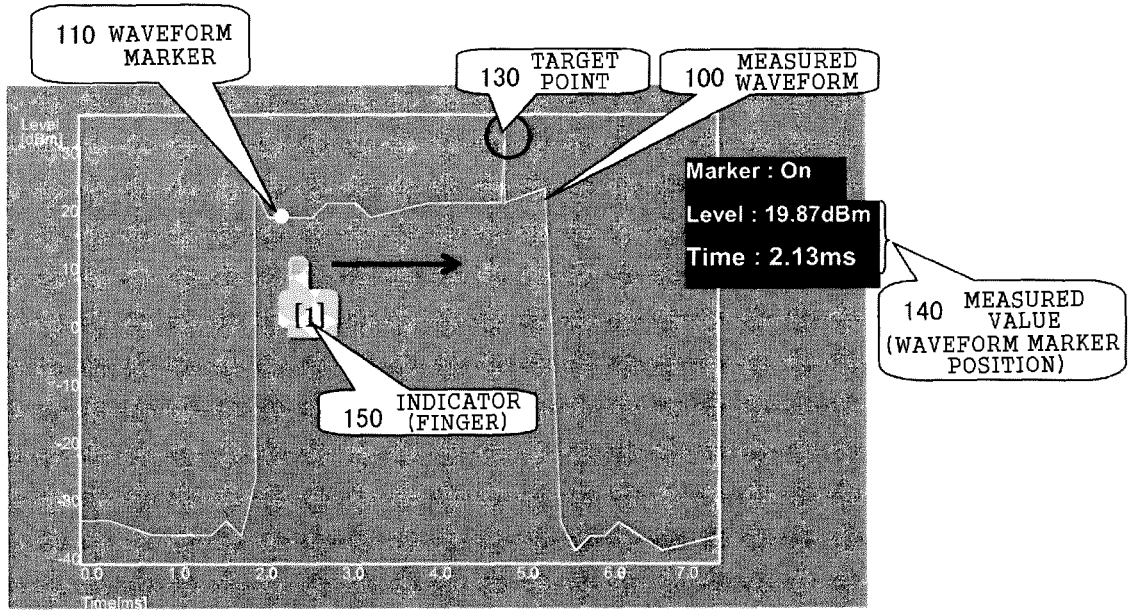
FIGS. 24A and 24B are views for explaining the movement and operation of a waveform marker in the seventh embodiment, which are one display example.
Figure 24:
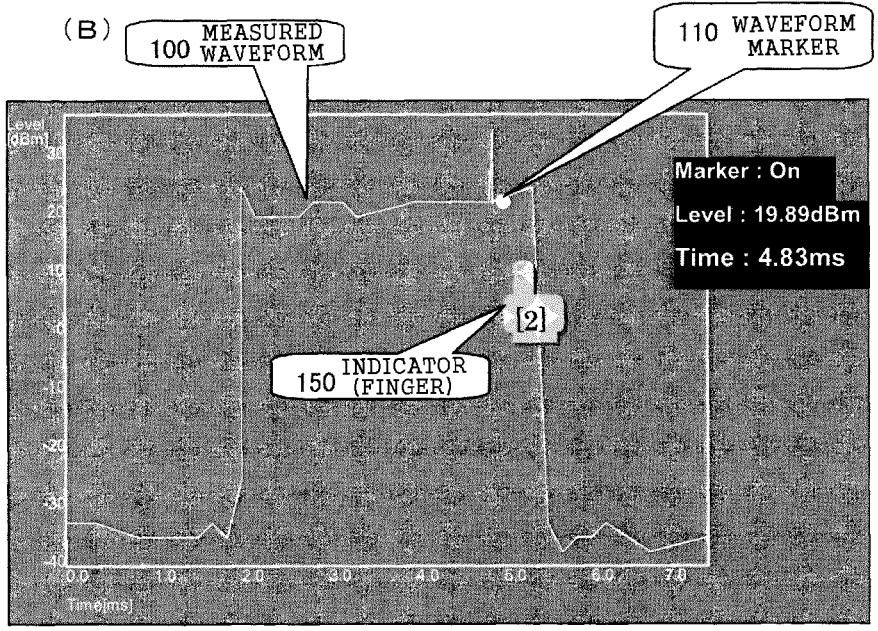
Figure 25:
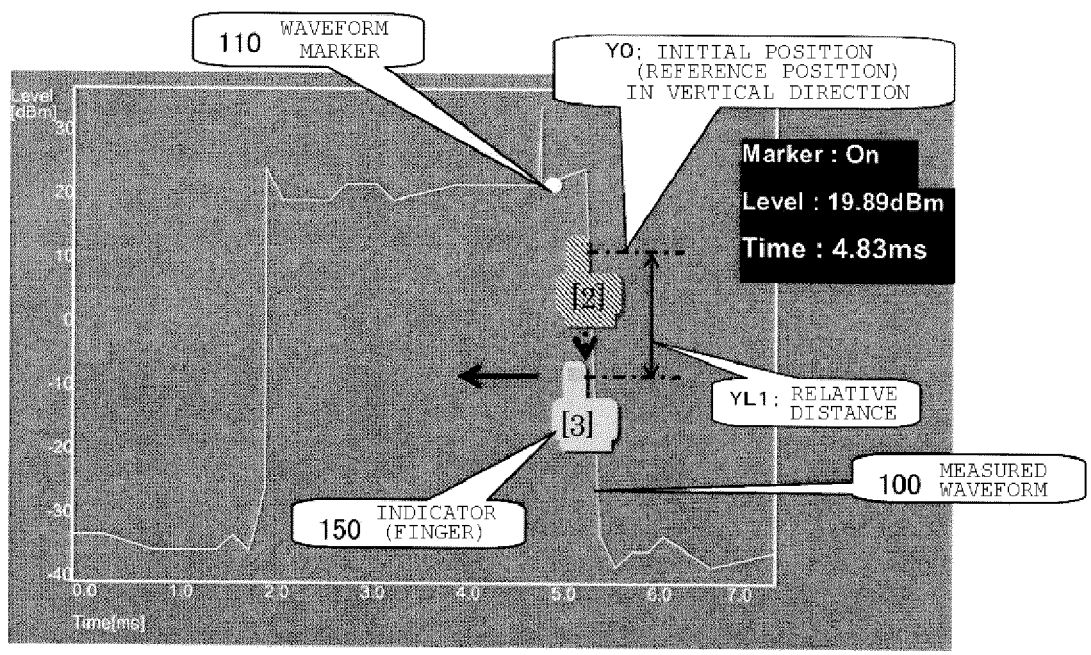
FIGS. 25A and 25B show the same display example as in FIGS. 24A and 24B, and are views for explaining the movement and operation of a waveform marker in the seventh embodiment.
Figure 25:
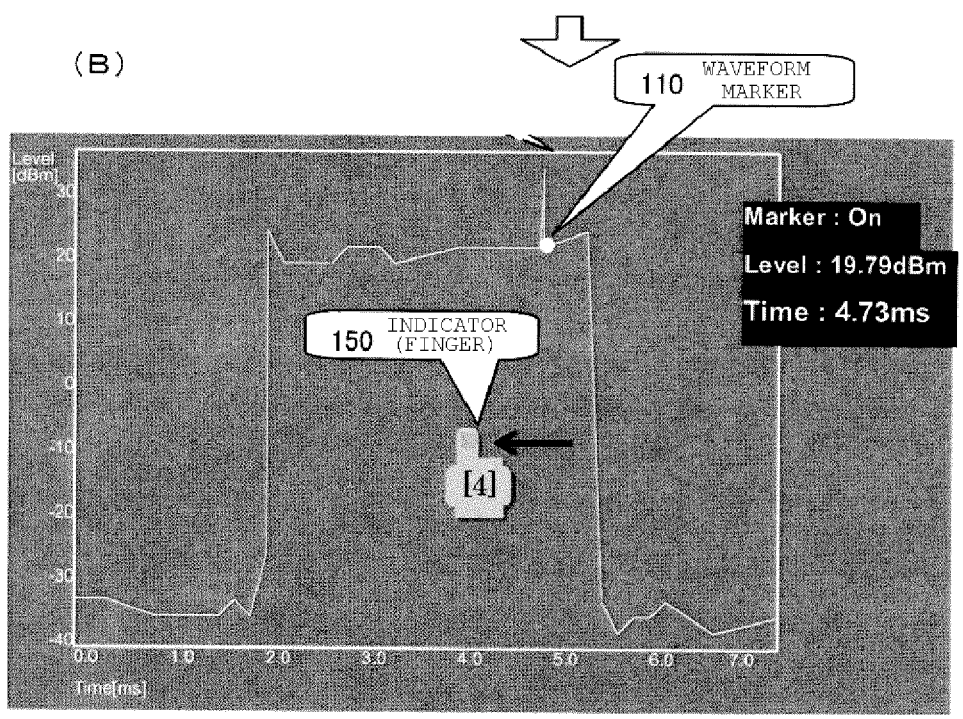
Figure 26:
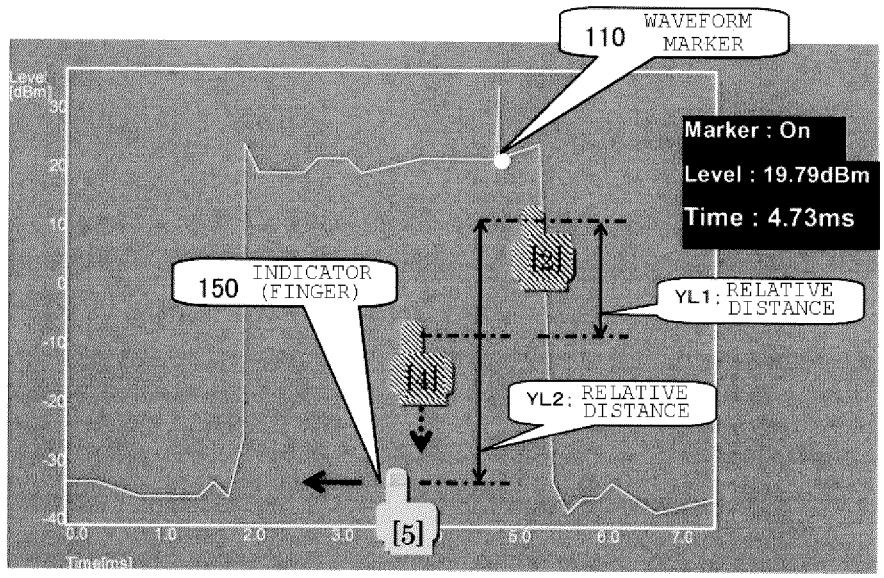
FIGS. 26A and 26B show the same display example as in FIGS. 24A and 24B, and are views for explaining the movement and operation of a waveform marker in the seventh embodiment.
Figure 26:
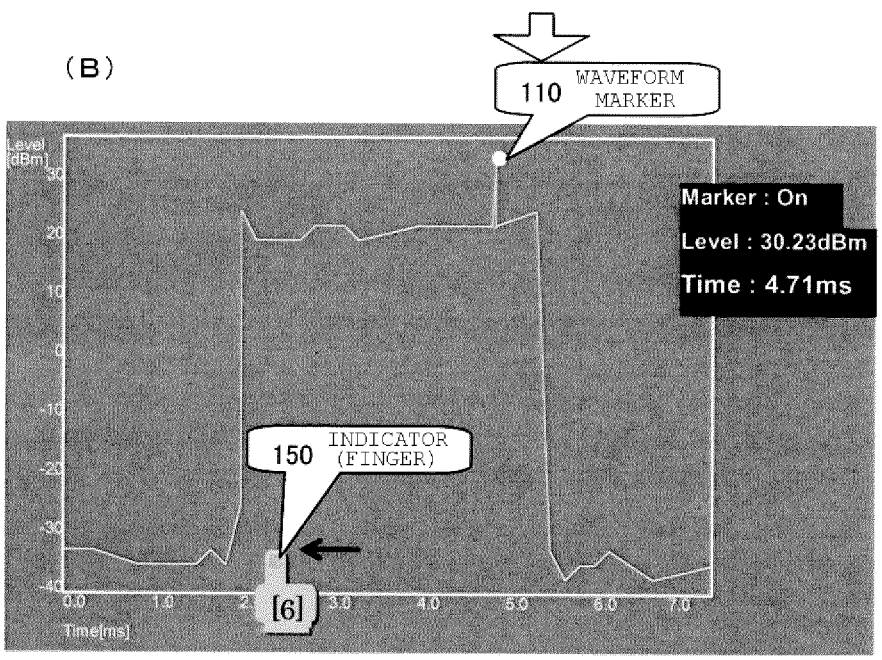

A marker generating section 221b generates a waveform marker 110 in a form shown in FIG. 24A, and determines the horizontal axis position X1 on the basis of the information acquired from an instructed amount detecting section 222 and a relative distance detecting section 223 which will be described later. In addition, the marker generating section 221b reads the amplitude Y1 of a waveform, which is located in the address corresponding to the determined horizontal axis position, from the measured data storage section 221a, and displays the waveform marker 110 on the measured waveform at the coordinates of horizontal axis-vertical axis displayed on the display section 211, that is, at the coordinates (X1,Y1). FIG. 24A shows the display example. In addition, in the initial state where there is no information from the instructed amount detecting section 222, the marker generating section 221b gives a specific initial position on the horizontal axis. Movement instruction of the waveform marker 110 is performed by the indicator 150. In this example, the waveform marker 110 moves so as to follow the movement of the indicator 150 in a direction parallel to the horizontal axis. In addition, the distance (speed) by which the waveform marker 110 moves following the movement of the indicator 150 changes with the movement distance (relative distance) of the indicator 150 in the vertical axis direction. Details will be described below.

The instructed amount detecting section 222 detects the operation amount (which is also the movement amount of the indicator) when the indicator 150 is operated in a direction parallel to the horizontal axis on the screen (display region where the measured waveform 100 is displayed, that is, a region where the coordinates expressed by horizontal axis-vertical axis are displayed; the same meaning hereinbelow) of the display section 211, as shown in FIG. 24A. For example, when an operator touches a touch panel of the screen with a finger and moves the touch position in the horizontal axis direction, the instructed amount detecting section 222 detects the movement amount (operation amount; hereinafter, when simply called a "movement amount", it means a movement distance in the horizontal axis direction) of the finger (indicator) and the movement direction. Or when the operator touches the touch panel of the display section 211 with a pen or the like and moves the touch position, the instructed amount detecting section 222 detects the movement distance and the movement direction of the pen or the like. This detection is performed in a fast processing cycle compared with the movement time of the indicator 150. In addition, in the seventh embodiment, a finger, a pen, and the like will be described as the indicator 150.

A specified information storage section 224 specifies the size of the movement variation of the waveform marker 110 (hereinafter, referred to as a "movement amount"), which actually moves the waveform marker 110, with respect to the size of the movement amount of the indicator 150 by dividing the size of the movement amount into a plurality of steps n so as to correspond to a distance (corresponding to a "relative distance" which will be described later) in the vertical direction of the screen of the display section 211 and stores the specified information. For example, waveform marker movement amount=k×(indicator movement amount)/N (where k is a proportionality constant and N is a natural number), and the natural number N is divided into a plurality of steps n. The specified information storage section 224 also divides the relative distance into n steps and stores the value of N in the "movement amount ratio H(N)=(waveform marker movement amount)/(indicator movement amount)=k/N" as the specified information. Hereinafter, the case of k=1 will be described. For example, the value is stored like H=1 in the first step, H=1/2 in the second step, H=1/3 in the third step, . . . (in this example, n=N, but is not limited thereto).

Figure 27:
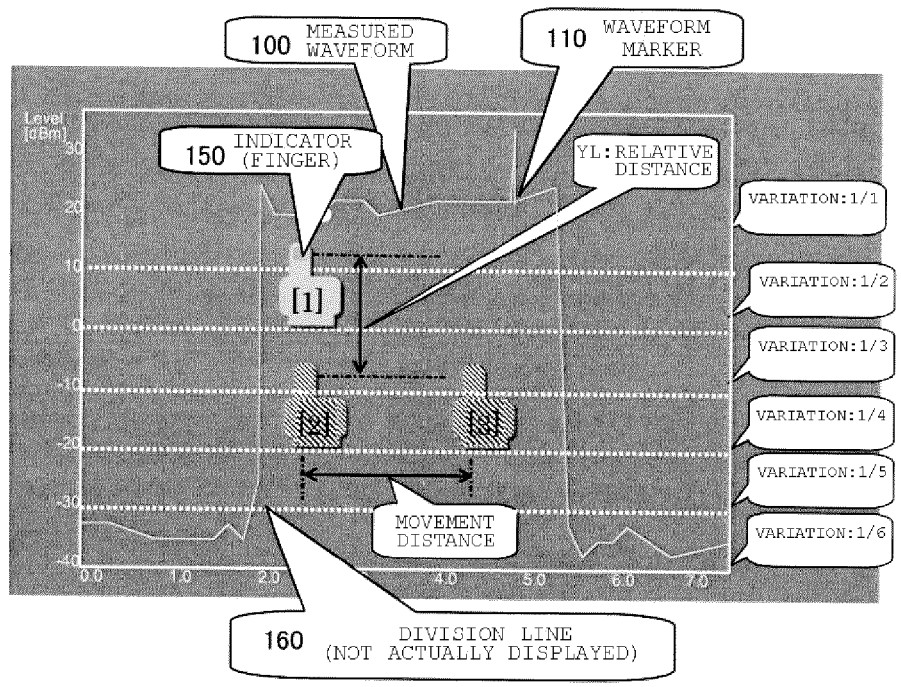
FIG. 27 is a view for explaining the movement and operation of a waveform marker in the seventh embodiment and is a view for explaining the operation difference caused by the difference of the initial position of an indicator.
Figure 28:
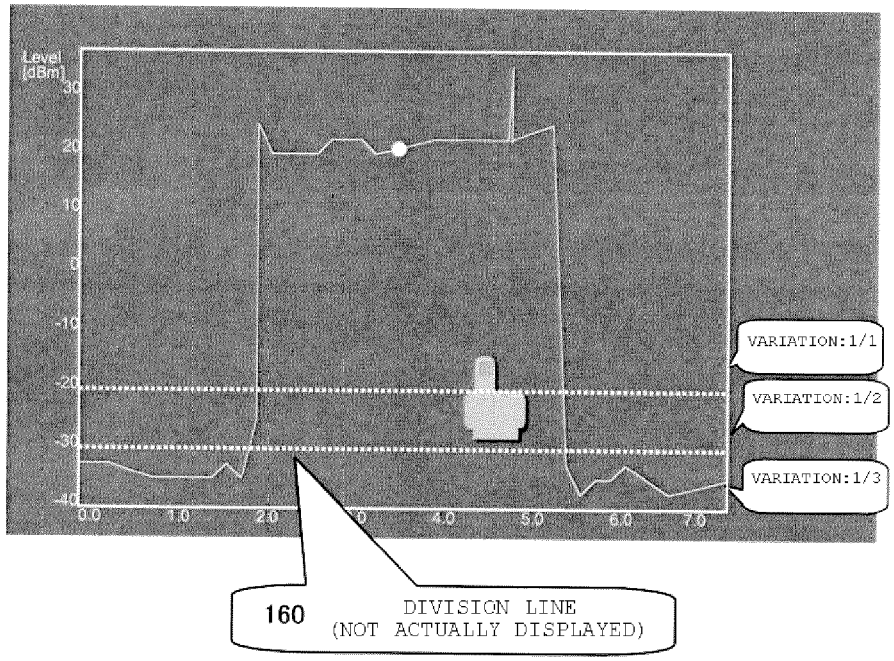
FIG. 28 is a view for explaining the movement and operation of a waveform marker in the seventh embodiment and is a view for explaining the operation difference caused by the difference of the initial position of an indicator.

The relative distance detecting section 223 detects the initial position of the indicator 150 in the vertical axis direction on the screen of the display section 211 and then detects in which step of the plurality of steps in the vertical axis direction it is located. In detection of the initial position, the relative distance detecting section 223 detects whether or not the indicator 150 has been placed first and detects as a reference position the position in the vertical axis direction when placed first. Then, one of the plurality of steps n is assigned to the reference position. For example, the first step (variation H=1) is assigned to the reference position. Examples of the situation are shown in FIGS. 27 and 28. In FIG. 27, when it is detected that the reference position (initial position; a position of [1] in FIG. 27) of the indicator 150 is an upper position on a screen, the relative distance detecting section 223 sets the reference position as the first step (variation H=1) and specifies the variation H by assigning the variation H until the second step (H=1/2), third step (H=1/3), . . . , sixth step as the position lowers from the first step. In FIG. 28, since the reference position of the indicator 150 is low, the variation H is specified from the reference position to the lower third step. In addition, although the steps are displayed in a state of being divided by a division line 160 in FIGS. 27 and 28, the division line 160 is not displayed practically (may be displayed). Regarding the detection on whether or not the indicator 150 has been placed first, for example, a switch which turns the waveform marker 110 on and off is provided and the relative distance detecting section 223 can recognize that the indicator 150, which is first disposed after the switch is turned on, is the first indicator 150. In addition, regarding the recognition of division of each step when the indicator 150 moves in the vertical axis direction, for example, if continuous movement in the vertical axis direction is set as a k-th step, continuous movement in the vertical axis direction after continuous movement in the horizontal axis direction may be recognized as movement of a (k+1)-th step. Or if continuous movement in the vertical axis direction is set as a k-th step, continuous movement in the vertical axis direction after a predetermined time elapses or a predetermined time stops (for example, after 0.2 second) may be recognized as movement of a (k+1)-th step.

After assigning one of the plurality of steps n to the reference position, the relative distance detecting section 223 detects how far the indicator 150 has moved in the vertical axis direction from the reference position. That is, the relative distance detecting section 223 detects the relative distance.

Then, the relative distance detecting section 223 detects to which of the plurality of steps n the relative distance is equivalent, reads the variation H corresponding to the step from the specified information storage section 224, and transmits it to the marker generating section 221b. For example, since the step n of the relative distance YL when the indicator 150 shown in FIG. 27 has dropped from the position [1] to the position [2] in FIG. 27 is a third step, "H=1/3" is read from the specified information storage section 224 as the variation H in the step (n=3) and is then transmitted to the marker generating section 221b. In addition, although the variation in the decreasing direction is assigned only in the downward direction from the initial position of the indicator 150 in the examples shown in FIGS. 27 and 28, an increase in the upward direction from the initial position may be set together. However, generally, it is sufficient only to specify the decreasing direction in order to match the waveform marker 110 to the target point. In addition, although the variation may be set to decrease according to the relative distance in the upward direction, a feeling of discomfort in the operation will be small in the case where a decrease in the variation H becomes large as the position of the indicator 150 lowers.

Now, the marker generating section 221b will be described again. The marker generating section 221b stores the current horizontal axis position of the waveform marker 110. Then, when the indicator 150 has moved in the horizontal axis direction with the relative distance (position on the vertical axis) not changed (for example, step of n=3) (see the movement of positions [1], [2], and [3] of the indicator 150 in FIG. 27), the marker generating section 221b receives the movement amount and the movement direction of the indicator 150 from the instructed amount detecting section 222 and calculates the waveform marker movement amount from the variation H determined by the movement amount and the relative distance. That is, the horizontal axis position of the waveform marker 110 is determined as the waveform marker movement amount=H (for example, 1/3 when n is set to 3)×(movement amount of the indicator 150). Then, the waveform marker 110 is displayed at the horizontal axis position, to which the current waveform marker position has moved in the movement direction of the indicator 150 by the calculated waveform marker movement amount, and at the vertical axis position shown as the waveform size of the horizontal axis position stored in the measured data storage section 221a.

The above-described series of operations "movement of the indicator 150 in the vertical axis direction→detection of the relative distance→determination of the variation and movement of the indicator 150 in the horizontal axis direction→detection of the movement amount of the indicator 150 using the instructed amount detecting section 222→determination of the position of the waveform marker 110 and display of the waveform marker 110 using the marker generating section 221b" are performed in the fast processing cycle during the movement of the indicator 150, such that the position of the waveform marker 110 is updated in a sequential manner. Accordingly, in the movement of the indicator 150 and the movement of the waveform marker 110, the movement amounts (distances) are different but the time difference therebetween is small. As a result, it is possible to move the waveform marker 110 comfortably by operation.

Therefore, from a different point of view, since the movement amount (distance) of the indicator 150 is large and the movement amount (distance) of the waveform marker 110 is small during the same time, it can be said that the plurality of steps divides the moving speed of the waveform marker 110 into a plurality of steps and the relative distance detecting section 223 and the marker generating section 221b determine the moving speed of the waveform marker 110. That is, if each movement amount (distance) is expressed as a speed (Vm, Vs), the waveform marker movement amount=Vm·t and the indicator movement amount=Vs·t. Accordingly, the variation H(N) is expressed as H(N)=(waveform marker movement amount)/(indicator movement amount)=Vm·t/Vs·t=Vm/Vs=k/N. For this reason, the "movement amount" in the appended claims is an expression including both the speed concept and the distance concept. In each embodiment, however, the movement amount as a distance will be described.

Figure 30:
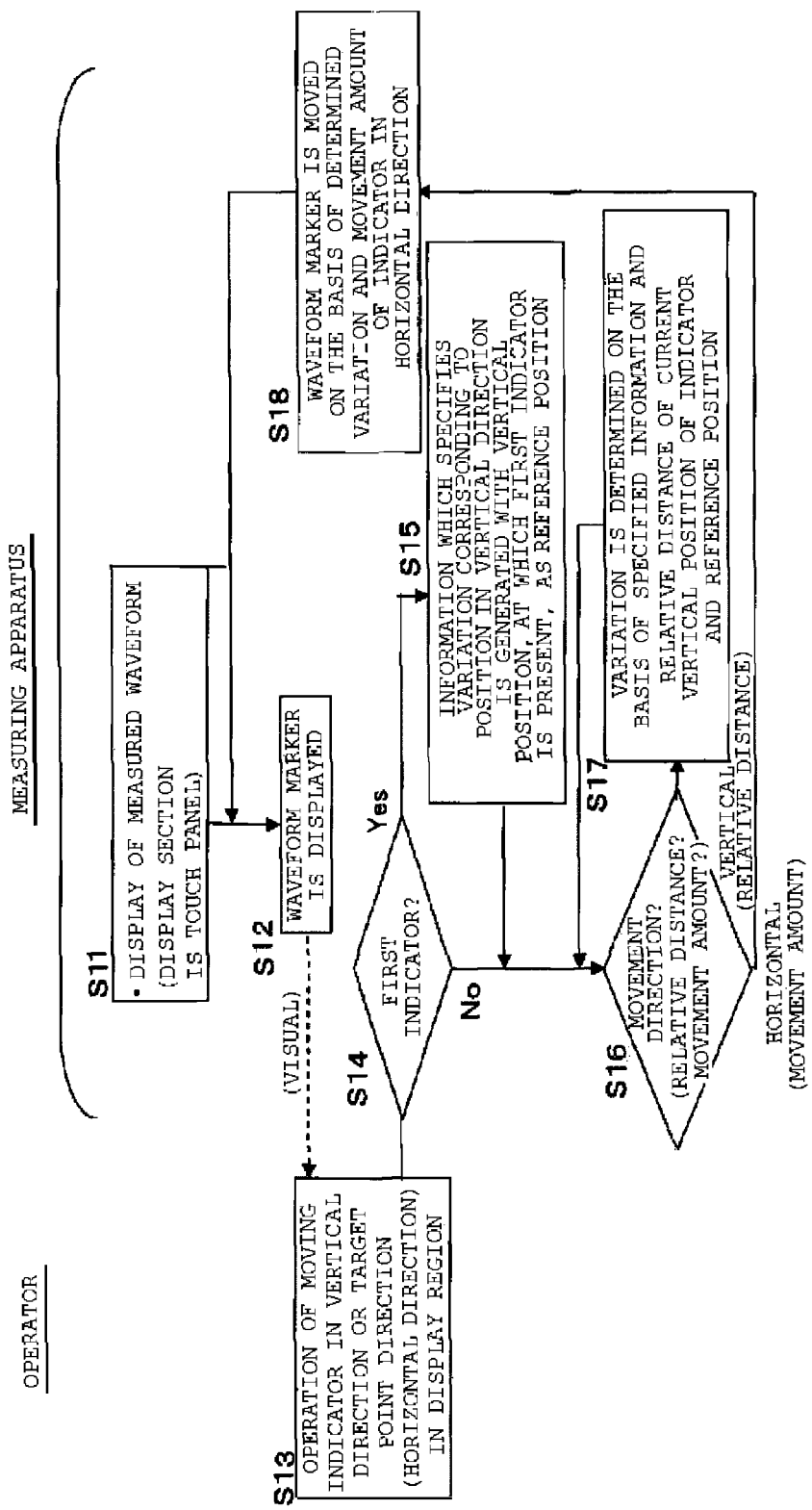
FIG. 30 is a view showing the operation flow in the seventh embodiment.

A series of actual operations and actual movement of the waveform marker 110 in the seventh embodiment will be described in order of steps in FIG. 30 with reference to FIGS. 24A to 26B and 30.

In step S11, the measured waveform 100 measured by the measuring section 230 is generated and displayed on the display section 211 with a touch panel structure and the specified information storage section 224 stores, for example, the six-step variation H beforehand corresponding to the step n=1, 2, 3, 4, 5 and 6 when the relative distance is divided. For example, the specified information storage section 224 stores the variation H=1, 1/2, 1/3, 1/4, 1/5, and 1/6.

In step S12; the marker generating section 221b generates the waveform marker 110 in a state where a marker switch for setting the waveform marker 110 is set to ON (Marker on) and displays the waveform marker 110 at the initial position set beforehand.

The data display control section 221 reads the value (for example, a time or a frequency) of the measured waveform 100 in the horizontal axis and the value (for example, the waveform amplitude at the time or the waveform amplitude at the frequency) of the measured waveform 100 in the vertical axis, which correspond to the position of the waveform marker 110, using the marker generating section 221b and displays the values. Refer to the measured value 140 in FIG. 24A. Hereinafter, whenever the position of the waveform marker 110 is updated, the measured value 140 is also updated.

In step S13, the operator places the indicator (finger) 150 at the position [1] of an upper part of the screen as shown in FIG. 24A and moves it in the horizontal direction.

In step S14, the relative distance detecting section 223 determines whether or not the indicator (finger) 150 is a first indicator which is first placed after the marker switch is turned on. In the case of the first indicator 150, an operation in step S15 is performed and then an operation in step S16 is performed. After detecting that it is the first indicator 150, the operation in step S16 is performed since the indicator 150 detected next is not the first indicator 150.

In step S15, the initial position [1] of the first indicator 150 in the vertical axis direction is stored as a reference position (see the initial position (reference position) Y0 in FIG. 25A), a step of n=1 is assigned to the position [1], and the variation H=1 is read from the specified information storage section 224 and is then transmitted to the marker generating section 221b.

In step S16, the relative distance detecting section 223 detects whether the movement of the indicator 150 is the vertical axis direction or the horizontal axis direction. When the movement of the indicator 150 is the vertical axis direction, the process proceeds to step S17. When the movement of the indicator 150 is the horizontal axis direction, the process proceeds to step S18. In FIG. 24A, since the indicator 150 moves in the horizontal axis direction, the process proceeds to step S18 and the instructed amount detecting section 222 detects the movement amount of the indicator 150.

In step S17, the relative distance detecting section 223 calculates the relative position from the reference position if the indicator 150 moves in the vertical axis direction, reads the variation of a step corresponding to the relative distance from the specified information storage section 224, and transmits it to the marker generating section 221b instead of the previous variation H=1. Then, the process returns to step S16 to wait for the next movement in the horizontal axis direction. In FIG. 24A, there is only movement in the horizontal direction. Accordingly, since step S17 is not performed, the variation H is still 1.

In step S18, the marker generating section 221b receives the movement amount of the indicator 150 in the horizontal axis direction shown in FIG. 24A from the instructed amount detecting section 222 and receives the variation H=1 at that time from the relative distance detecting section 223, calculates "waveform marker movement amount=(movement amount from the position [1] of the indicator 150 in FIG. 24A to the position [2] of the indicator 150 in FIG. 24B)×H (=1)", and moves the waveform marker 110 to the calculated horizontal axis position (see the position of the waveform marker 110 in FIG. 24B).

Steps S12, S13, S14, and S16 in the second round: FIG. 24B shows an example where the waveform marker 110 has gone too far exceeding the target point 130. Then, when the waveform marker 110 is displayed as shown in FIG. 24B (step S12 in the second round), the indicator 150 is lowered from the position [2] to the position [3] as shown in FIG. 25A (step S13 in the second round). The indicator 150 by this operation is not the first indicator 150 (step S14 in the second round—No) and is the movement in the vertical axis direction (step S16 in the second round—vertical). Accordingly, the relative distance detecting section 223 calculates the relative position YL1 of the indicator 150 from the reference position (initial position Y0) and reads the variation of a step corresponding to the relative distance YL1 from the specified information storage section 224. Assuming that the position [3] is equivalent to the third step (n=3) of the relative distance, the read variation H=1/3 is transmitted to the marker generating section 221b instead of the previous variation H=1. Then, the process returns to step S16 to wait for movement in the horizontal axis direction (step S17 in the second round).

Steps S13, S14, S16, and S18 in the third round: Next, when the indicator 150 is moved from the position [3] in FIG. 25A to the position [4] in FIG. 25B in order to bring the waveform marker 110 closer to the target point 130 by operation (step S13 in the third round), the instructed amount detecting section 222 detects the movement amount of the indicator 150 in the horizontal axis direction since this is not the first indicator 150 (step S14 in the third round—No) and is the movement in the vertical axis direction (step S16 in the third round—horizontal). Then, the marker generating section 221b receives the movement amount in the horizontal axis direction from the instructed amount detecting section 222 and receives the variation H=1/3 at that time from the relative distance detecting section 223, calculates "waveform marker movement amount=(movement amount from the position [3] of the indicator 150 to the position [4] of the indicator 150)×H (=1/3)", and moves the waveform marker 110 to the calculated horizontal axis position (see the position of the waveform marker 110 in FIG. 25B).

Steps S12 to S18 in subsequent rounds: Then, when the indicator 150 is moved from the position [4] in FIG. 26A to the position [5] and further moved to the position [6] in FIG. 26B, the above-described steps in the second and third rounds are repeated. In this case, if the relative distance YL2 at the position [5] in FIG. 26A is a fifth step (n=5), the waveform marker movement amount of the waveform marker 110= (movement amount from the position [5] to the position [6])× variation H (=1/5). Thus, since the movement amount of the waveform marker with respect to the operation amount of the indicator 150 can be sequentially changed to 1/1, 1/3, and 1/5, the waveform marker 110 can be easily matched to the target point 130 (see FIG. 26B). Then, the measured value 140, such as a level or time, at the position of the waveform marker 110 is read. As described above, since gear change is possible by changing the operation direction of the indicator 150 in one direction, the operation becomes very easy.

The operation in each step described above is performed in a predetermined fast processing cycle during the movement of the indicator 150 by step S13. Accordingly, the movement of the indicator 150 and the movement of the waveform marker 110 can be visualized so as to correspond to each other immediately.

If the above operation is summarized, for example, as a result of having moved the indicator 150 in FIG. 24A, the waveform marker 110 is moved at the speed (movement amount) of 1/1 with respect to the movement amount of the indicator 150. As a result, the waveform marker 110 is displayed at the position having passed the target point as shown in FIG. 24B. Then, the operator lowers the indicator 150 to place it at the third step from the reference point as shown in FIG. 25A and moves the indicator 150 toward the target point. In this case, the waveform marker 110 moves, as shown in FIG. 25B, at the speed (movement amount) of 1/3 of the movement amount of the indicator. Accordingly, the adjustment becomes easier than in the case of the moving speed (movement amount) of 1/1. In addition, when the operator wants to perform fine adjustment, the operator can match the waveform marker 110 to the target point 130 as shown in FIG. 26B at the speed of 1/5 of the movement amount of the indicator 150 by moving the indicator 150 in a state where the indicator 150 is positioned at the fifth step as shown in FIG. 26A.

Eighth Embodiment

Figure 23:
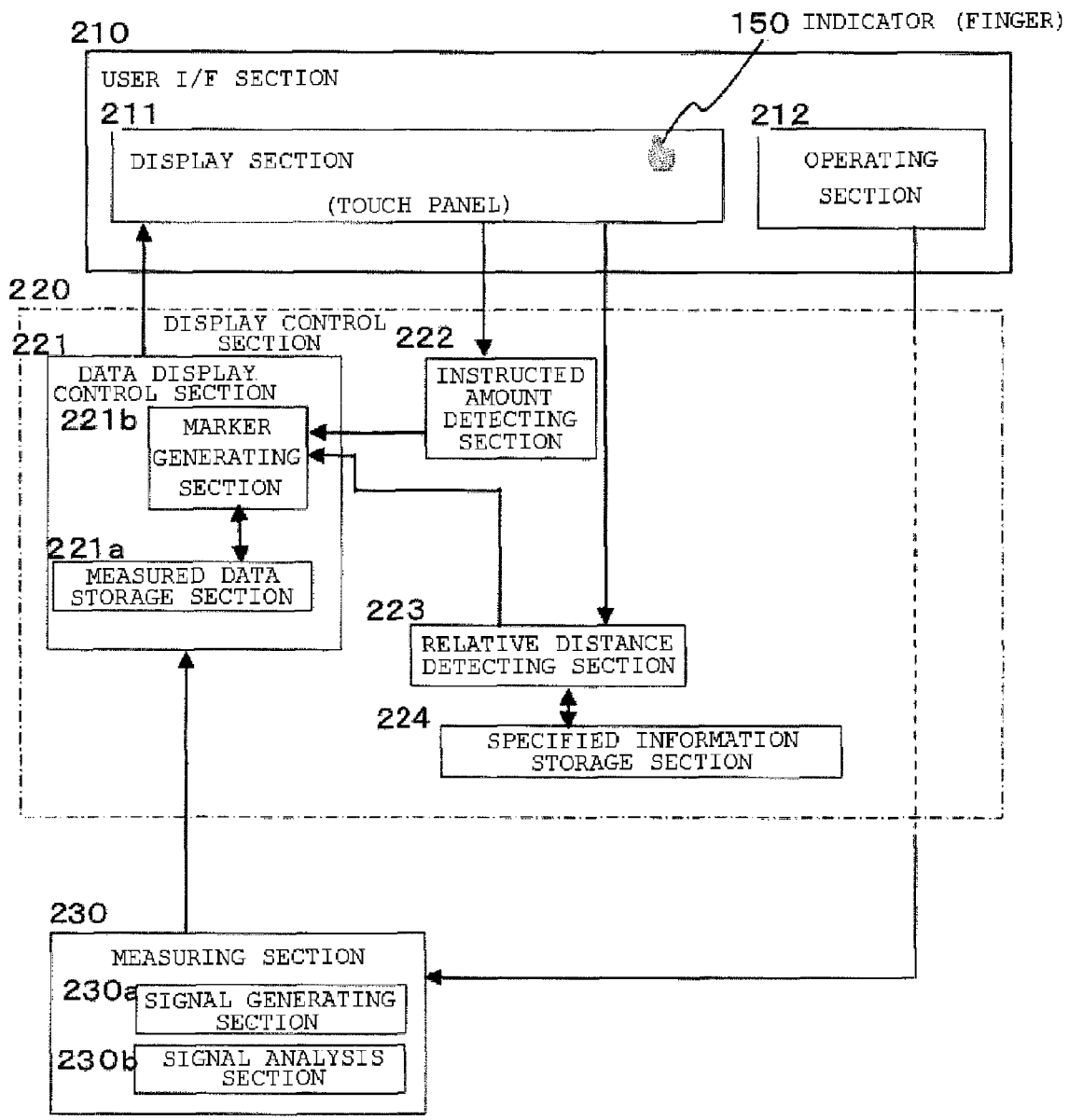
FIG. 23 is a view showing the function and configuration of a seventh embodiment.
Figure 31:
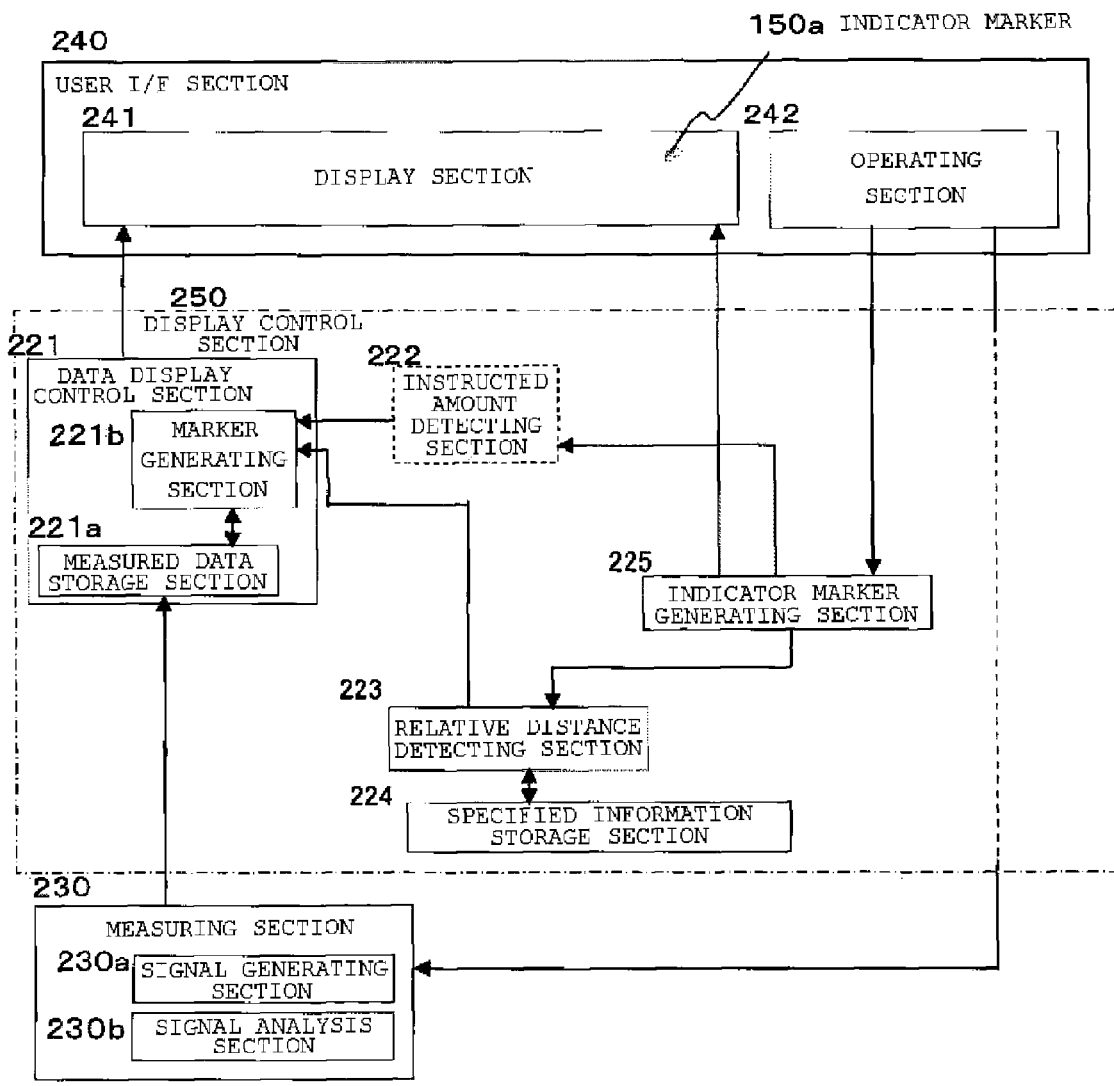
FIG. 31 is a view showing the function and configuration of an eighth embodiment.

While a touch panel is used in the seventh embodiment shown in FIG. 23, the eighth embodiment based on the configuration shown in FIG. 31 is the case where a normal display device having no sensor function on a screen is used. In the case of a touch panel, the touch panel itself can sense an operation using an operator's finger or a pen and details of the operation can be visually recognized. In the eighth embodiment, however, an indicator marker 150a which can be visually recognized on the screen is displayed instead of the operator's finger or the pen and the indicator marker 150a can be moved by an operation from an operating section 242, so that the same function and effects as in the seventh embodiment can be acquired.

Hereinafter, an explanation focused on a different point from the seventh embodiment will be given with reference to FIG. 31. In FIG. 31, the configuration of the same reference numeral as in FIG. 23 has the same function.

A user I/F section 240 and a display control section 250 shown in FIG. 31 correspond to the user I/F section 210 and the display control section 220 shown in FIG. 23, respectively, but are partially different.

In the embodiment shown in FIG. 31, a display section 241 of the user I/F section 240 displays the indicator marker 150a instead of the indicator 150 of the display section 211 shown in FIG. 23. A mouse or the like in the operating section 242 operated by the operator moves the indicator marker 150a. An indicator marker generating section 225 of the display control section 250 generates the indicator marker 150*a*, receives the movement of a mouse or the like in the operating section 242 as an operation amount coded by an encoder, and moves the indicator marker 150*a* according to the operation amount (see a flight mark in FIG. 32).

The instructed amount detecting section 222 shown in FIG. 31 detects the operation amount of the mouse or the like of the operating section 242 by receiving the movement amount in the horizontal axis direction of the screen from the indicator marker generating section 225. When the amount by which the indicator marker generating section 225 moves the indicator marker 150*a* in the horizontal axis direction on the screen becomes the movement amount of the indicator marker 150*a* as it is, the instructed amount detecting section 222 is not necessarily needed (this is the reason why the instructed amount detecting section 222 shown in FIG. 31 is surrounded by a dotted frame). Moreover, the relative distance detecting section 223 of the display control section 250 shown in FIG. 31 detects the relative distance (step) by receiving the position information of the indicator marker 150*a* which has been moved in the vertical axis direction of the screen by the operation amount of a moving operation of a mouse or the like by the indicator marker generating section 225, specifies the variation H corresponding to the detected relative distance (step) from the specified information storage section 224, and transmits it to the marker generating section 221*b*.

Other configurations are the same as those in the seventh embodiment. Since the configurations and operations are the same if the indicator 150 in the explanation of the seventh embodiment is replaced with the indicator marker 150*a*, the other explanations will be omitted.

Figure 32:
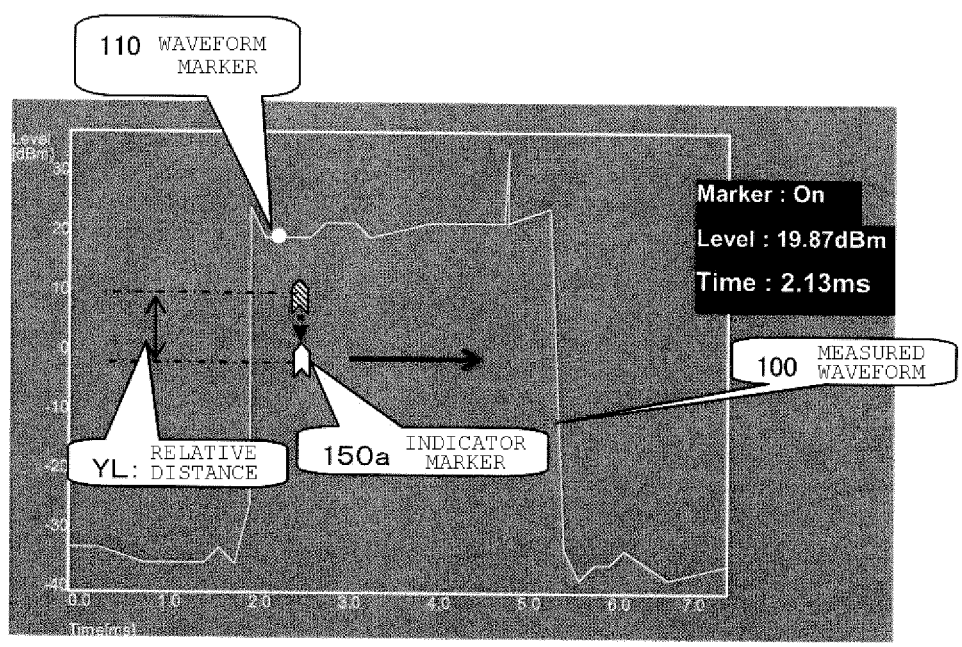
FIG. 32 is a view showing a display pattern for operating a waveform marker in the eighth embodiment.

Corresponding to FIG. 24A which is a display example of the seventh embodiment, a display example of the eighth embodiment is shown in FIG. 32. In FIG. 32, only the indicator 150 is replaced with the indicator marker 150*a*.

Figure 33:
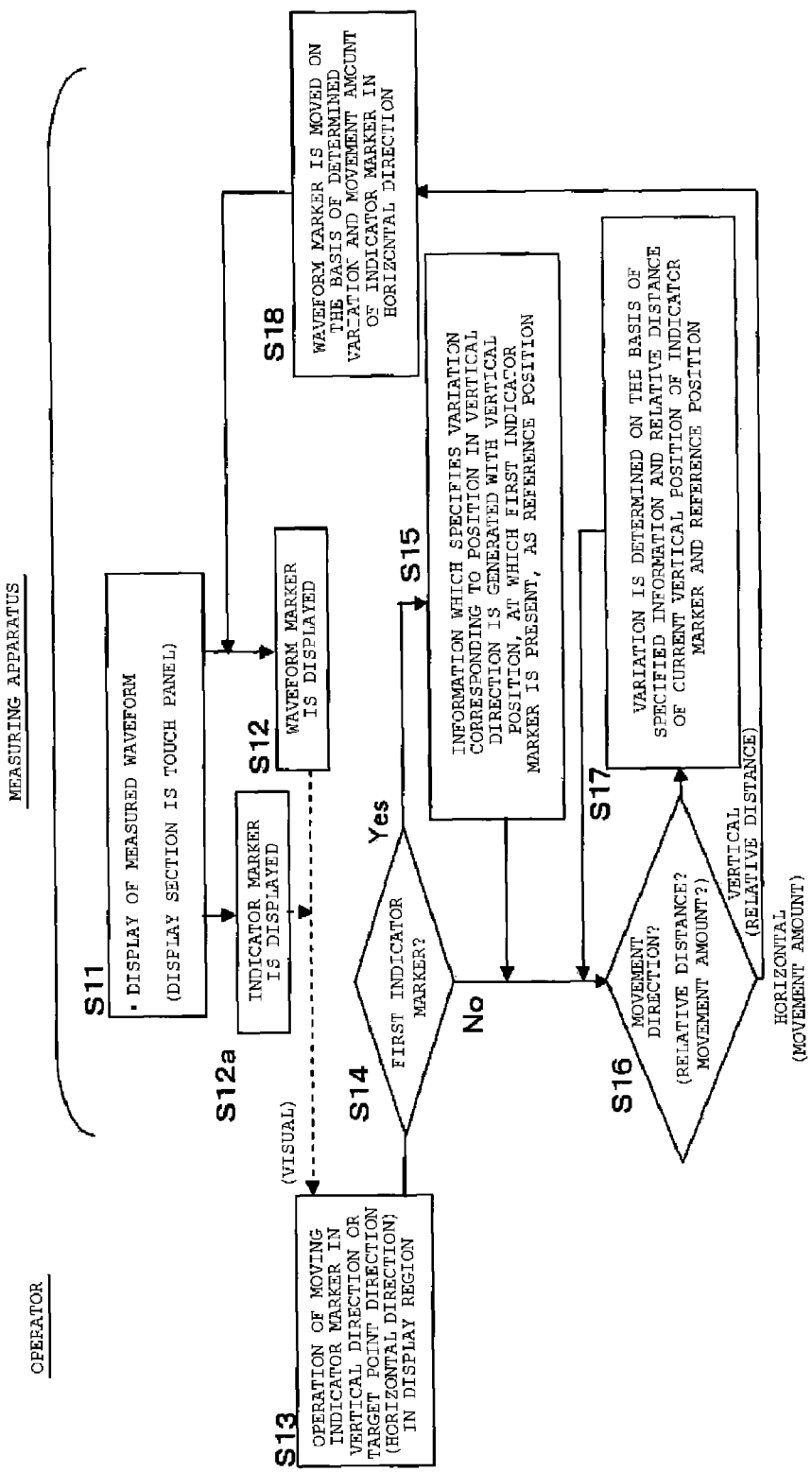
FIG. 33 is a view showing the operation flow in the eighth embodiment.

In addition, the flow showing a series of operations in the eighth embodiment is shown in FIG. 33. FIG. 33 is different from FIG. 30 in that the "indicator" in FIG. 30 is written as an "indicator marker" and the indicator marker 150*a* is displayed and moved in step S12*a*. Since operations in other steps shown in FIG. 33 are the same as those in FIG. 30, the explanation will be omitted.

First Modification

Figure 29:
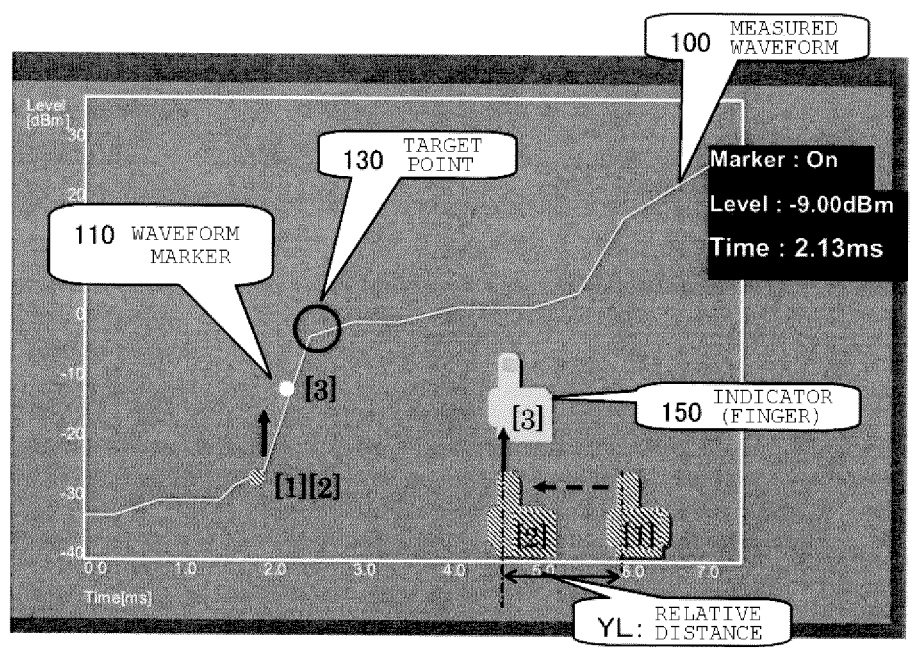
FIG. 29 is a view for explaining the movement and operation of a waveform marker in the seventh embodiment, which is another display example.

In the above case, the configuration was adopted in which the relative distance was set in a direction parallel to the vertical axis of coordinates of the screen of the display section 211, the variation H was set according to the relative distance of the indicator (marker) from the reference position, and the waveform marker 110 was moved by the amount obtained by specifying the movement amount of the indicator (marker) in the horizontal axis direction as the variation H. However, as a modification, the relationship between the vertical and horizontal axes may be set opposite each other. That is, as shown in FIG. 29, it is also possible to adopt a configuration in which the relative distance YL from the reference point is set in a direction parallel to the horizontal axis of a screen and the waveform marker 110 is moved by the amount obtained by specifying the movement amount in the vertical axis direction as the variation H corresponding to the relative distance. This may be applied to both the seventh and eighth embodiments.

Second Modification

In the seventh embodiment, the position of the indicator 150 which was first placed after the marker switch was turned on was set as the reference position. However, when the display section 211 is a touch panel, the position of the indicator 150 which touches the touch panel again after the indicator 150 becomes far away from the touch panel may also be set as the reference position. That is, it is also possible to adopt a configuration in which the reference position is reset and updated whenever the indicator 150 is far away from the touch panel and then touches the touch panel again. In this case, the reference position is updated whenever the relative distance detecting section 223 detects that the indicator 150 has been far away and has touched the touch panel again.

Ninth Embodiment

In the ninth embodiment, the measuring apparatus has a function of a zone marker 170 with a variable width and a function of a peak marker 180, which is displayed at a peak point of the measured waveform 100 within the zone marker 170. In this case, a direct operation object of an operator is the zone marker 170 as described above.

Figure 34:
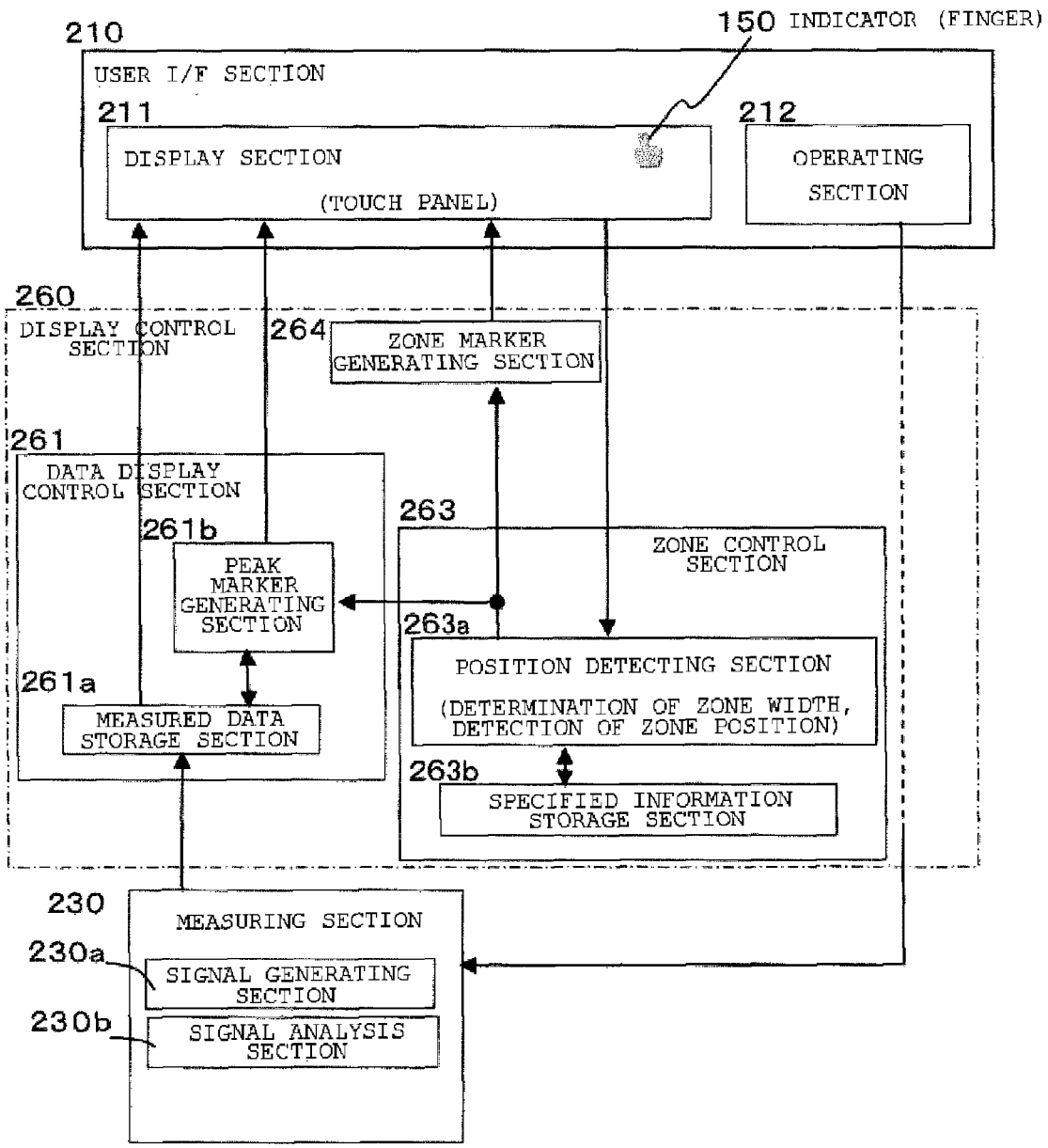
FIG. 34 is a view showing the functional configuration of a ninth embodiment.

The ninth embodiment will be described with reference to FIG. 34. In FIG. 34, main components to which the same reference numerals as in FIGS. 23 and 31 are given have the same functions.

A data display control section 261 in a display control section 260 stores the amplitude (equivalent to the position on the vertical axis) of the measured waveform 100 from the measuring section 230 in a measured data storage section 261*a* using as an address the time information in a measured time range (equivalent to the position on the horizontal axis) when measured. In addition, the waveform data stored in the measured data storage section 261*a* is displayed as the measured waveform 100 on a screen on the display section 211 together with the coordinates of horizontal axis-vertical axis (see FIG. 36). In addition, the following explanation will be given assuming that the display section 211 is formed by a touch panel. Moreover, the following explanation will be given on the assumption that a finger is used as an indicator in a marker operation (moving operation of the zone marker 170 which will be described later) like the seventh embodiment.

Figure 36:
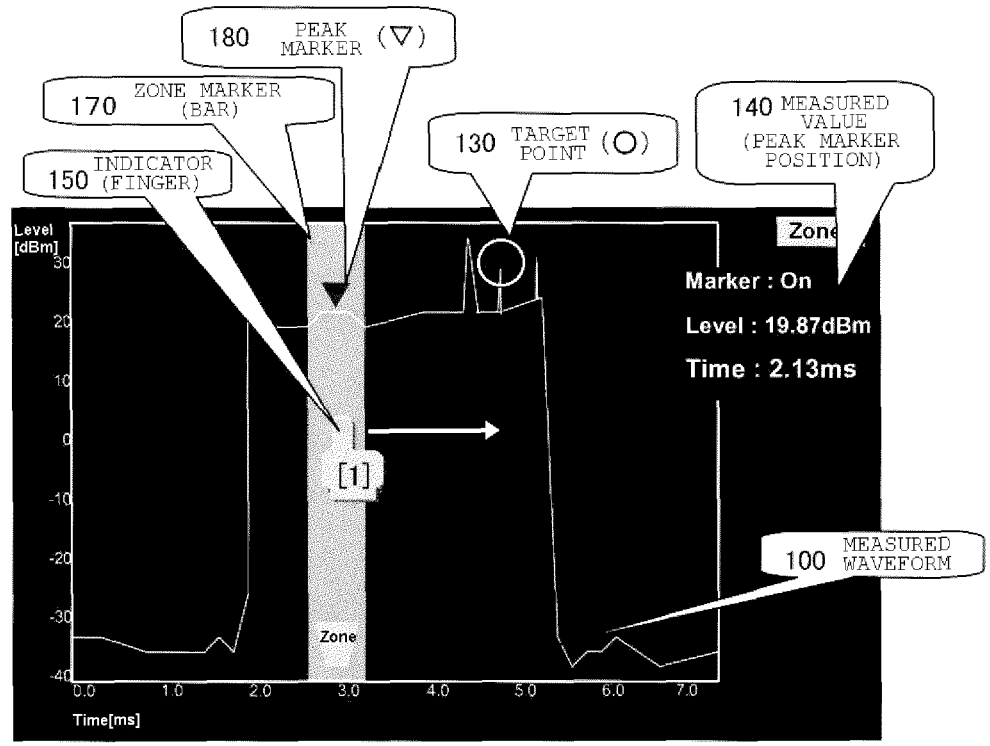
FIG. 36 is a view for explaining the movement and operation of a waveform marker in the ninth embodiment.

A zone marker generating section 264 generates the zone marker 170, which has a default position and a default width when the apparatus is switched on and then has a position (hereinafter, referred to as a "zone position") and a width (hereinafter, referred to as a "zone width") according to the instruction from a position detecting section 263*a* which will be described later, and displays the zone marker 170 on the display section 211. In this case, the zone width is changed with the designated zone position (center position of the zone) as the center. FIG. 36 shows an example of the bar-shaped zone marker 170 which has a predetermined zone width.

A peak marker generating section 261*b* receives the information of the zone position and the zone width from the position detecting section 263*a* (or from the zone marker generating section 264), calculates the time position and the time width corresponding to the zone position and the zone width, reads the measured data of the measured waveform 100 at the time position and the time width from the measured data storage section 261*a*, and calculates the peak value of the measured waveform 100 within the zone width. Then, the peak marker generating section 261*b* generates and displays the peak marker 180 at the peak position of the measured waveform 100 (see ∇ mark in FIG. 36). In addition, the data display control section 261 displays the measurement time range by assigning it in a physical full-scale range (for example, 512 dots) of the display screen of the display section 211. On the other hand, since the zone position and the zone width are physical position and range of the display screen of the display section 211, the peak marker generating section 261b receives the zone position and the zone width and converts them into the position and width of a time referring to the measurement time range stored in the measured data storage section 261a.

Before forwarding or measurement, the variation Hw (rate of change) of the zone width is divided into a plurality of steps n (corresponding to the relative distance; which will be described later) in the vertical direction of the indicator 150 and is stored beforehand in a specified information storage section 263b. For example, similar to the steps in the seventh embodiment, it is divided into six steps and values along which the zone width decreases, like the variation Hw=1/1, 1/2, 1/3, 1/4, 1/5, and 1/6, as the position of the indicator 150 lowers are stored (the steps are not limited to six steps but may be continuous. Or it may be displayed in a stepwise manner so as to be distinguishable. In addition, the extending or narrowing direction of the zone width may be opposite those described above). Moreover, although it is specified by the variation Hw which is a rate, it may also be determined as an absolute value like (physical full-scale range of the horizontal axis)/10 (for example, 50 dots) in the first step, (physical full-scale range of the horizontal axis)/20 (for example, 25 dots) in the second step, . . . , for example. Hereinafter, an explanation using the variation Hw will be given.

A position detecting section 263a of a zone control section 263 detects the position in the vertical direction and the movement amount in the zone width direction (movement amount in the horizontal axis direction; hereinafter, referred to as a "width direction movement amount") when the indicator 150 is operated in order to move the zone marker 170 on the screen (display region where the waveform data is displayed, that is, a region where the coordinates expressed by horizontal axis-vertical axis are displayed; the same meaning hereinbelow) of the display section 211 of the touch panel as shown in FIG. 36. For example, the position detecting section 263a detects the width direction movement amount and the vertical axis position of the finger (indicator) when the operator touches the touch panel of the screen with his or her finger and moves the touch position (position of the indicator 150). This detection is performed in a fast processing cycle compared with the movement time of the indicator 150. In addition, in the ninth embodiment, a finger, a pen, and the like will be described as the indicator 150.

Moreover, similar to the relative distance detecting section 223 in the seventh embodiment, in detection of the vertical axis position using the position detecting section 263a, the position detecting section 263a detects the initial position of the indicator 150 in the vertical axis direction on the screen of the display section 211 and then detects in which step of the plurality of steps it is located. That is, the following process is performed. The position detecting section 263a detects whether or not the indicator 150 has been placed first and then detects and stores as a reference position the vertical axis position when placed first. Then, one of the plurality of steps n is assigned to the reference position. For example, a first step (variation H=1) is assigned to the reference position (refer to FIGS. 27 and 28; although FIGS. 27 and 28 are views for the seventh embodiment, the method of assigning the variation is the same as that in the ninth embodiment). In the case shown in FIG. 27, the initial position (position of [1] in FIG. 27) of the indicator 150 as a reference position is set to a first step (variation Hw=1), and the variation Hw of the zone width is assigned and specified by assigning the relative distance (step n) until the second step (Hw=1/2), third step (Hw=1/3), . . . , sixth step as the position lowers from the first step. In the case shown in FIG. 28, since the reference position of the indicator 150 is low, the variation Hw is specified from the initial position to the lower third step. A method of detecting whether or not the indicator 150 has been first placed and a method of detecting the vertical axis position using the position detecting section 263a are the same as the detection of the relative distance detecting section 223 in the seventh embodiment.

After detecting the initial position, the position detecting section 263a assigns one of the plurality of steps n with the initial position as a reference position, and then the relative distance detecting section 223 detects how far the indicator 150 has moved in the vertical axis direction from the reference position. That is, the relative distance detecting section 223 detects the relative distance. Then, the relative distance detecting section 263 detects to which of the plurality of steps n the relative distance is equivalent, reads the variation (rate) Hw of movement corresponding to the step from the specified information storage section 263b, and transmits it to the zone marker generating section 264 and the peak marker generating section 261b. In this case, the position detecting section 263a also detects the width direction movement amount of the indicator 150 and transmits the width direction movement amount to the zone marker generating section 264 and the peak marker generating section 261b together with the variation Hw. For example, in the case shown in FIG. 27, since the step n of the relative distance YL when the indicator 150 has dropped from the position [1] to the position [2] in FIG. 27 is a third step, "Hw=1/3" is read from the specified information storage section 263b as the variation Hw in the step (n=3) and this is transmitted to the zone marker generating section 264 and the peak marker generating section 261b. Then, the position detecting section 263a also detects the width direction movement amount of the indicator 150 in the horizontal axis direction and transmits the width direction movement amount to the zone marker generating section 264 and the peak marker generating section 261b together with the variation Hw.

In this way, the zone marker generating section 264 generates the zone marker 170 with a zone width, which is obtained by multiplying the default zone width by the variation Hw instructed from the position detecting section 263a as described above, and disposes the zone marker 170 at the zone position, which corresponds to the width direction movement amount instructed from the position detecting section 263a, on the display section 211. On the other hand, the peak marker generating section 261b reads the waveform data of the measured waveform 100 within the time width equivalent to the zone width, which is obtained by multiplying the default zone width by the instructed variation Hw, from the measured data storage section 261a with the time position (horizontal axis position), which is determined at the zone position corresponding to the width direction movement amount instructed from the position detecting section 263a, as the center, calculates the waveform position indicating the maximum value from the read waveform data, and attaches the peak marker 180 to the waveform position and displays it.

In addition, until the zone marker 170 and the peak marker 180 are displayed at the changed positions after an instruction of change using the indicator 150, the process is performed at high speed. Accordingly, the operator can see the result without a feeling of discomfort (smoothly) after changing the zone width and the zone position of the zone marker 170.

Next, a series of operations including usage will be described while referring to the display examples shown in FIGS. 36 to 39 (partially overlap those described above).

In FIG. 36, the horizontal axis indicates a measurement time and the vertical axis indicates the amplitude of the measured waveform 100. Here, an operation of setting from the position of the zone marker 170 in FIG. 36 up to the target point 130 (0 mark) to be measured is performed will be described. FIG. 36 shows a state where the zone marker generating section 264 displays the zone marker 170 having a predetermined zone width at a predetermined zone position as a default, and the peak marker generating section 261b searches the peak position of the data of the measured waveform 100 within the zone position and the zone width and displays the peak marker 180 at the position.

In FIG. 36, an operator places the indicator 150 (finger) on the display screen (position [1] in FIG. 36) and moves it toward the target point 130. The position detecting section 263a detects the vertical axis position of the placed indicator 150 and stores the position as a reference position (first step), and also detects the width direction movement amount of the indicator 150 in the horizontal axis direction. Then, the position detecting section 263a reads the variation Hw=1/1 of the first step from the specified information storage section 263b and transmits it to the zone marker generating section 264 and the peak marker generating section 261b. Since the variation Hw is 1/1, the zone marker generating section 264 maintains the default zone width as the width of the zone marker 170. Then, when the indicator 150 has moved in the horizontal axis direction, the zone marker generating section 264 moves the zone marker 170 to the zone position (position [2] in FIG. 37) corresponding to the width direction movement amount detected by the position detecting section 263a. The peak marker generating section 261b reads the waveform data of the measured waveform 100 within the time width, which is equivalent to the default zone width at the zone position (position [2] in FIG. 37) to move, from the measured data storage section 261a, calculates the waveform position indicating the maximum value from the read waveform data, and attaches the peak marker 180 to the position and displays it (V mark in FIG. 37).

Figure 37:
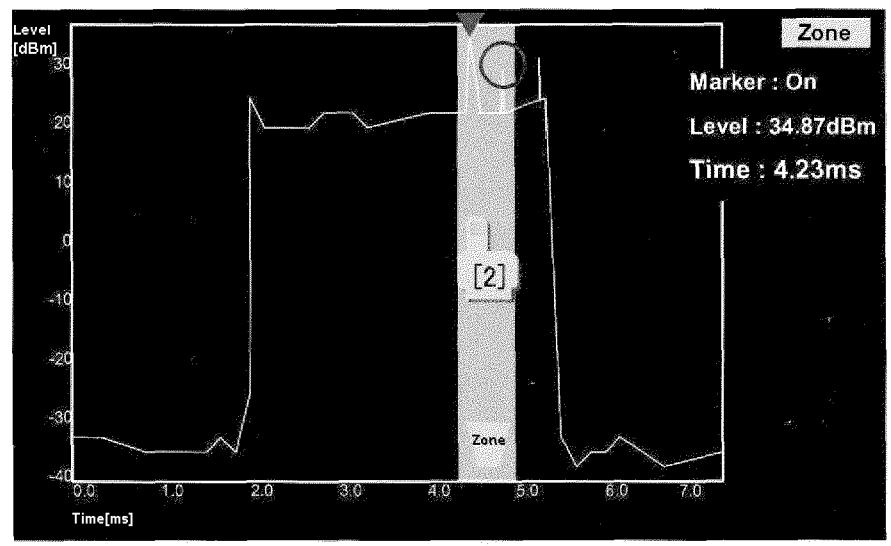
FIG. 37 is a view for explaining the movement and operation of a waveform marker in the ninth embodiment.
Figure 38:
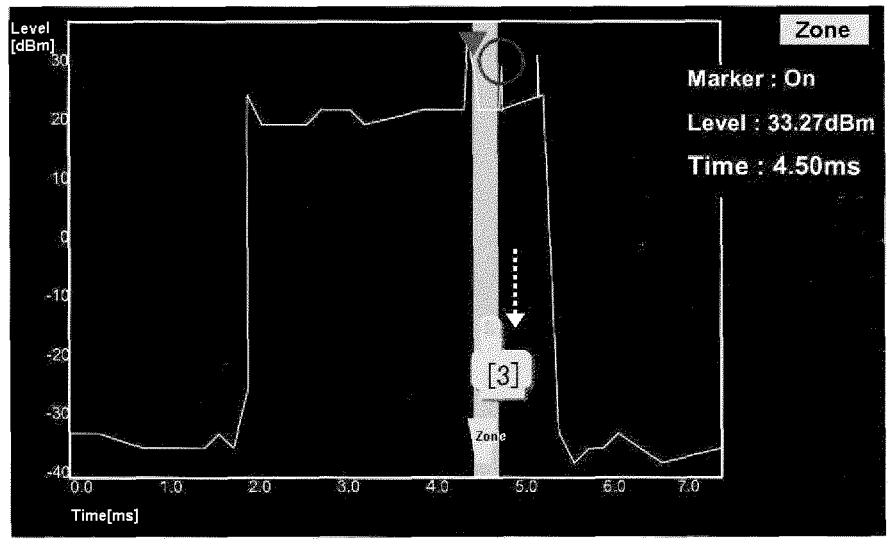
FIG. 38 is a view for explaining the movement and operation of a waveform marker in the ninth embodiment.

In FIG. 37, since the peak marker 180 is at the peak position near the target point and has not reached the target point 130 yet, it is necessary to further narrow the zone width. Therefore, the operator lowers the indicator 150 in FIG. 37 from the position [2] to the position [3] in FIG. 38. That is, the operator lowers the indicator 150 to the second step (relative distance) in the vertical axis direction. Then, by detecting the vertical axis position of the indicator 150, the position detecting section 263a detects that the indicator 150 exists at the position (relative distance) of the second step from the reference position (first step). Then, the position detecting section 263a reads the variation Hw=1/2 of the second step from the specified information storage section 263b and transmits the read variation to the zone marker generating section 264 and the peak marker generating section 261b together with the zone position corresponding to the detected variation (in this case, the zone position is the same as the position [2] since movement in the horizontal axis direction is not performed). The zone marker generating section 264 sets the zone width obtained by multiplying the default zone width by the variation Hw=1/2 and does not change the zone position (position [2] in FIG. 37). The peak marker generating section 261b reads the waveform data of the measured waveform 100 within the time width, which is equivalent to 1/2 of the default zone width, from the measured data storage section 261a, calculates the waveform position indicating the maximum value from the read waveform data, and attaches the peak marker 180 to the position and displays it (V mark in FIG. 38).

Figure 39:
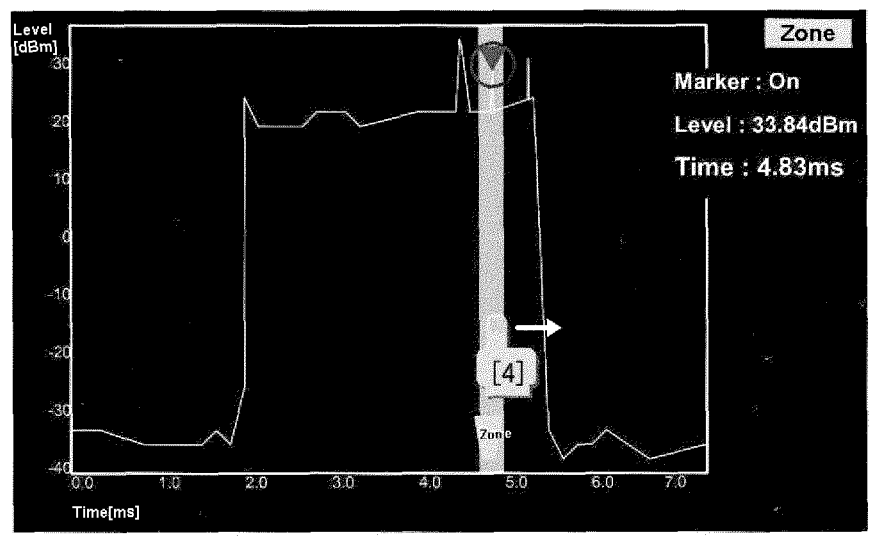
FIG. 39 is a view for explaining the movement and operation of a waveform marker in the ninth embodiment.

Moreover, as shown in FIG. 39, by moving the horizontal axis position of the indicator 150, the operator moves the indicator 150 from the zone position [3] (the same for the position [2]) to the position [4] so that the target point 130 enters into the zone width. In this case, the variation Hw of the second step is still 1/2 like FIG. 27. In this way, the peak marker generating section 261b reads the waveform data of the measured waveform 100 within the time width, which is equivalent to 1/2 of the default zone width at the new zone position (position [4] in FIG. 39), from the measured data storage section 261a, calculates the waveform position indicating the maximum value from the read waveform data, and attaches the peak marker 180 to the position and displays it (V mark in FIG. 39).

By the above-described configuration, it is possible to move the zone marker 170 while changing the width of the zone marker 170 smoothly. As a result, it is possible to see the target point 130 by the zone marker 170 by smoothly separating peak points near the target point 130 from each other.

In addition, although the variation Hw is expressed as a magnification which is a relative value with respect to the default value in the ninth embodiment, the variation Hw may be an absolute value. In the case of magnification, the variation Hw may be stored in the specified information storage section 263b as Hw=1/1, 1/2, . . . , 1/6 in six steps. In the case of absolute value, regardless of the measuring time width (display time width) of the horizontal axis, if physical display points on the horizontal axis are N points, the variation Hw may be stored in the specified information storage section 263b as first-step width Hws=N/10, second-step width Hws=N/20, . . . , sixth-step width Hws=N/60 in five steps, for example.

Tenth Embodiment

Figure 35:
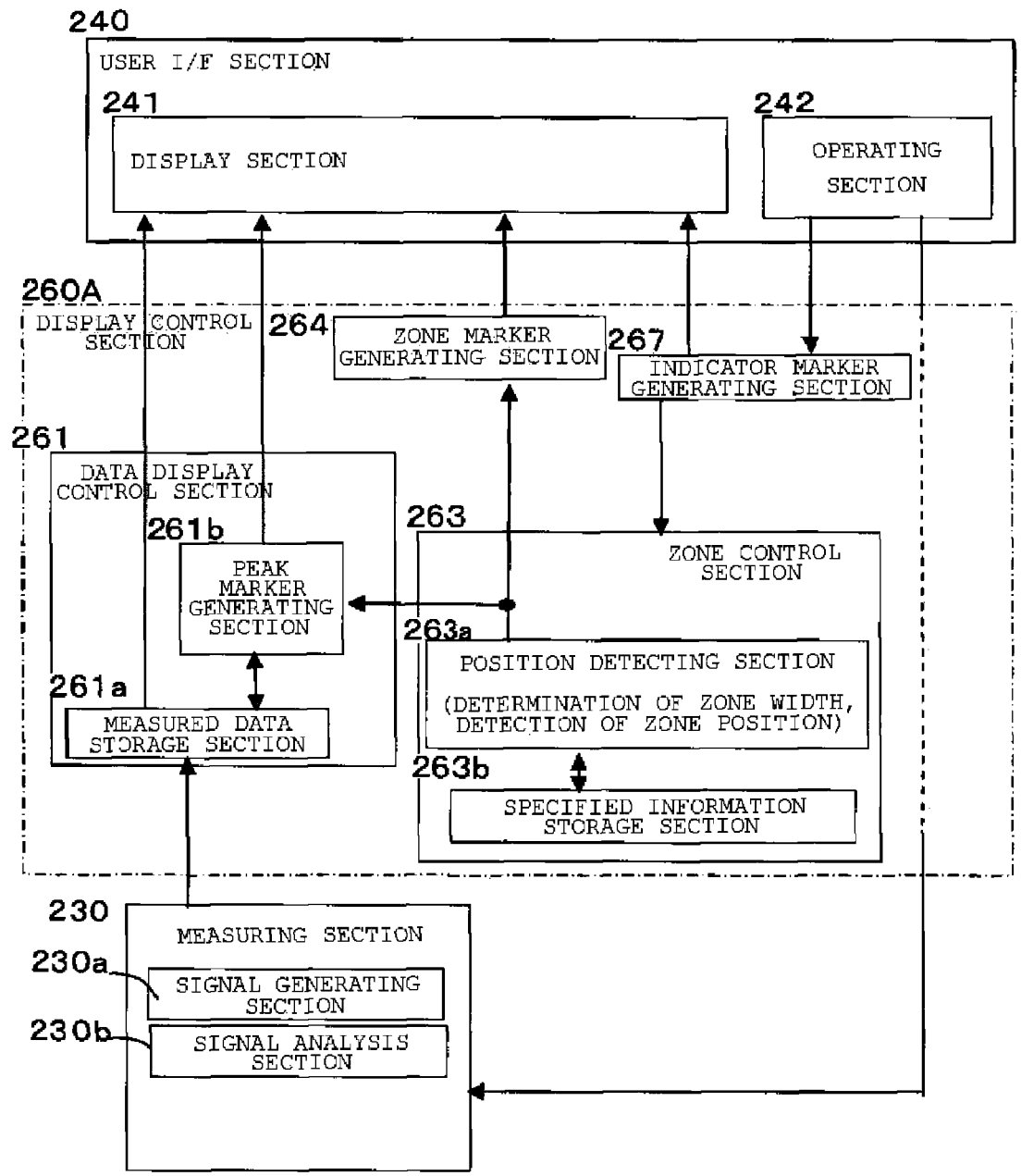
FIG. 35 is a view showing the functional configuration of a tenth embodiment.

The tenth embodiment will be described with reference to FIG. 35. In FIG. 35, main components to which the same reference numerals as in FIGS. 23, 31, and 34 are given have the same functions.

In the tenth embodiment, the display section 241 of the user I/F section 240 shown in FIG. 35 in the ninth embodiment is changed to a normal display section with no touch panel. For this reason, although a finger was described as the indicator 150 in the ninth embodiment, the indicator marker 150a as a marker which can be operated from the operating section 242 is used instead of the finger. That is, an indicator marker generating section 267 in a display control section 260A shown in FIG. 35 receives the information indicating the operator's operation amount and direction using an encoder (for example, a mouse) or the like of the operating section 242, generates the indicator marker 150a in the movement direction and position corresponding to the information and displays the indicator marker 150a on the display section 241, and notifies the position detecting section 263a of the movement direction and position of the indicator marker 150a. Since other operations are the same as those in the ninth embodiment, the explanation will be omitted.

Eleventh Embodiment

Figure 40:
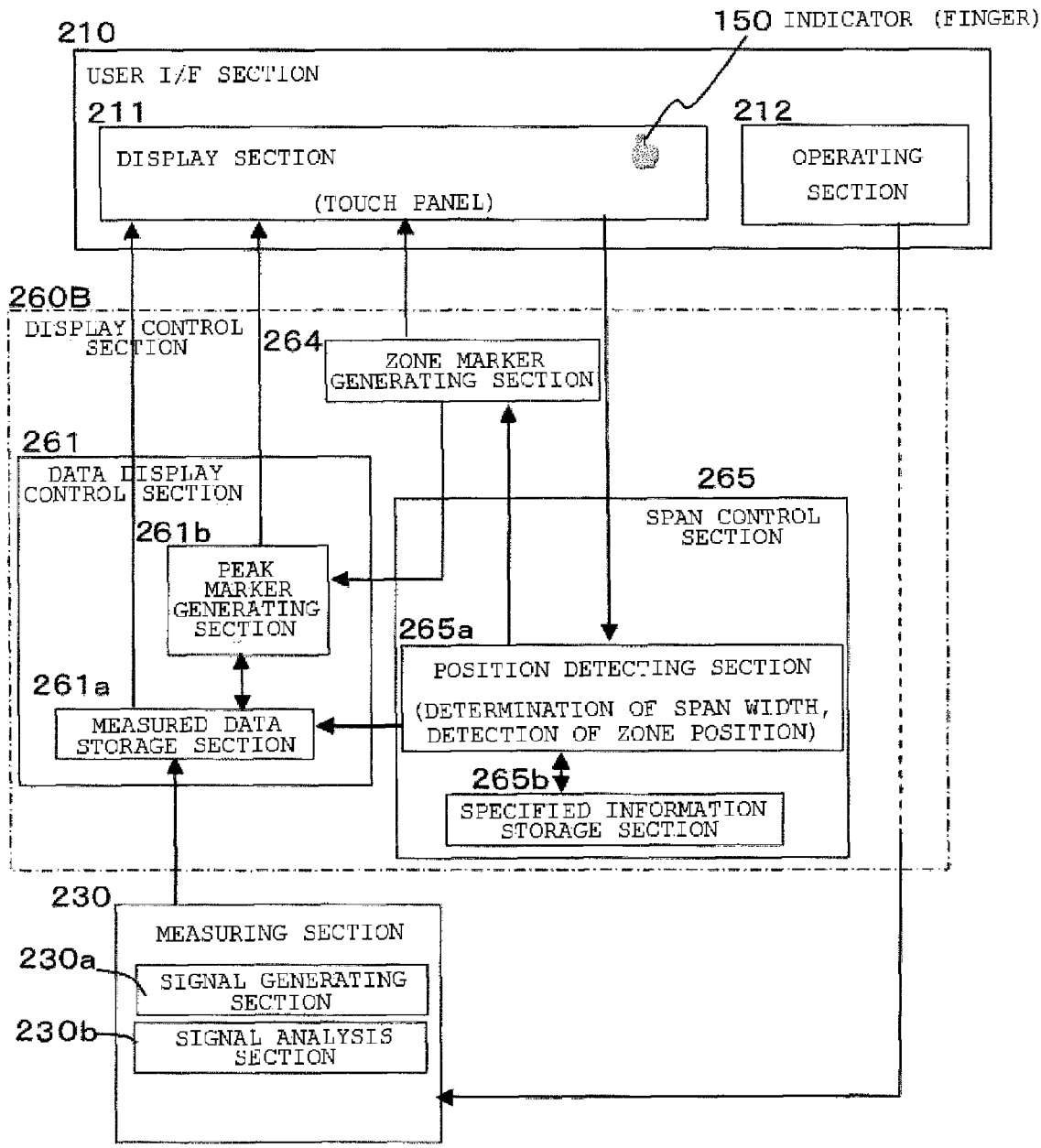
FIG. 40 is a view showing the functional configuration of an eleventh embodiment.

The eleventh embodiment will be described with reference to FIG. 40. In FIG. 40, main components to which the same reference numerals as in FIGS. 23, 31, 34, and 35 are given have the same functions. In addition, the eleventh embodiment will be described using an example where measurement is performed on the condition that the horizontal axis indicates time and the vertical axis indicates a level.

In the ninth embodiment, the instruction resolution with respect to the measured waveform 100 is changed by changing the width of the zone marker 170 according to the vertical position of the indicator 150. On the other hand, in the eleventh embodiment, the instruction resolution of the zone marker 170 with respect to the measured waveform 100 is changed by changing a display range (may also be said to be a "display time range") when displaying the measured waveform 100 while maintaining the width of the zone marker 170 as a fixed width, such that the target point 130 can be easily caught by the peak marker 180. Accordingly, although the objects controlled to improve the instruction resolution are different in the ninth and eleventh embodiments, the ideas of the ninth and eleventh embodiments are substantially the same.

In this case, the measuring section 230 acquires the data number regarding the fineness of time of the horizontal axis and stores it in the measured data storage section 261*a* as measured data of the measured waveform 100 so that it is possible to meet expansion/reduction of the display time width of the horizontal axis when displaying the measured waveform 100 as will be described later. For example, suppose that a time width ΔT in reducing the display time width to the minimum (in this case, a display image is displayed so as to be enlarged in the horizontal direction) is displayed when a physical display point number on the horizontal axis is set to L, the data number equal to or larger than "L×Max" is acquired with the fineness which is finer than "(ΔT/L)+Max" in order to make it possible to enlarge the time width maximum Max times. In the above example, assuming that the display time width changes in six steps from 1/1 to 1/6, the time width of Max is equivalent to the first step and the time width at the time of minimum reduction is equivalent to the sixth step.

Moreover, an example in which the display section 211 is formed by a touch panel is the eleventh embodiment, and an example in which the display section 211 is formed by a normal display section is a twelfth embodiment which will be described later.

Referring to FIG. 40, an explanation focused on the difference with FIG. 34 will be given hereinafter. Before forwarding or measurement, the time range (which becomes a display time width on the horizontal axis; also called a span width), which corresponds to the vertical axis position of the indicator 150 (finger) and which is read for display from the measured data storage section 261*a*, is stored beforehand in a specified information storage section 265*b* of a span control section 265 in a display control section 260B in FIG. 40. For example, it is divided into n steps from the high vertical position to the low vertical position, and the value (direction in which the horizontal axis direction of a display image is enlarged) which narrows the display time width as the position of the indicator 150 lowers is stored. Similar to the ninth embodiment, the display time width stored in the specified information storage section 265*b* may be specified as the variation Hw (magnification) of the display time width or may be specified as the absolute value (physical display point number on the horizontal axis). Here, an explanation using the variation Hw will be given. Moreover, although these are specified by the display time width, they may also be specified by expansion/reduction of an image. In this case, the variation Hw has an opposite relationship with the display time width, like six times in the first step, twice in the second step, ..., once in the sixth step.

Figure 42:
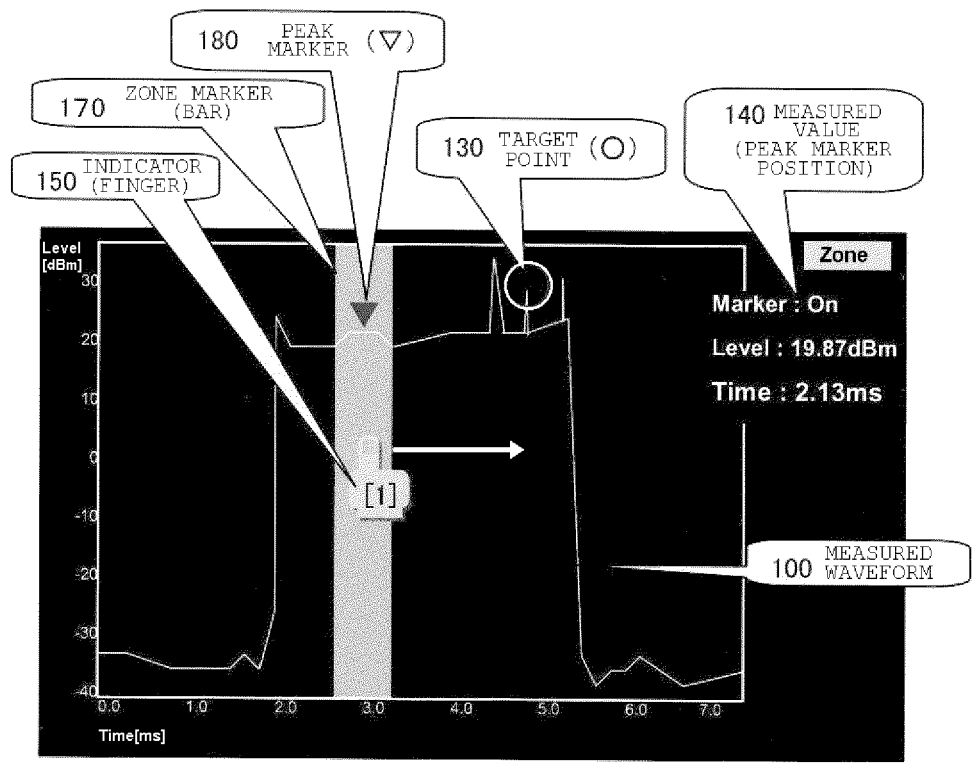
FIG. 42 is a view for explaining the movement and operation of a waveform marker in the eleventh embodiment.

A position detecting section 265*a* of the span control section 265 in FIG. 40 is different from the position detecting section 263*a* in the ninth embodiment in that the position detecting section 265*a* determines display time width (span) but the position detecting section 263*a* determines the width of the zone marker 170. However, other operations are the same. Hereinafter, the position detecting section 265*a* will be briefly described. As shown in FIG. 42, the position detecting section 265*a* detects the width direction movement amount in the horizontal axis direction and the position in the vertical axis direction when the indicator 150 is operated on a screen of the display section 211 of a touch panel. For example, the position detecting section 265*a* detects the width direction movement amount and the vertical position of the finger (indicator) when the operator touches the touch panel of the screen with his or her finger and moves the touch position (position of the indicator 150).

The details are as follows. The position detecting section 265*a* detects whether or not the indicator 150 has been placed first and then detects and stores as a reference position the vertical axis position when placed first. Then, one of the plurality of steps n stored in the specified information storage section 265*b* is assigned to the reference position. For example, the first step (variation Hw=1) is assigned to the reference position. Then, the position detection section 265*a* detects how far the indicator 150 has moved in the vertical axis direction from the reference position. That is, the position detection section 265*a* detects the relative distance. Then, the position detection section 265*a* detects to which of the plurality of steps n the relative distance is equivalent, reads the variation (rate) Hw corresponding to the step from the specified information storage section 265*b*, and transmits it to the marker generating section 261*b*. In this case, the position detecting section 265*a* also detects the width direction movement amount of the indicator 150 in the horizontal axis direction and transmits the width direction movement amount to the zone marker generating section 264 and the peak marker generating section 261*b*. For example, since the step n of the relative distance YL when the indicator 150 shown in FIG. 43 has dropped from the position [2] to the position [3] in FIG. 44 is a third step, "Hw=1/3" is read from the specified information storage section 265*b* as the variation Hw in the step (n=3) and this is transmitted to the zone marker generating section 264 and the peak marker generating section 261*b*. In this case, the position detecting section 265*a* also detects the width direction movement amount of the indicator 150 in the horizontal axis direction and transmits the width direction movement amount to the zone marker generating section 264 and the peak marker generating section 261*b* together with the variation Hw.

The zone marker generating section 264 generates a vertically long bar-shaped zone marker 170 with a predetermined width and displays it at the zone position (center position of the zone marker 170) which has moved by the width direction movement amount instructed from the position detecting section 265*a*. On the other hand, the zone marker generating section 264 transmits the information of the predetermined width to the peak marker generating section 261*b*.

With the time position corresponding to the zone position detected by the position detecting section 265*a* as the center, the data display control section 261 displays on the display section 211 the coordinates, in which the default display time width is changed to the display time width equivalent to the variation Hw received from the position detecting section 265*a* on the horizontal axis and the vertical axis is set as the amplitude of the measured waveform 100, and the measured waveform 100 stored in the measured data storage section 261*a*. The newest zone marker 170 generated by the zone marker generating section 264 is displayed on the measured waveform 100 which is displayed on the display section 211.

For example, when the range of the variation Hw of 1/1 to 1/6 is adopted as described above, the data display control section 261 performs the display with the time width 6×ΔT (variation Hw=1/1 is 6 times the variation Hw=1/6) of maximum display, which is the default width, in the case of variation Hw=1/1 and performs the display with the time width ΔT of minimum display in the case of variation Hw=1/6.

The peak marker generating section 261b reads from the measured data storage section 261a the data corresponding to the time range of the width of the zone marker 170, which has been instructed from the zone marker generating section 264, with the time position corresponding to the zone position corresponding to the movement amount detected by the position detecting section 265a as the center (center position of the zone marker 170), searches the waveform position indicating the maximum value within the zone width, and displays the peak marker 180 at the searched waveform position on the display section 211.

Since the processing time until the vertical axis position and the width direction movement amount of the indicator 150 are detected after moving the indicator 150 (finger) and the newest zone marker 170 and the peak marker 180 are displayed is short, the operator can observe it without a feeling of discomfort.

Next, an operation method and a series of operations will be described with reference to FIGS. 42 to 44. In FIG. 42, the horizontal axis indicates a measurement time and the vertical axis indicates the amplitude of the measured waveform 100. Here, an operation of setting from the position of the zone marker 170 in FIG. 42 up to the target point 130 (0 mark) to be measured is performed will be described. FIG. 42 shows a state where the zone marker generating section 264 displays the zone marker 170 having a predetermined zone width at a predetermined zone position as a default, and the peak marker generating section 261b searches the peak position of the data of the measured waveform 100 within the zone position and the zone width and displays the peak marker 180 at the position.

In FIG. 42, an operator places the indicator 150 (finger) on the display screen and moves it toward the target point 130. In this case, the position detecting section 265a detects whether or not the indicator 150 has been placed first and then detects and stores as a reference position (vertical axis position of [1] in FIG. 42) the vertical axis position when placed first. Then, the first step (variation Hw=1) of the plurality of steps n stored in the specified information storage section 265b is assigned to the reference position. Then, while the operator moves the indicator 150 (finger) in the horizontal axis direction from the position [1] in FIG. 42 to the target point 130, the variation Hw=1/1 of the first step is read from the specified information storage section 265b. The variation Hw=1/1 of the first step is transmitted to the zone marker generating section 264 and the peak marker generating section 261b together with the movement amount of the indicator 150 in the width direction detected simultaneously with the reading.

Since the variation Hw is 1/1, the data display control section 261 displays the measured waveform 100 with the default time width. The zone marker generating section 264 moves the zone marker 170 to the zone position (position equivalent to [2] in FIG. 43), which corresponds to the instructed width direction movement amount, with the default zone width. The peak marker generating section 261b reads from the measured data storage section 261a the waveform data of the measured waveform 100 within the default time width at the position equivalent to the designated position (position [2] in FIG. 43), calculates the waveform position indicating the maximum value from the read waveform data, and attaches the peak marker 180 to the position and displays it (V mark in FIG. 43).

Figure 43:
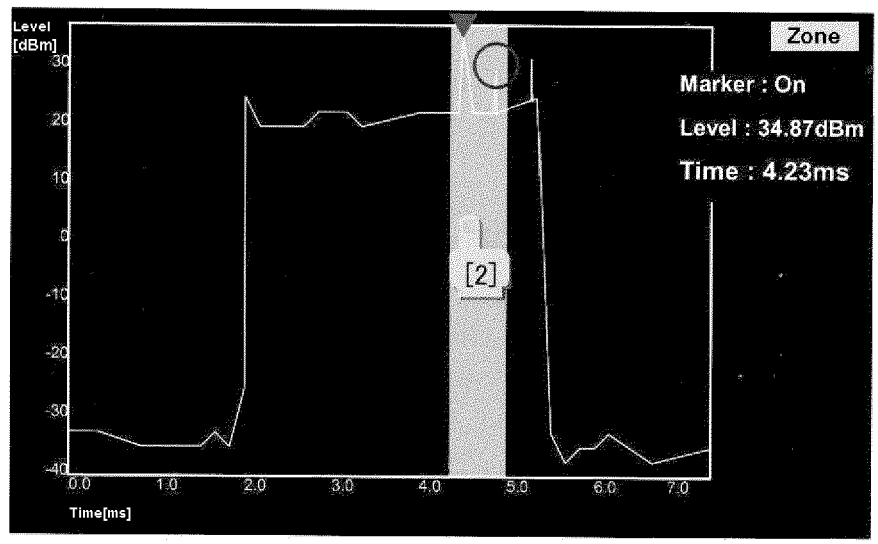
FIG. 43 is a view for explaining the movement and operation of a waveform marker in the eleventh embodiment.
Figure 44:
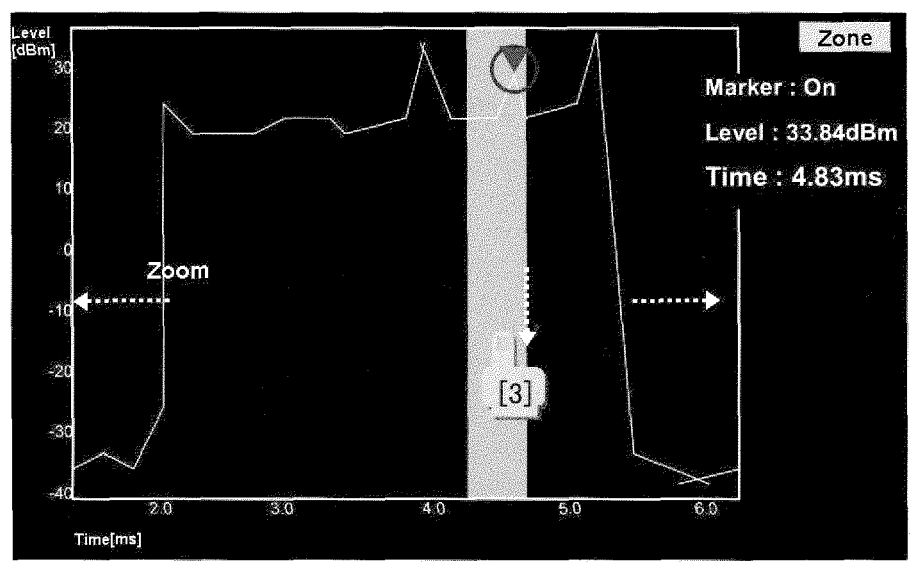
FIG. 44 is a view for explaining the movement and operation of a waveform marker in the eleventh embodiment.

In FIG. 43, since the peak marker 180 has not reached the target point 130 yet, it is necessary to further enlarge the zone width. Therefore, the operator lowers the indicator 150 in FIG. 43 from the position [2] to the position [3] in FIG. 44. That is, the operator lowers the indicator 150 to the second step (relative distance) in the vertical axis direction. Then, by detecting the vertical axis position of the indicator 150, the position detecting section 265a detects that the indicator 150 exists at the position (relative distance) of the second step from the reference position (first step). Then, the position detecting section 265a reads the variation Hw=1/2 of the second step from the specified information storage section 265b and transmits the read variation to the zone marker generating section 264 and the peak marker generating section 261b together with the zone position corresponding to the detected width direction movement amount (in this case, the zone position in the horizontal axis direction is the same as the position [2]). The data display control section 261 reads the waveform data of the measured waveform 100, which is equivalent to the time width (1/2 times) obtained by multiplying the default time width (time width when Hw is 1/1) by the variation Hw=1/2, from the measured data storage section 261a and displays it (see the waveform and the time width of the horizontal axis in FIG. 44). The zone marker generating section 264 does not change the zone position (position [2] in FIG. 44). The peak marker generating section 261b reads the waveform data of the measured waveform 100 within the time width, which is equivalent to 1/2 of the default time width, from the measured data storage section 261a, calculates the waveform position indicating the maximum value from the read measured waveform 100, and attaches the peak marker 180 to the position and displays it (V mark in FIG. 44). In FIG. 44, the peak marker 180 is displayed at the target point 130, and the measured value at the peak waveform position is displayed as a numeric value on the right side of the screen.

According to the above-described configuration, it is possible to move the measured waveform 100 while changing the display range of the measured waveform 100 smoothly. As a result, since the instruction resolution of the zone marker 170 is relatively improved, it is possible to see the target point 130 by the zone marker 170 by smoothly separating peak points near the target point 130 from each other.

Twelfth Embodiment

Figure 41:
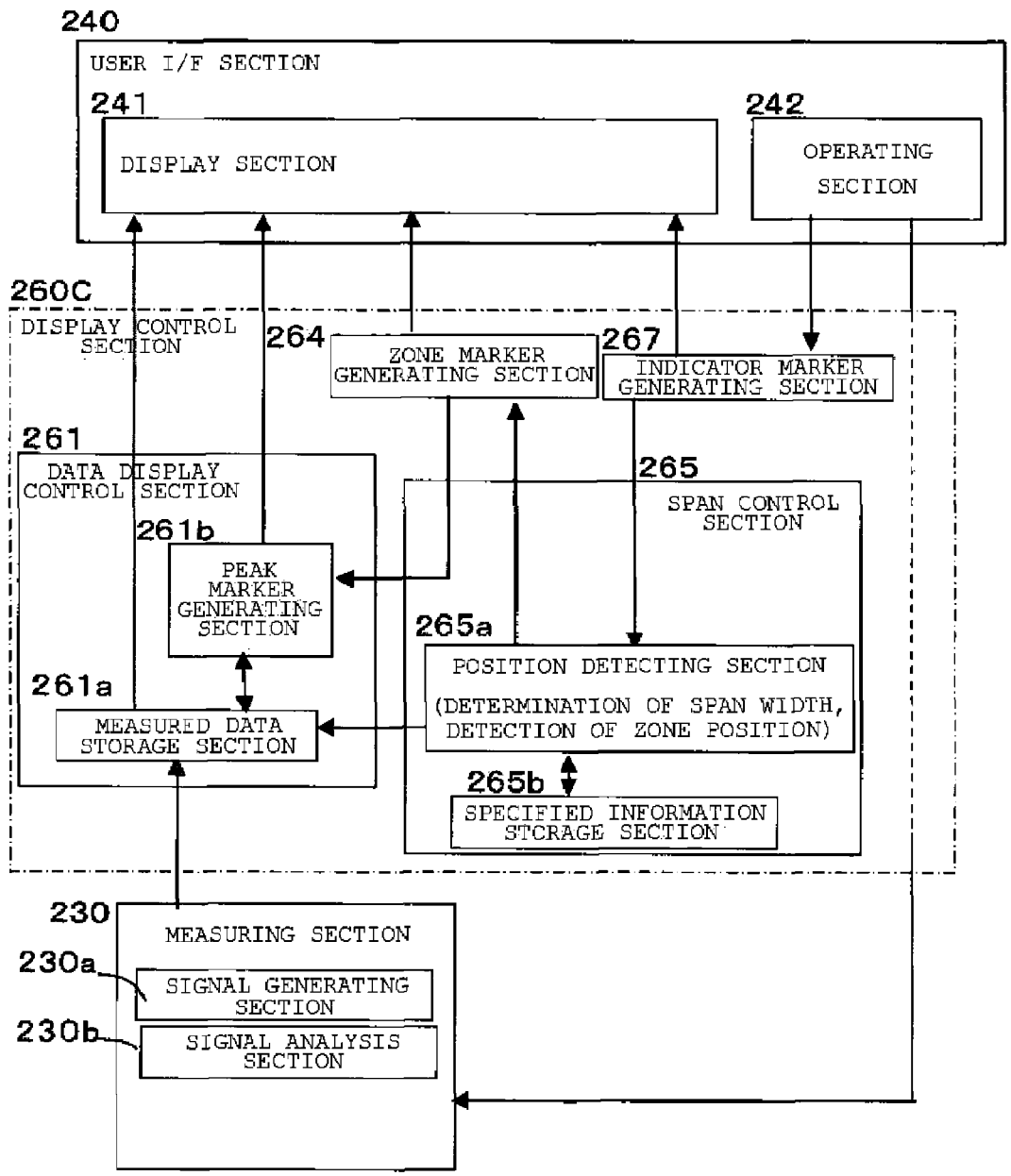
FIG. 41 is a view showing the functional configuration of a twelfth embodiment.

The twelfth embodiment will be described with reference to FIG. 41. In FIG. 41, main components to which the same reference numerals as in FIGS. 23, 31, 34, 35, and 40 are given have the same functions.

In the twelfth embodiment, the display section 241 of the user I/F section 240 shown in FIG. 41 in the eleventh embodiment is changed to a normal display section with no touch panel. For this reason, although a finger was described as the indicator 150 in the eleventh embodiment, the indicator marker 150a as a marker which can be operated from the operating section 242 is used instead of the finger. That is, an indicator marker generating section 267 in a display control section 260C shown in FIG. 41 receives the information indicating the operator's operation amount and direction using an encoder or the like of the operating section 242, generates the indicator marker 150a in the movement direction and position corresponding to the information and displays the indicator marker 150a on the display section 241, and notifies the position detecting section 265a of the movement direction and position of the indicator marker 150a. Since other operations are the same as those in the eleventh embodiment, the explanation will be omitted.

Each of the display control sections in the first to twelfth embodiments is configured to include a program which performs the functional operation described above, a CPU which executes the program, and a memory which stores data. Although each display control section is divided into blocks for different functional operations in the above explanation, the functional operations and blocks may also be united or separated. In any case, it belongs to the scope of the invention as long as it has a configuration where a functional operation for execution of the subject matter of the invention is executed.

What is claimed is:

1. A measuring apparatus comprising:
a user I/F section having an operating section and a display section;
a measuring section that measures an object to be measured or a signal to be measured; and
a display control section that displays a measured waveform, which is based on measured data acquired by the measuring section, on the display section and also displays a waveform marker, which is movable by a marker operation from the user I/F section, so as to overlap the measured waveform,
wherein the display control section displays the measured waveform on two-dimensional coordinates, which have a first axis and a second axis perpendicular to the first axis, on the display section,
the waveform marker is movable by the marker operation corresponding to a direction parallel to the first axis, and
the display control section has a detecting section, which detects the marker operation corresponding to a direction parallel to the second axis, and changes either setting of the waveform marker or a display range of the measured waveform according to the detection result of the detecting section;
wherein the display control section sets, in a waveform display region where the measured waveform of the display section is displayed, an index which specifies a movement variation in a distance or a speed of the waveform marker corresponding to an operation amount in the marker operation as a plurality of steps in order of size, detects that a certain specific step of the index has been designated by a marker operation of the user I/F section, detects the operation amount when the marker operation for moving the displayed waveform marker has been performed after the designation, and moves the waveform marker by the movement variation specified by the index of the specific step,
wherein the marker operation is performed by moving an indicator on a screen of the display section, and
the display control section includes:
an index storage section that stores specified information which specifies the movement variation in the distance or the speed of the waveform marker by dividing the movement variation into the plurality of steps in order of size;
an index display control section that sets the index on the display section so that each of the plurality of steps can be designated and detects that the certain specific step of the index has been designated by the indicator in the marker operation;
an instructed amount detecting section that detects, as the operation amount, a movement amount of the indicator in the marker operation after detection of the specific step; and
a marker generating section that generates the waveform marker, receives the operation amount output from the instructed amount detecting section, and moves the waveform marker by the movement variation based on the specified information, which corresponds to the specific step detected by the index display control section, by referring to the specified information of the index storage section.

2. The measuring apparatus according to claim 1,
wherein the index display control section sets an index, which is a bar-shaped index parallel to the second axis and which is divided in the longitudinal direction such that the movement variation is divided into a plurality of regions corresponding to the plurality of steps, and detects the specific step by determining in which region of the plurality of regions the indicator in the marker operation exists.

3. The measuring apparatus according to claim 2,
wherein the index display control section moves the index together on the display section by moving the indicator in the direction parallel to the first axis in a state where the indicator is placed in a specific region of the index and moves the indicator to the other specific region along the direction parallel to the second axis, and
the instructed amount detecting section detects that change to the other specific region has been performed in response to movement of the indicator to the other region.

4. The measuring apparatus according to claim 1,
wherein the index display control section sets the index over approximately the entire range, in which the measured waveform on the screen of the display section is displayed, and sets the index such that the range is divided into the plurality of steps in the direction parallel to the second axis, and detects that the specific step has been selected when the specific step is designated by moving the indicator in the direction parallel to the second axis by the marker operation, and
the instructed amount detecting section detects the instructed movement amount from movement of the indicator when the indicator has moved to the specific region after the specific step is detected.

5. A measuring apparatus comprising:
a user I/F section having an operating section and a display section;
a measuring section that measures an object to be measured or a signal to be measured; and
a display control section that displays a measured waveform, which is based on measured data acquired by the measuring section, on the display section and also displays a waveform marker, which is movable by a marker operation from the user I/F section, so as to overlap the measured waveform,
wherein the display control section displays the measured waveform on two-dimensional coordinates, which have a first axis and a second axis perpendicular to the first axis, on the display section,
the waveform marker is movable by the marker operation corresponding to a direction parallel to the first axis, and
the display control section has a detecting section, which detects the marker operation corresponding to a direction parallel to the second axis, and changes either setting of the waveform marker or a display range of the measured waveform according to the detection result of the detecting section, wherein the waveform marker is a zone marker having a predetermined width in the direction parallel to the first axis, the marker operation is performed by placing an indicator in a waveform display region, in which the measured waveform of the display section is displayed, and moving the indicator, the display control section includes:

a zone marker generating section that moves and displays the position of the zone marker;

a peak marker generating section that displays a peak marker at the maximum position of a waveform within a zone of a predetermined width of the zone marker;

an instructed position detecting section that detects the position of the indicator, which is located on the zone marker, in the direction parallel to the second axis; and a width determining section that makes the zone marker generating section change the predetermined width of the zone marker according to the detected position of the indicator in the direction parallel to the second axis, and the peak marker generating section displays the peak marker at the maximum position of a waveform within a zone of a changed predetermined width of the zone marker.

6. A measuring apparatus comprising:

a user I/F section having an operating section and a display section;

a measuring section that measures an object to be measured or a signal to be measured; and a display control section that displays a measured waveform, which is based on measured data acquired by the measuring section, on the display section and also displays a waveform marker, which is movable by a marker operation from the user I/F section, so as to overlap the measured waveform, wherein the display control section displays the measured waveform on two-dimensional coordinates, which have a first axis and a second axis perpendicular to the first axis, on the display section, the waveform marker is movable by the marker operation corresponding to a direction parallel to the first axis, and the display control section has a detecting section, which detects the marker operation corresponding to a direction parallel to the second axis, and changes either setting of the waveform marker or a display range of the measured waveform according to the detection result of the detecting section, wherein the waveform marker is a zone marker having a predetermined width in the direction parallel to the first axis, the marker operation is performed by placing an indicator in a waveform display region, in which the measured waveform of the display section is displayed, and moving the indicator, the display control section includes:

a zone marker generating section that moves and displays the position of the zone marker;

a peak marker generating section that displays a peak marker at the maximum position of a waveform within a zone of a predetermined width of the zone marker;

an instructed position detecting section that detects the position of the indicator, which is located on the zone marker, in the direction parallel to the second axis; and a width determining section that changes the predetermined display range according to the detected position of the indicator in the direction parallel to the second axis, and the peak marker generating section displays the peak marker at the maximum position of a waveform within a zone of a predetermined width of the zone marker displayed in the changed predetermined display range.

7. The measuring apparatus according to claim 6, wherein the instructed position detecting section further detects a center position of the predetermined width of the zone marker, and the display control section changes the predetermined display range to the changed display range instructed by the width determining section with the center position of the zone marker, which has been detected by the instructed position detecting section, as a center and displays the changed display range.

8. A measuring apparatus comprising:

a user I/F section having an operating section and a display section;

a measuring section that measures an object to be measured or a signal to be measured; and a display control section that displays a measured waveform, which is based on measured data acquired by the measuring section, on the display section and also displays a waveform marker, which is movable by a marker operation from the user I/F section, so as to overlap the measured waveform, wherein the display control section displays the measured waveform on two-dimensional coordinates, which have a first axis and a second axis perpendicular to the first axis, on the display section, the waveform marker is movable by the marker operation corresponding to a direction parallel to the first axis, and the display control section has a detecting section, which detects the marker operation corresponding to a direction parallel to the second axis, and changes either setting of the waveform marker or a display range of the measured waveform according to the detection result of the detecting section, wherein the display control section detects a relative distance from an initial position when the marker operation in the direction parallel to the second axis has started in a waveform display region, in which the measured waveform of the display section is displayed, to an operation position when the marker operation has been actually performed in the direction parallel to the second axis and then detects an operation amount in the direction parallel to the first axis when the marker operation of moving the displayed waveform marker in the direction parallel to the first axis has been performed, and moves the waveform marker on the basis of a movement variation corresponding to the relative distance and the operation amount.

9. The measuring apparatus according to claim 8, wherein the marker operation is performed by moving an indicator on a screen of the display section, and the display control section includes:

a specified information storage section that stores specified information, which specifies the movement variation in a distance or a speed of the waveform marker in the predetermined direction corresponding to the relative distance, beforehand;

a relative distance detecting section that detects a relative distance when the indicator has moved in the direction parallel to the second axis by the marker operation and that acquires specified information corresponding to the relative distance by referring to the specified information stored in the specified information storage section;

an instructed amount detecting section that detects, as the operation amount, a movement amount of the indicator in the direction parallel to the first axis by the marker operation after the relative distance is detected; and a marker generating section that generates the waveform marker and that moves the waveform marker by a movement amount obtained by specifying the operation amount in the direction parallel to the first axis, which has been detected by the instructed amount detecting section, with the specified information corresponding to the relative distance acquired by the relative distance detecting section.

10. A measuring apparatus comprising:

a user I/F section having an operating section and a display section;

a measuring section that measures an object to be measured or a signal to be measured; and a display control section that displays a measured waveform, which is based on measured data acquired by the measuring section, on the display section and also displays a waveform marker, which is movable by a marker operation from the user I/F section, so as to overlap the measured waveform, wherein the display control section displays the measured waveform on two-dimensional coordinates, which have a first axis and a second axis perpendicular to the first axis, on the display section, the waveform marker is movable by the marker operation corresponding to a direction parallel to the first axis, and the display control section has a detecting section, which detects the marker operation corresponding to a direction parallel to the second axis, and changes either setting of the waveform marker or a display range of the measured waveform according to the detection result of the detecting section, wherein the waveform marker is a zone marker having a predetermined width in the direction parallel to the first axis, the marker operation is performed by placing an indicator in a waveform display region, in which the measured waveform of the display section is displayed, and moving the indicator, the display control section includes:

a zone marker generating section that moves and displays the position of the zone marker;

a peak marker generating section that displays a peak marker at the maximum position of a waveform within a zone of a predetermined width of the zone marker; and a zone control section that detects a relative distance from the position of the indicator in the direction parallel to the second axis at the start of the marker operation to the position of the indicator which has moved in the direction parallel to the second axis by the marker operation and that changes a predetermined width of the zone marker according to the detected relative distance and detects a width direction movement amount when the indicator has moved in the direction parallel to the first axis, the zone marker generating section moves and displays the zone marker with the predetermined width, which has been changed by the zone control section, at a position corresponding to the detected width direction movement amount of the indicator, and the peak marker generating section displays the peak marker at the maximum position of a waveform within a zone of the predetermined changed width at the position to which the zone marker has moved.

11. A measuring apparatus comprising:

a user I/F section having an operating section and a display section;

a measuring section that measures an object to be measured or a signal to be measured; and a display control section that displays a measured waveform, which is based on measured data acquired by the measuring section, on the display section and also displays a waveform marker, which is movable by a marker operation from the user I/F section, so as to overlap the measured waveform, wherein the display control section displays the measured waveform on two-dimensional coordinates, which have a first axis and a second axis perpendicular to the first axis, on the display section, the waveform marker is movable by the marker operation corresponding to a direction parallel to the first axis, and the display control section has a detecting section, which detects the marker operation corresponding to a direction parallel to the second axis, and changes either setting of the waveform marker or a display range of the measured waveform according to the detection result of the detecting section, wherein the waveform marker is a zone marker having a predetermined width in the direction parallel to the first axis, the marker operation is performed by placing an indicator in a waveform display region, in which the measured waveform of the display section is displayed, and moving the indicator, the display control section includes:

a zone marker generating section that moves and displays the position of the zone marker;

a peak marker generating section that displays a peak marker at the maximum position of a waveform within a zone of a predetermined width of the zone marker; and a span control section that detects a relative distance from the position of the indicator in the direction parallel to the second axis at the start of the marker operation to the position of the indicator which has moved in the direction parallel to the second axis by the marker operation and that makes the display control section change and display the predetermined display range according to the detected relative distance and detects a width direction movement amount when the indicator has moved in the width direction, the zone marker generating section moves and displays the zone marker at a position, which corresponds to the detected width direction movement amount of the indicator, on a measured waveform in the predetermined display range changed by the span control section, and the peak marker generating section displays the peak marker in the changed predetermined display range and at the maximum position of a waveform within a zone of the predetermined width of the zone marker which has been moved and displayed.

12. The measuring apparatus according to claim 11, wherein the span control section further detects a center position of the predetermined width of the zone marker, and the display control section changes the predetermined display range to a display range, which corresponds to the detected relative distance, with the center position of the zone marker detected by the span control section as a center and displays the changed display range.

13. The measuring apparatus according to any one of claims 1 and 2 to 12,
wherein the display section has a screen formed by a touch panel, and
the marker operation in the user I/F section is a moving operation in which an operator moves a direct or indirect indicator on the touch panel.

14. The measuring apparatus according to any one of claims 1 and 2 to 12,
wherein the display control section generates an indicator marker, which is movable by an operation in the operating section, and displays the indicator marker on the display section,
the marker operation in the user I/F section is the operation in the operating section, and
the indicator is the indicator marker.

15. A measuring method comprising:
measuring an object to be measured or a signal to be measured;
displaying a measured waveform on a display, which is based on measured data acquired in the measuring, on two-dimensional coordinates which have a first axis and a second axis perpendicular to the first axis;
displaying a waveform marker on the display, which is movable by a marker operation corresponding to a direction parallel to the first axis, so as to overlap the measured waveform, wherein the marker operation is performed by moving an indicator on the display screen;
detecting the marker operation corresponding to a direction parallel to the second axis;
changing either setting of the waveform marker or a display range of the measured waveform according to the detection result,
setting, in a waveform display region where the measured waveform is displayed, an index which specifies a movement variation in a distance or a speed of the waveform marker, which corresponds to an operation amount in the marker operation in the direction parallel to the first axis, as a plurality of steps in order of the size of the movement variation in the direction parallel to the second axis,
wherein in the detecting, it is detected that a certain specific step of the index has been designated by the marker operation, and
in the changing, the set movement variation of the waveform marker is changed to a movement variation specified by the index of the designated specific step,
storing specified information which specifies the movement variation in the distance or the speed of the waveform marker by dividing the movement variation into the plurality of steps in order of size;
setting the index on the display screen so that each of the plurality of steps can be designated and the certain specific step of the index designated by the indicator in the marker operation is detected;
detecting as the operation amount, a movement amount of the indicator in the marker operation after detection of the specific step; and
generating the waveform marker, receiving the operation amount output, and moving the waveform marker by the movement variation based on the specified information, which corresponds to the specific step, by referring to the specified information.

16. A measuring method comprising:
measuring an object to be measured or a signal to be measured;
displaying a measured waveform, which is based on measured data acquired in the measuring, on two-dimensional coordinates which have a first axis and a second axis perpendicular to the first axis;
displaying a waveform marker, which is movable by a marker operation corresponding to a direction parallel to the first axis, so as to overlap the measured waveform;
detecting the marker operation corresponding to a direction parallel to the second axis;
changing either setting of the waveform marker or a display range of the measured waveform according to the detection result,
wherein the waveform marker is a zone marker having a predetermined width in the direction parallel to the first axis, and
displaying a peak marker at the maximum position of a waveform within a zone of the predetermined width of the zone marker and setting, in a waveform display region where the measured waveform is displayed, an index which specifies the predetermined width of the zone marker, which corresponds to an operation amount in the marker operation in the direction parallel to the first axis, as a plurality of steps in order of the size of the predetermined width in the direction parallel to the second axis are further included,
wherein in the detecting, it is detected that a certain specific step of the index has been designated by the marker operation,
in the changing, the set predetermined width of the zone marker is changed to a predetermined width specified by the index of the designated specific step, and
in the displaying of the peak marker, the peak marker is displayed at the maximum position of a waveform within the zone of the changed predetermined width.

17. A measuring method comprising:
measuring an object to be measured or a signal to be measured;
displaying a measured waveform, which is based on measured data acquired in the measuring, on two-dimensional coordinates which have a first axis and a second axis perpendicular to the first axis;
displaying a waveform marker, which is movable by a marker operation corresponding to a direction parallel to the first axis, so as to overlap the measured waveform;
detecting the marker operation corresponding to a direction parallel to the second axis;
changing either setting of the waveform marker or a display range of the measured waveform according to the detection result;
wherein the waveform marker is a zone marker having a predetermined width in the direction parallel to the first axis, and
displaying a peak marker at the maximum position of a waveform within a zone of the predetermined width of the zone marker and setting, in a waveform display region where the measured waveform is displayed, an index which specifies a display range of the measured waveform, which corresponds to an operation amount in the marker operation in the direction parallel to the first axis, as a plurality of steps in order of the size of the predetermined width in the direction parallel to the second axis are further included, wherein in the detecting, it is detected that a certain specific step of the index has been designated by the marker operation, in the changing, the display range of the measured waveform is changed to a display range specified by the index of the designated specific step, and in the displaying of the peak marker, the peak marker is displayed at the maximum position of a waveform within the zone of the predetermined width of the zone marker on a measured waveform displayed in the changed display range.

18. The measuring method according to claim 17, wherein in the changing, the display range of the measured waveform is changed to the specified display range with the center position of the predetermined width of the zone marker as a center.

19. A measuring method comprising:

measuring an object to be measured or a signal to be measured;

displaying a measured waveform, which is based on measured data acquired in the measuring, on two-dimensional coordinates which have a first axis and a second axis perpendicular to the first axis;

displaying a waveform marker, which is movable by a marker operation corresponding to a direction parallel to the first axis, so as to overlap the measured waveform;

detecting the marker operation corresponding to a direction parallel to the second axis;

changing either setting of the waveform marker or a display range of the measured waveform according to the detection result; and determining the movement variation on the basis of a relative distance from an initial position when the marker operation has started in a waveform display region, in which the measured waveform is displayed, to an operation position when the marker operation has been actually performed in the direction parallel to the second axis and specified information which specifies the movement variation in a distance or a speed of the waveform marker, which corresponds to an operation amount in the marker operation in the direction parallel to the first axis, beforehand so as to match the relative distance, wherein in the detecting, the relative distance is detected, in the determining, the movement variation is determined on the basis of the detected relative distance, and in the changing, the set movement variation of the waveform marker is changed to the determined movement variation.

20. A measuring method comprising:

measuring an object to be measured or a signal to be measured;

displaying a measured waveform, which is based on measured data acquired in the measuring, on two-dimensional coordinates which have a first axis and a second axis perpendicular to the first axis;

displaying a waveform marker, which is movable by a marker operation corresponding to a direction parallel to the first axis, so as to overlap the measured waveform;

detecting the marker operation corresponding to a direction parallel to the second axis;

changing either setting of the waveform marker or a display range of the measured waveform according to the detection result;

wherein the waveform marker is a zone marker having a predetermined width in the direction parallel to the first axis, and displaying a peak marker at the maximum position of a waveform within a zone of the predetermined width of the zone marker and determining a predetermined width of the zone marker on the basis of a relative distance from an initial position when the marker operation has started in a waveform display region, in which the measured waveform is displayed, to an operation position when the marker operation has been actually performed in the direction parallel to the second axis and specified information which specifies the predetermined width of the zone marker, which corresponds to an operation amount in the marker operation in the direction parallel to the first axis, beforehand so as to match the relative distance are further included, wherein in the detecting, the relative distance is detected, in the determining, the predetermined width of the zone marker is determined on the basis of the detected relative distance, in the changing, the set predetermined width of the zone marker is changed to the determined predetermined width, and in the displaying of the peak marker, the peak marker is displayed at the maximum position of a waveform within the zone of the changed predetermined width.

21. A measuring method comprising:

measuring an object to be measured or a signal to be measured;

displaying a measured waveform, which is based on measured data acquired in the measuring, on two-dimensional coordinates which have a first axis and a second axis perpendicular to the first axis;

displaying a waveform marker, which is movable by a marker operation corresponding to a direction parallel to the first axis, so as to overlap the measured waveform;

detecting the marker operation corresponding to a direction parallel to the second axis;

changing either setting of the waveform marker or a display range of the measured waveform according to the detection result, wherein the waveform marker is a zone marker having a predetermined width in the direction parallel to the first axis, and displaying a peak marker at the maximum position of a waveform within a zone of the predetermined width of the zone marker and determining a predetermined width of the zone marker on the basis of a relative distance from an initial position when the marker operation has started in a waveform display region, in which the measured waveform is displayed, to an operation position when the marker operation has been actually performed in the direction parallel to the second axis and specified information which specifies a display range of the measured waveform, which corresponds to an operation amount in the marker operation in the direction parallel to the first axis, beforehand so as to match the relative distance are further included, wherein in the detecting, the relative distance is detected, in the determining, the display range of the measured waveform is determined on the basis of the detected relative distance, in the changing, the display range of the measured waveform is changed to the determined display range, and in the displaying of the peak marker, the peak marker is displayed at the maximum position of a waveform within the zone of the predetermined width of the zone marker on a measured waveform displayed in the changed display range.

22. The measuring method according to claim 21, wherein in the changing, the display range of the measured waveform is changed to the determined display range with the center position of the predetermined width of the zone marker as a center.

\* \* \* \* \*